US012720761B2

(12) United States Patent
Tsukamoto et al.

(10) Patent No.: US 12,720,761 B2
(45) Date of Patent: Aug. 25, 2026

(54) SEMICONDUCTOR STORAGE DEVICE AND METHOD OF MANUFACTURING SEMICONDUCTOR STORAGE DEVICE

(71) Applicant: SONY SEMICONDUCTOR SOLUTIONS CORPORATION, Kanagawa (JP)

(72) Inventors: Masanori Tsukamoto, Kanagawa (JP); Jun Okuno, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 653 days.

(21) Appl. No.: 18/000,781

(22) PCT Filed: Jun. 3, 2021

(86) PCT No.: PCT/JP2021/021238
§ 371 (c)(1),
(2) Date: Dec. 5, 2022

(87) PCT Pub. No.: WO2021/251272
PCT Pub. Date: Dec. 16, 2021

(65) Prior Publication Data

US 2023/0225134 A1 Jul. 13, 2023

(30) Foreign Application Priority Data

Jun. 11, 2020 (JP) ................................ 2020-101915
Feb. 22, 2021 (JP) ................................ 2021-026747

(51) Int. Cl.
*H10B 53/30* (2023.01)

(52) U.S. Cl.
CPC .................................. *H10B 53/30* (2023.02)

(58) Field of Classification Search
CPC ........ H10B 51/00–50; H10B 53/00–50; H10B 12/033; H10B 53/30; H10B 53/10;
(Continued)

(56) References Cited

FOREIGN PATENT DOCUMENTS

JP 63-278363 A 11/1988
JP 2001-007304 A 1/2001
(Continued)

OTHER PUBLICATIONS

International Search Report and Written Opinion of PCT Application No. PCT/JP2021/021238, issued on Aug. 3, 2021, 12 pages of ISRWO.

*Primary Examiner* — Thanhha S Pham
(74) *Attorney, Agent, or Firm* — CHIP LAW GROUP

(57) ABSTRACT

There is provided a semiconductor storage device that is allowed to obtain a sufficient margin for operation. The semiconductor storage device includes: a field-effect transistor; an interlayer insulating film; a contact; a first wiring layer; a first insulating layer; an opening section; and a ferroelectric capacitor. The field-effect transistor is provided in a semiconductor substrate. The interlayer insulating film is provided on the semiconductor substrate. The contact penetrates the interlayer insulating film and is electrically coupled to a drain of the field-effect transistor. The first wiring layer is provided on the contact. The first insulating layer is provided on the interlayer insulating film and has the first wiring layer buried therein. The opening section is provided in the first insulating layer and the interlayer insulating film from a layer upper than the first wiring layer. The ferroelectric capacitor is provided in the opening section and electrically coupled to a source of the field-effect transistor.

7 Claims, 54 Drawing Sheets

(58) Field of Classification Search
CPC .... H10D 64/033; H10D 64/689; H10D 1/682; H10D 1/716
See application file for complete search history.

(56) References Cited

FOREIGN PATENT DOCUMENTS

| | | | | |
|---|---|---|---|---|
| JP | 2008-177225 | A | 7/2008 | |
| JP | 2009081229 | A | 4/2009 | |
| JP | 2012-089902 | A | 5/2012 | |
| JP | 2016-007250 | A | 1/2016 | |
| JP | 2016072502 | A | 5/2016 | |
| JP | 2019-160841 | A | 9/2019 | |
| WO | WO-2018074093 | A1 * | 4/2018 | ......... G11C 11/2275 |

* cited by examiner

[ FIG. 1 ]
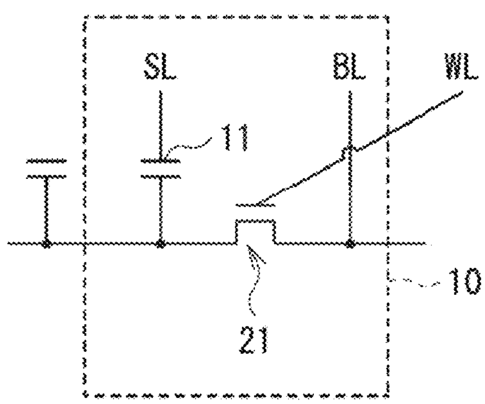

[ FIG. 2 ]
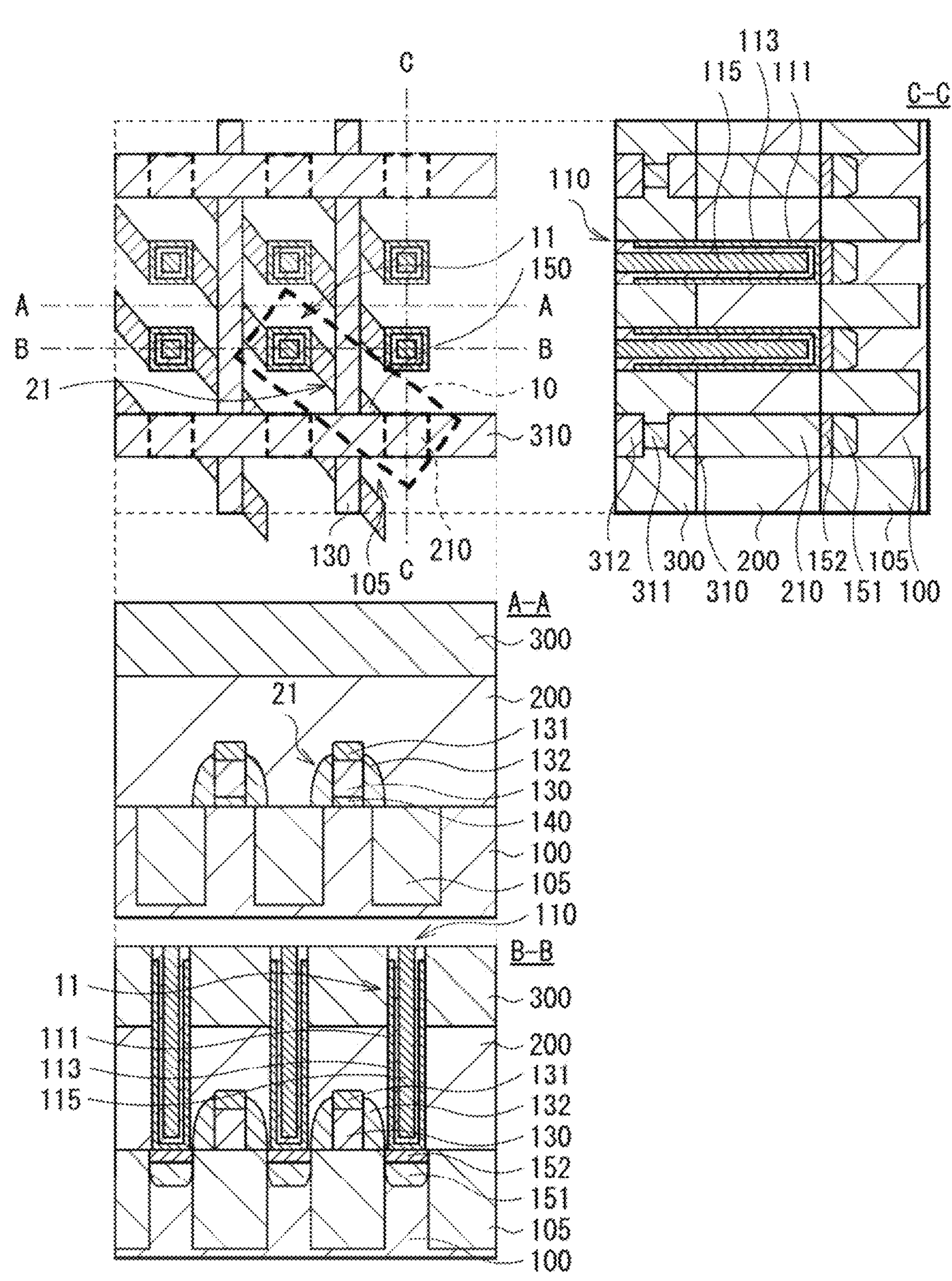

[ FIG. 3A ]
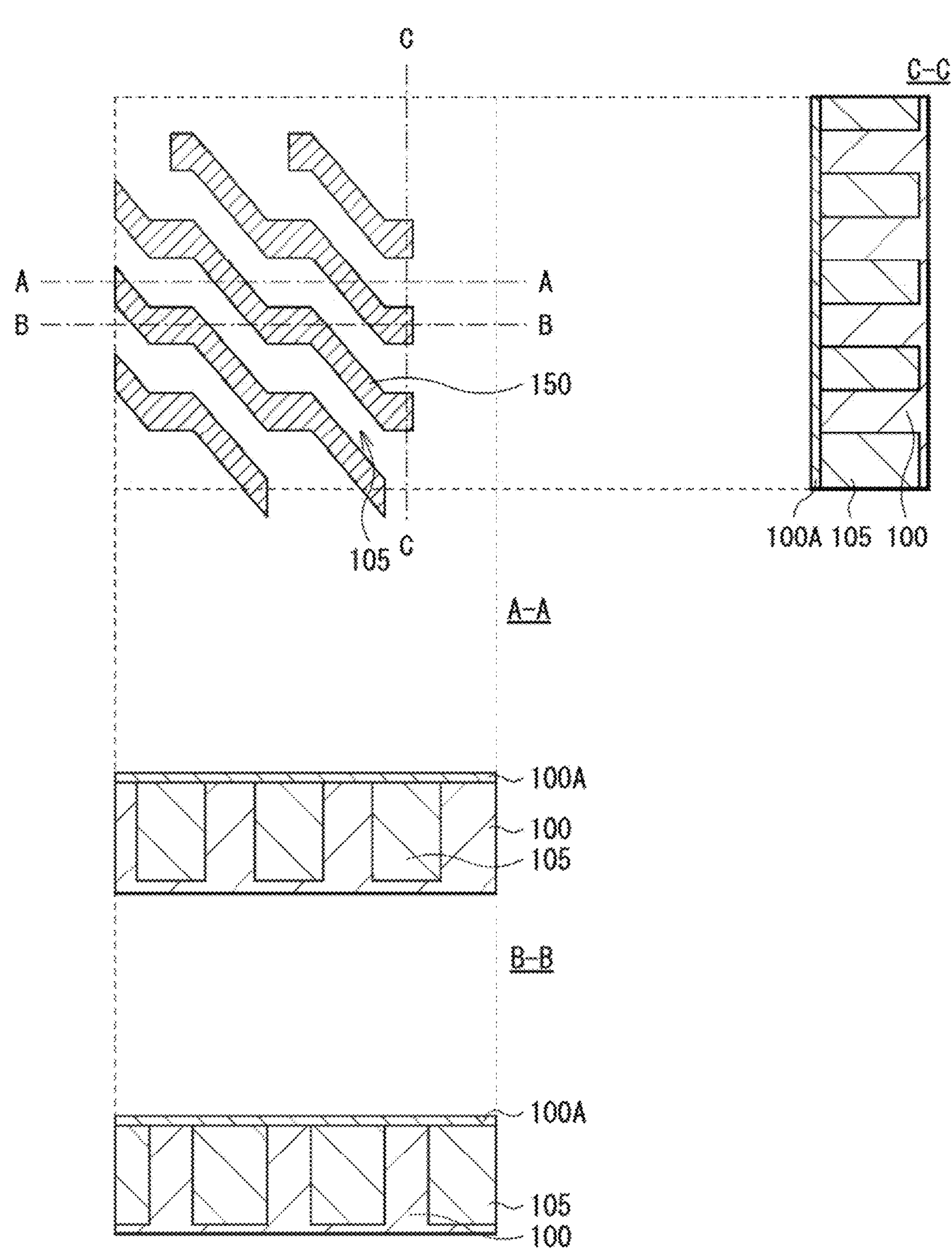

[ FIG. 3B ]
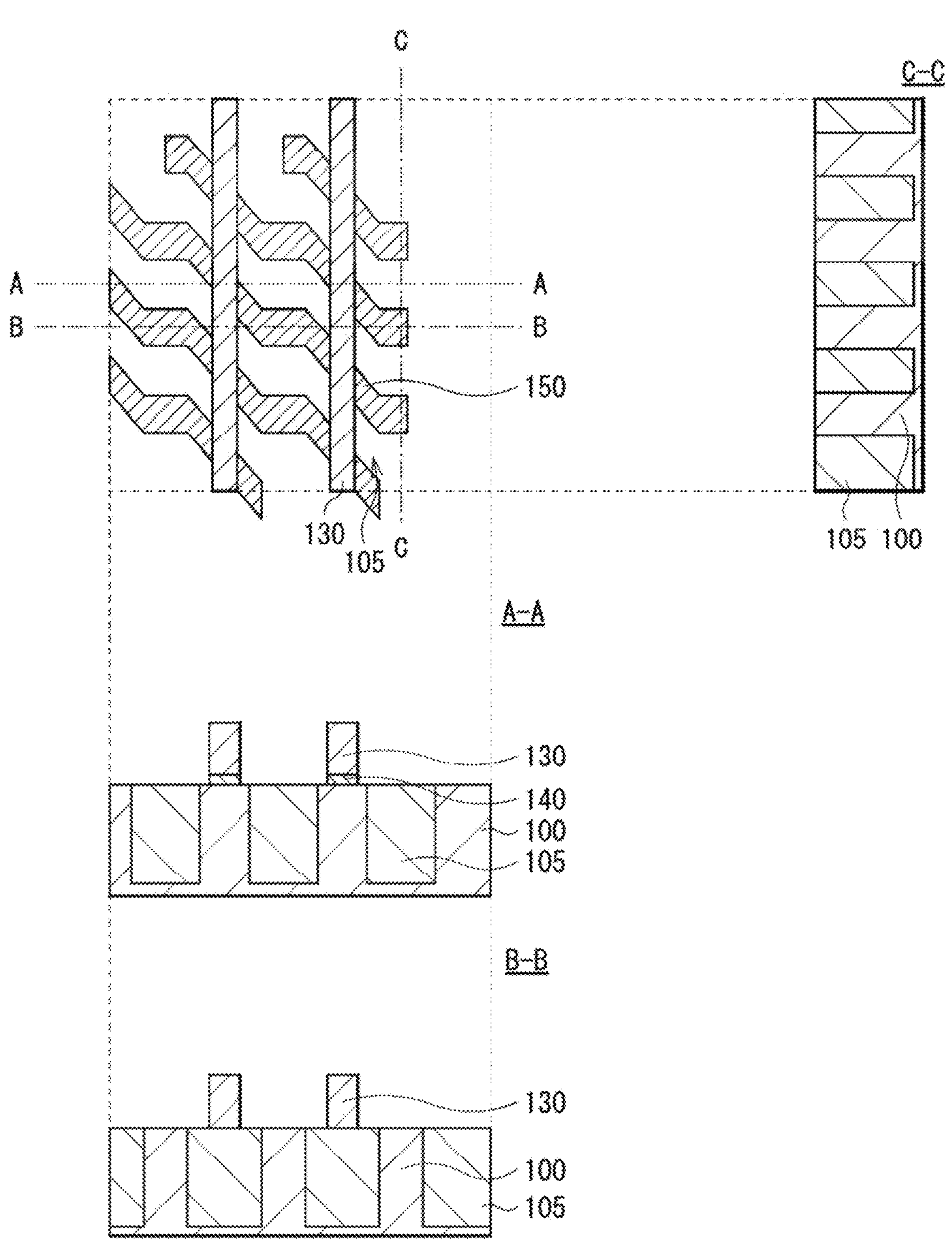

【FIG. 3C】
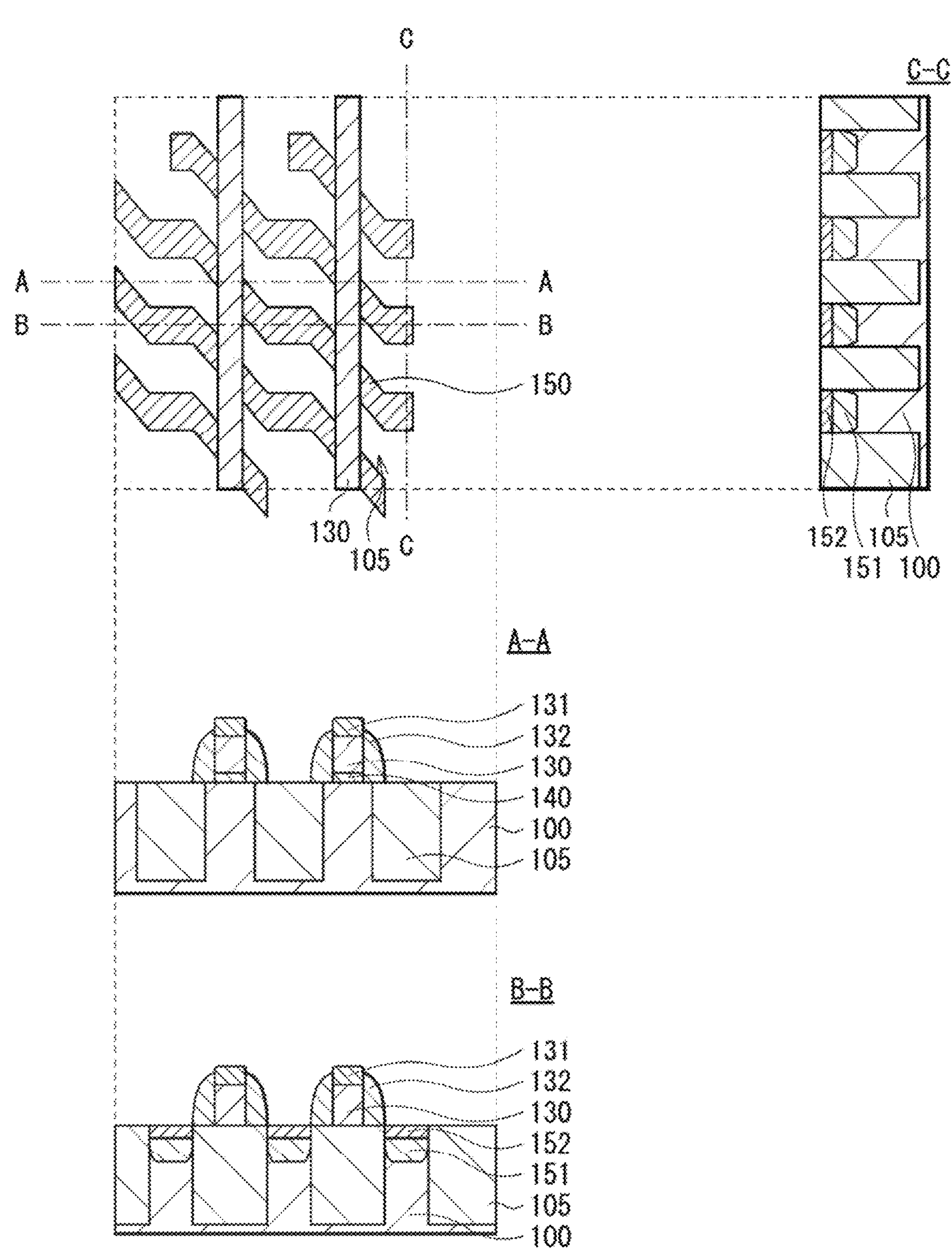

[ FIG. 3D ]
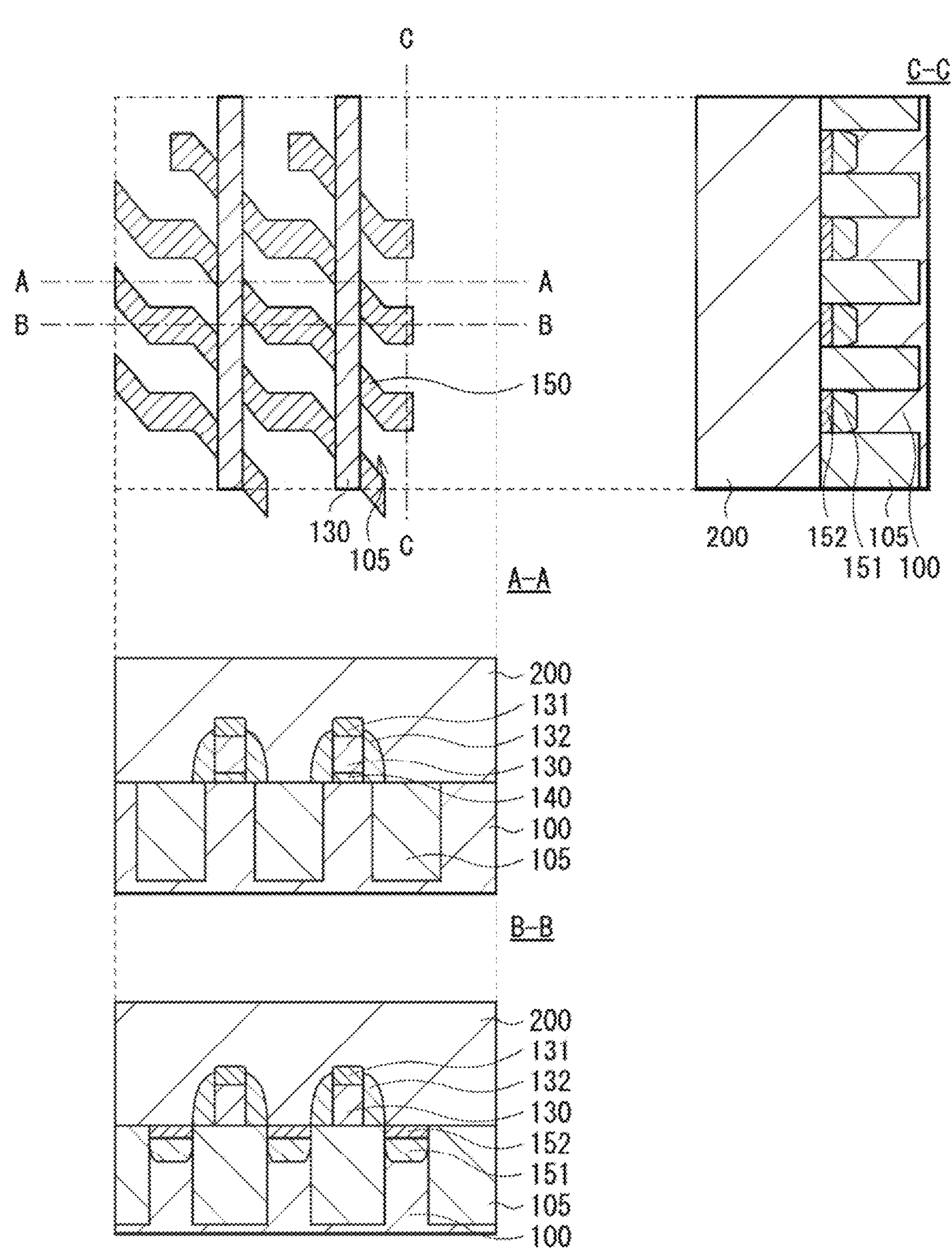

[ FIG. 3E ]
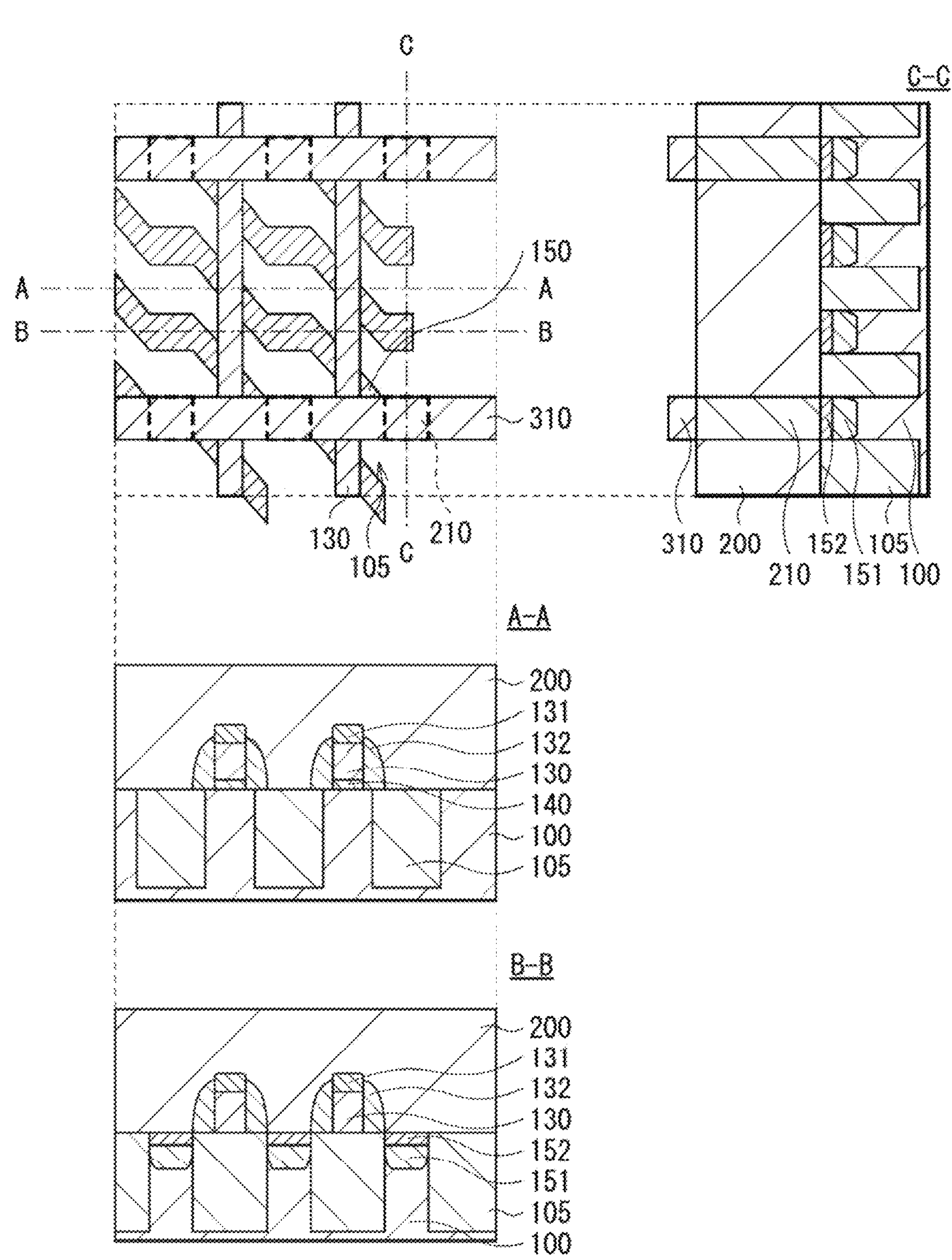

[ FIG. 3F ]
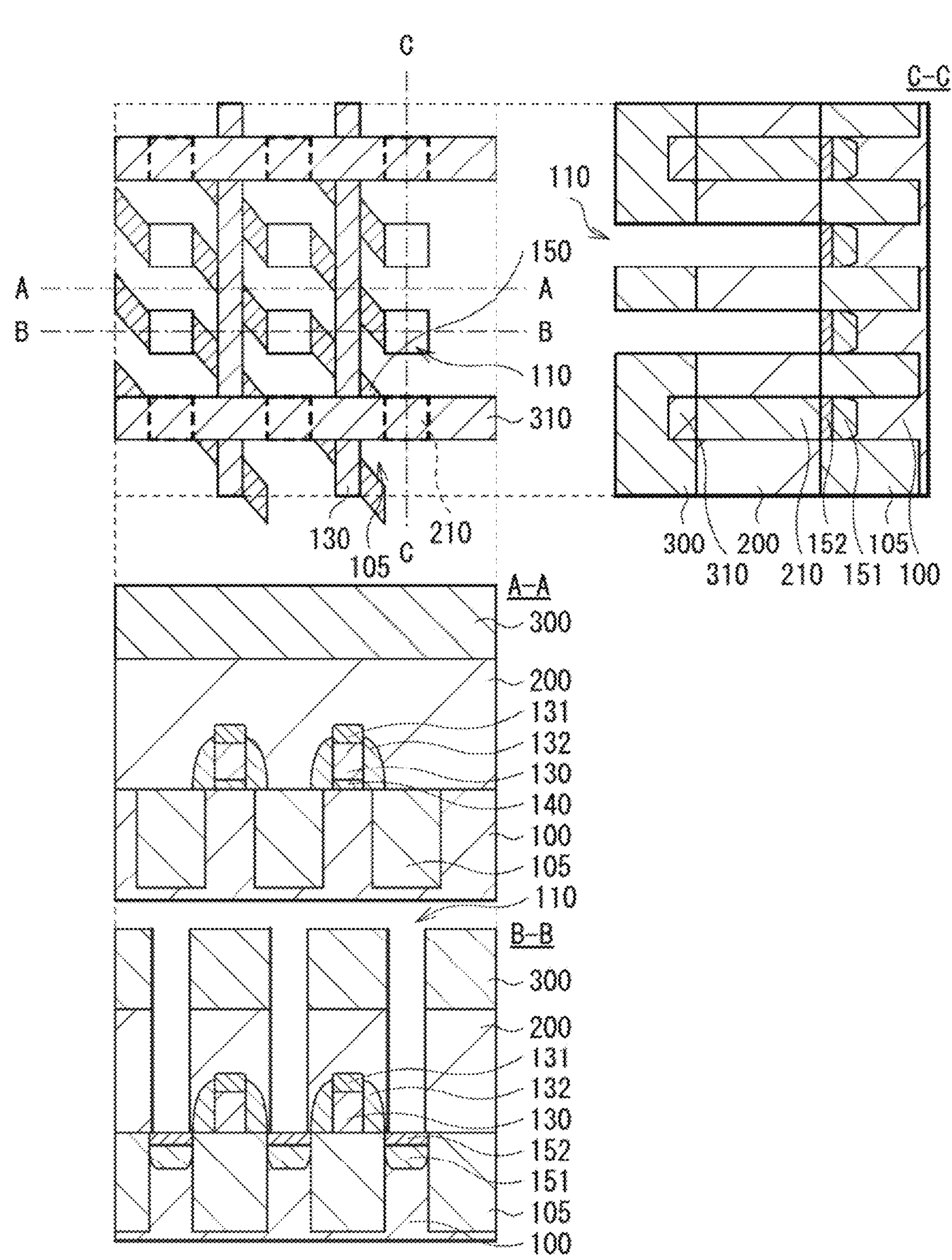

[ FIG. 3G ]
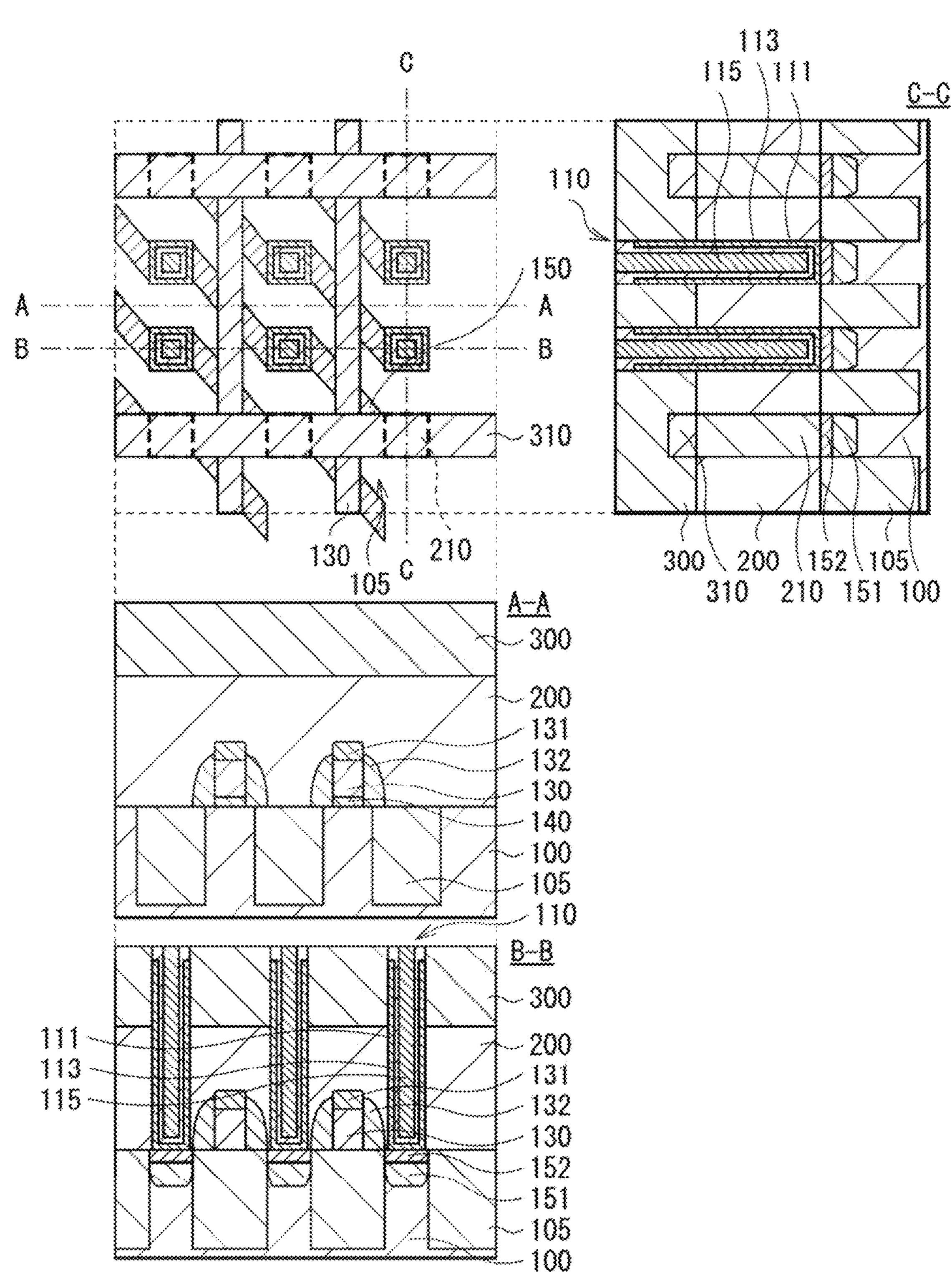

[ FIG. 3H ]
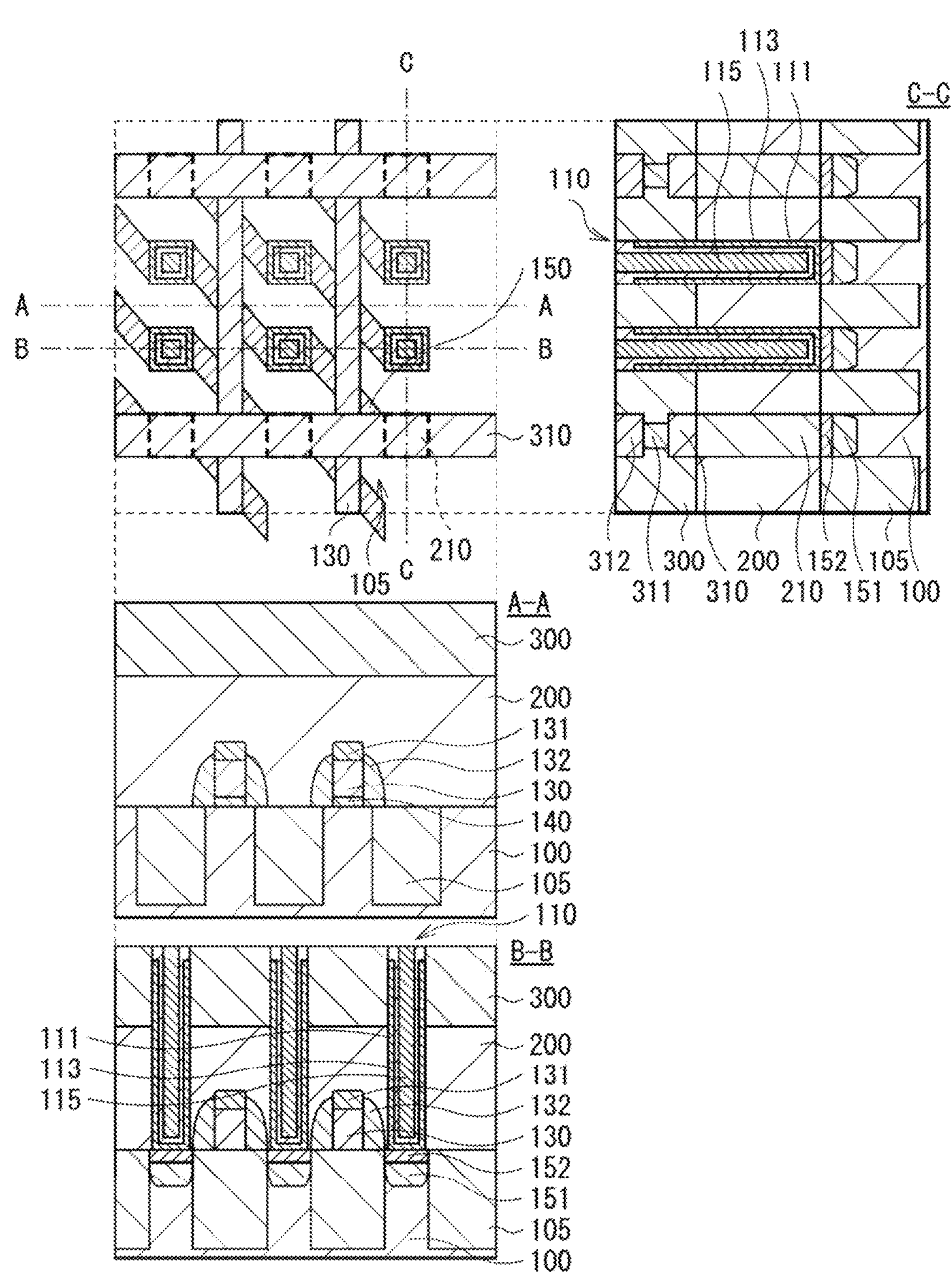

【 FIG. 4 】
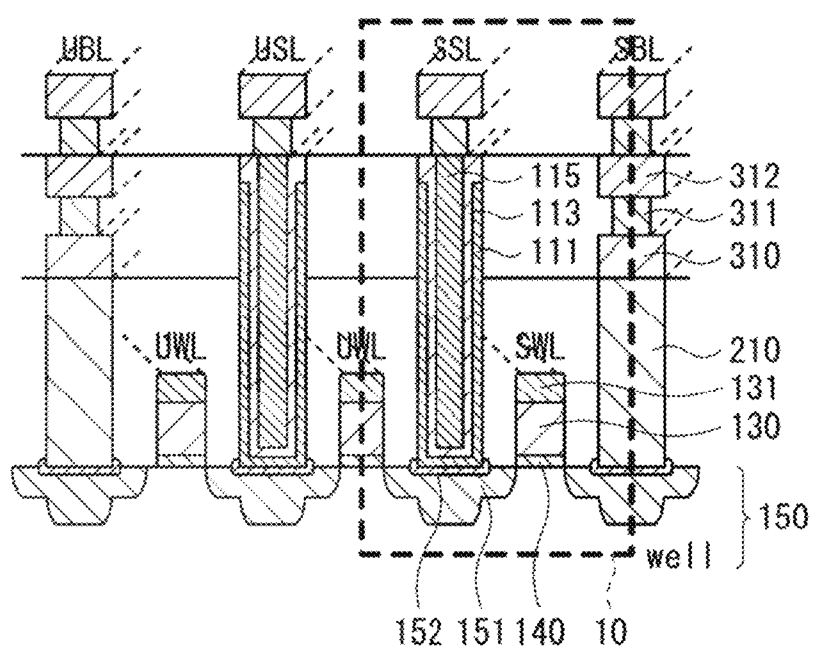

[ FIG. 5 ]
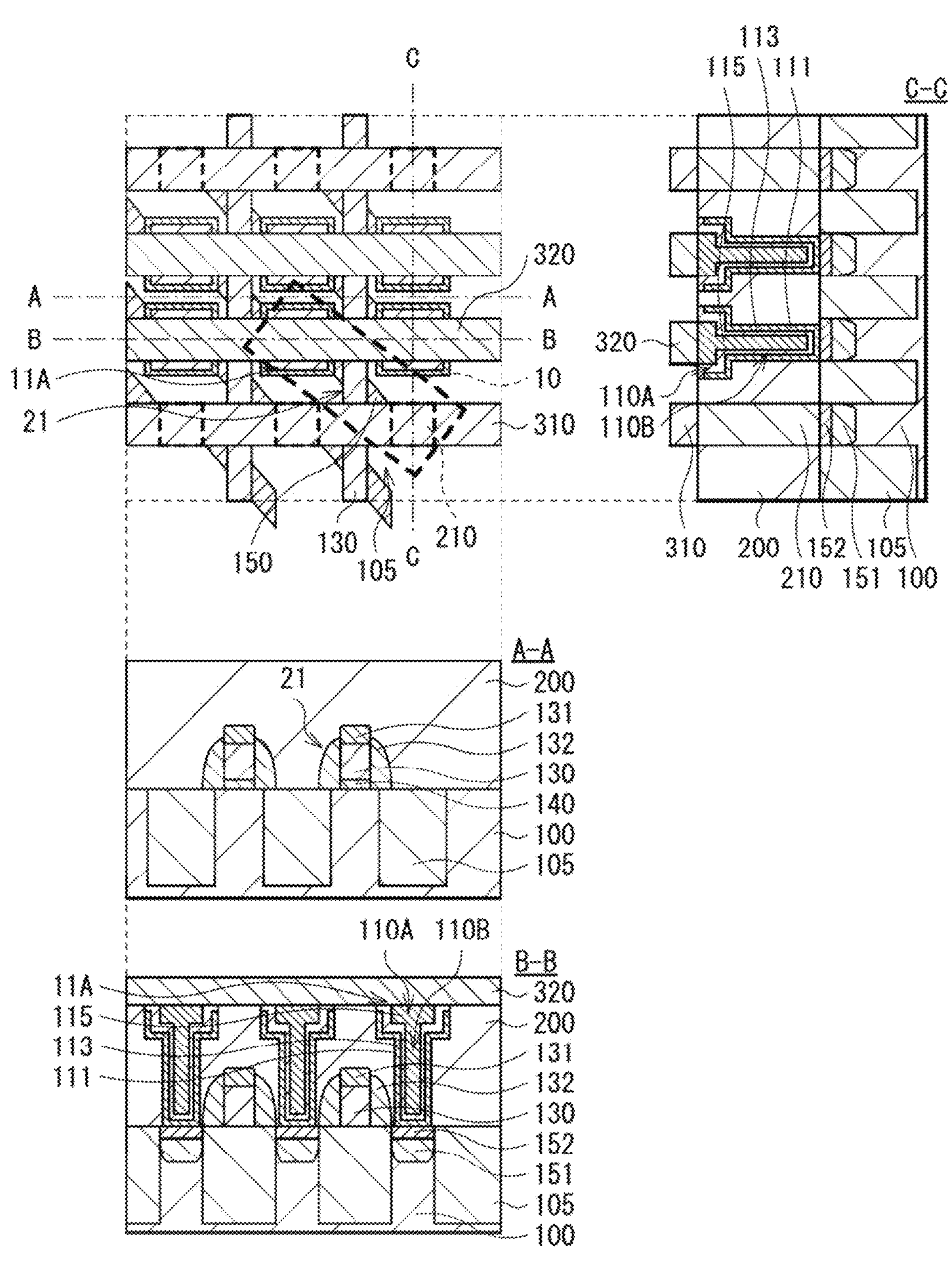

【FIG. 6A】
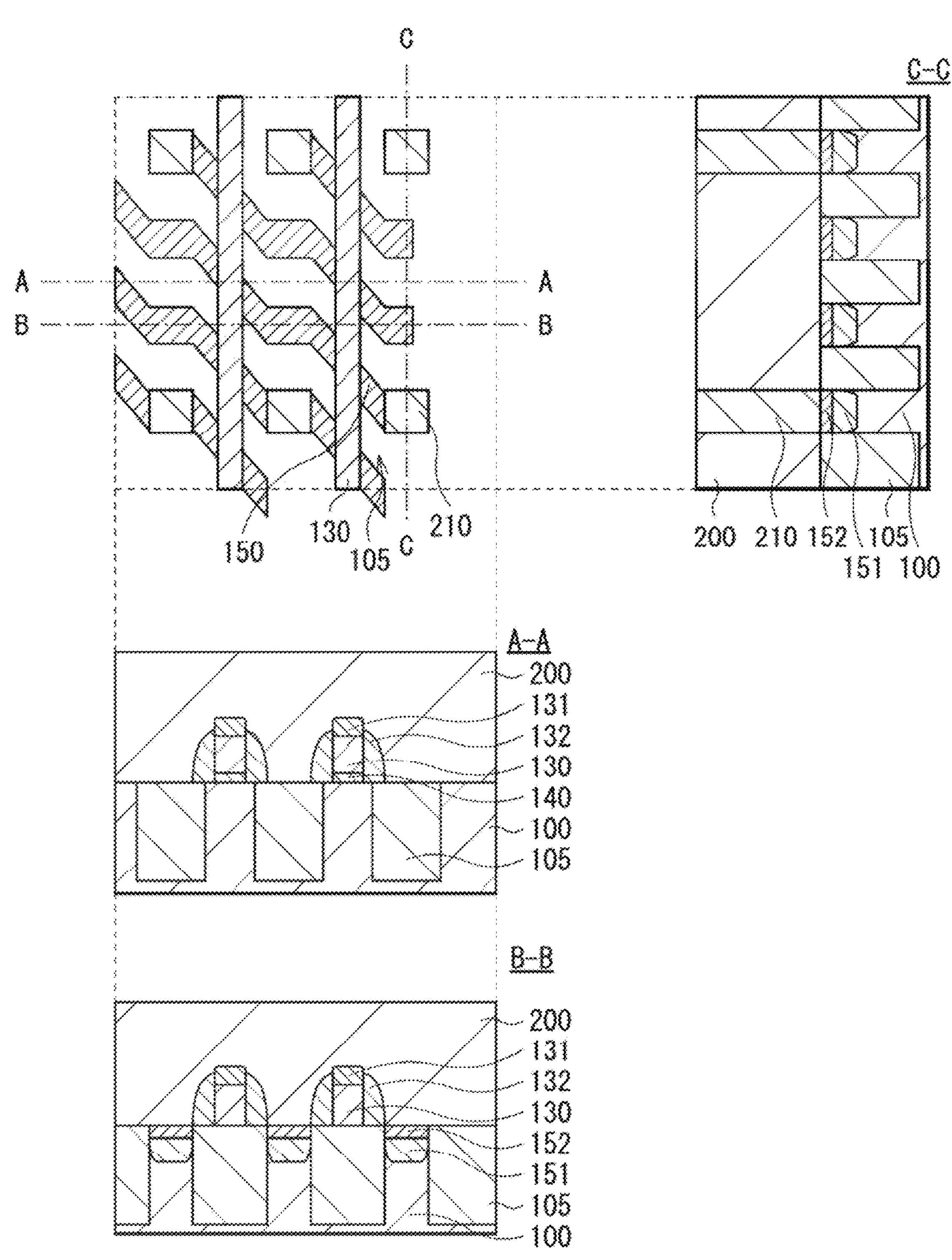

[ FIG. 6B ]
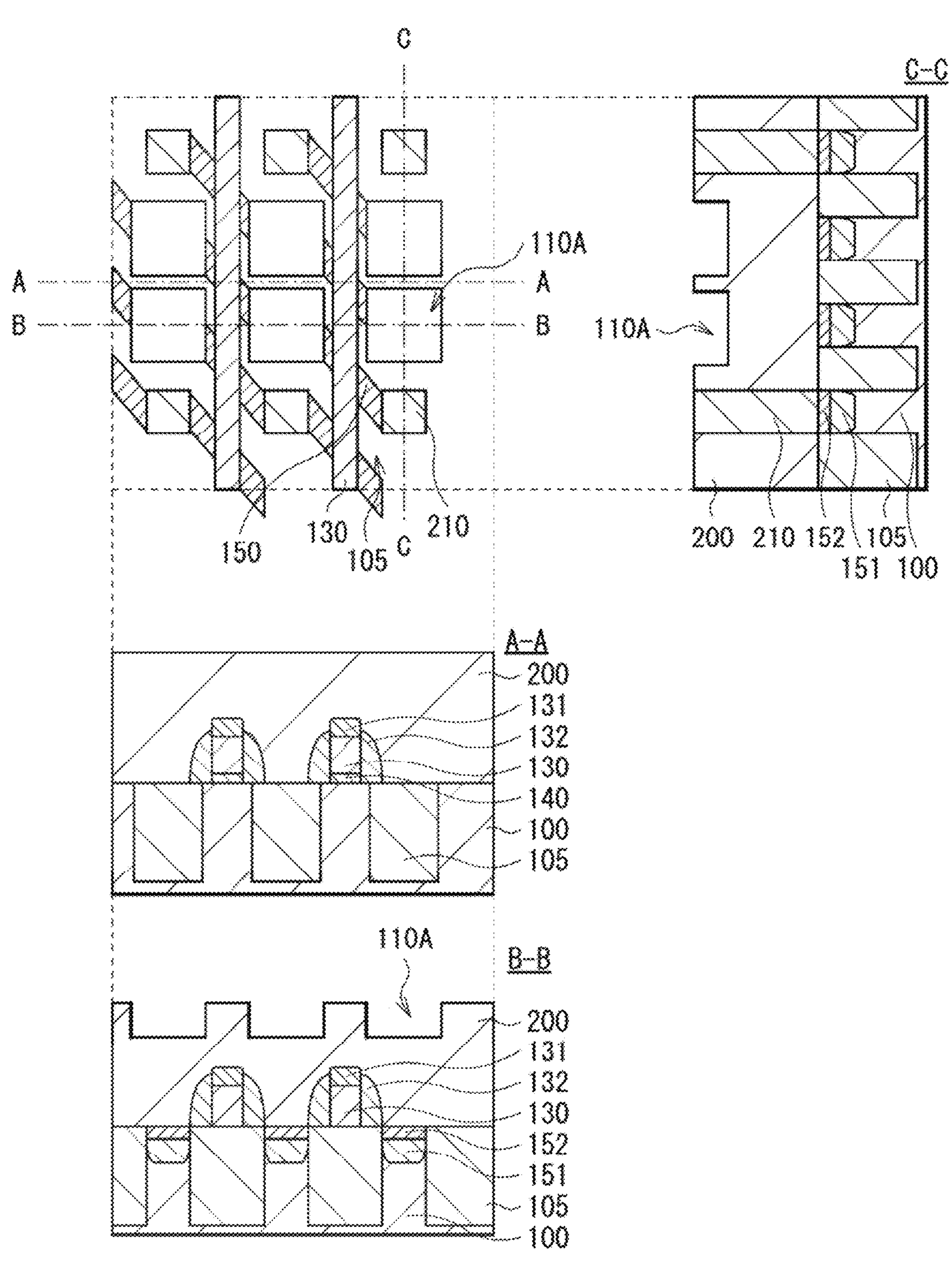

[ FIG. 6C ]
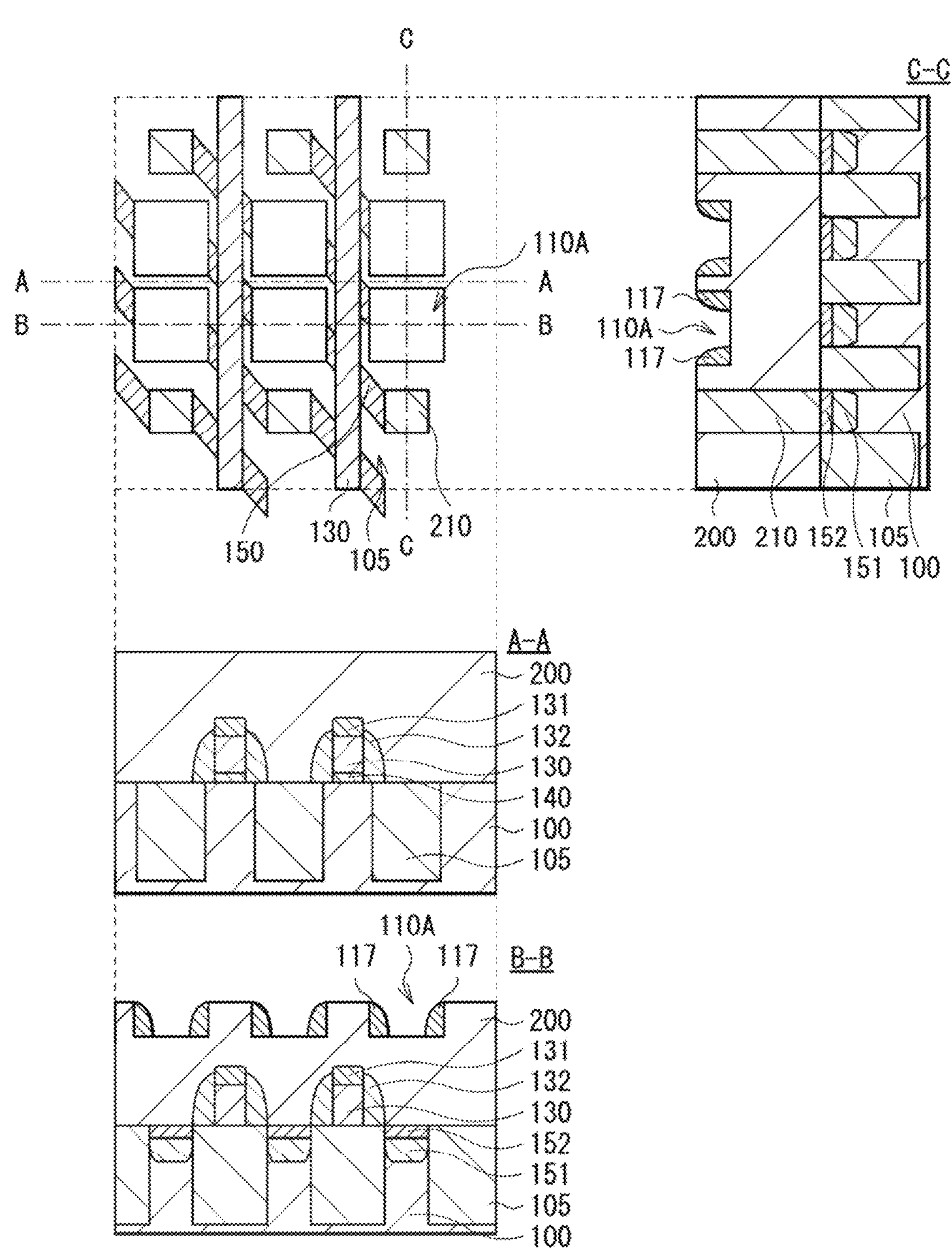

【 FIG. 6D 】
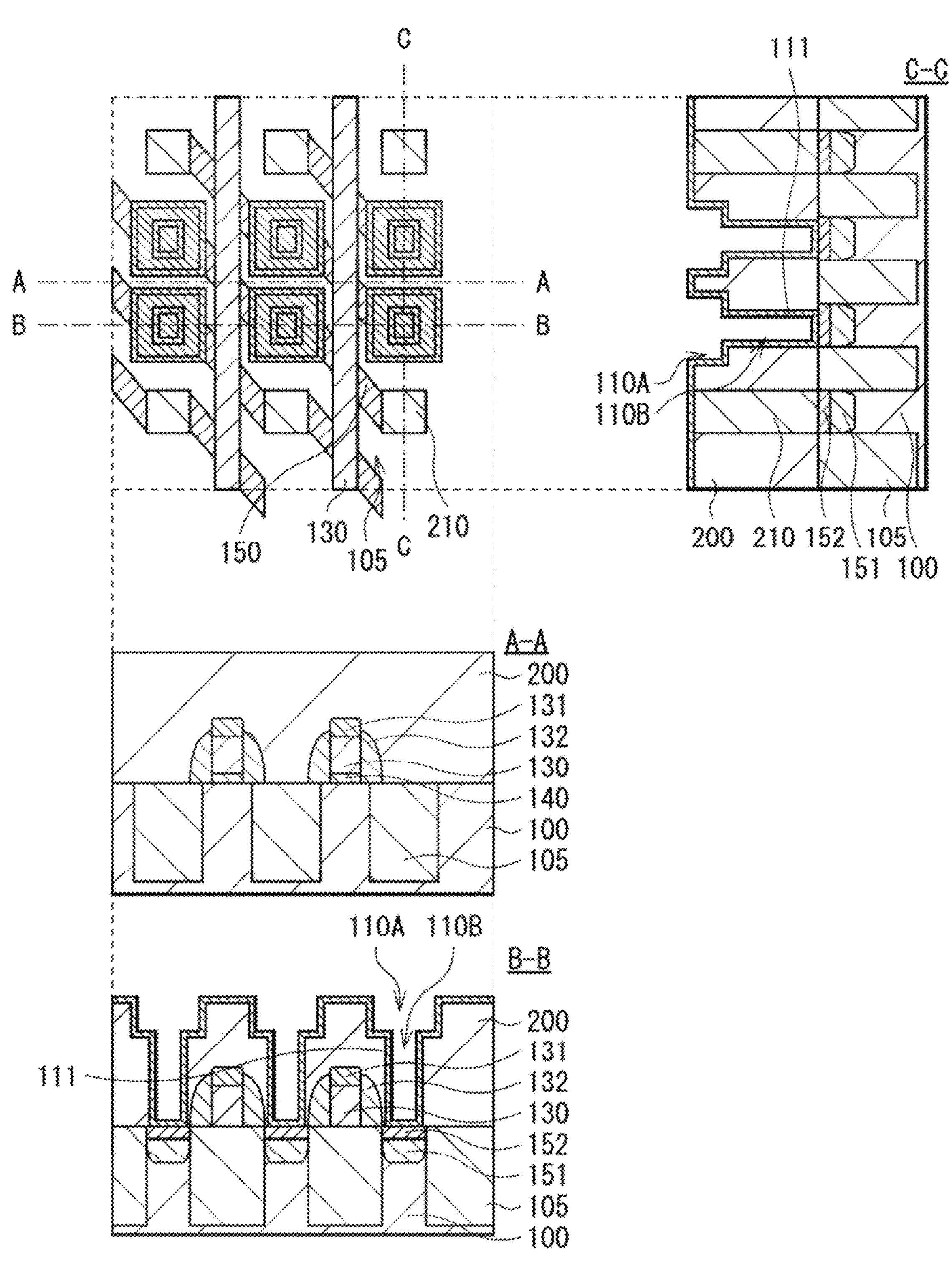

【FIG. 6E】
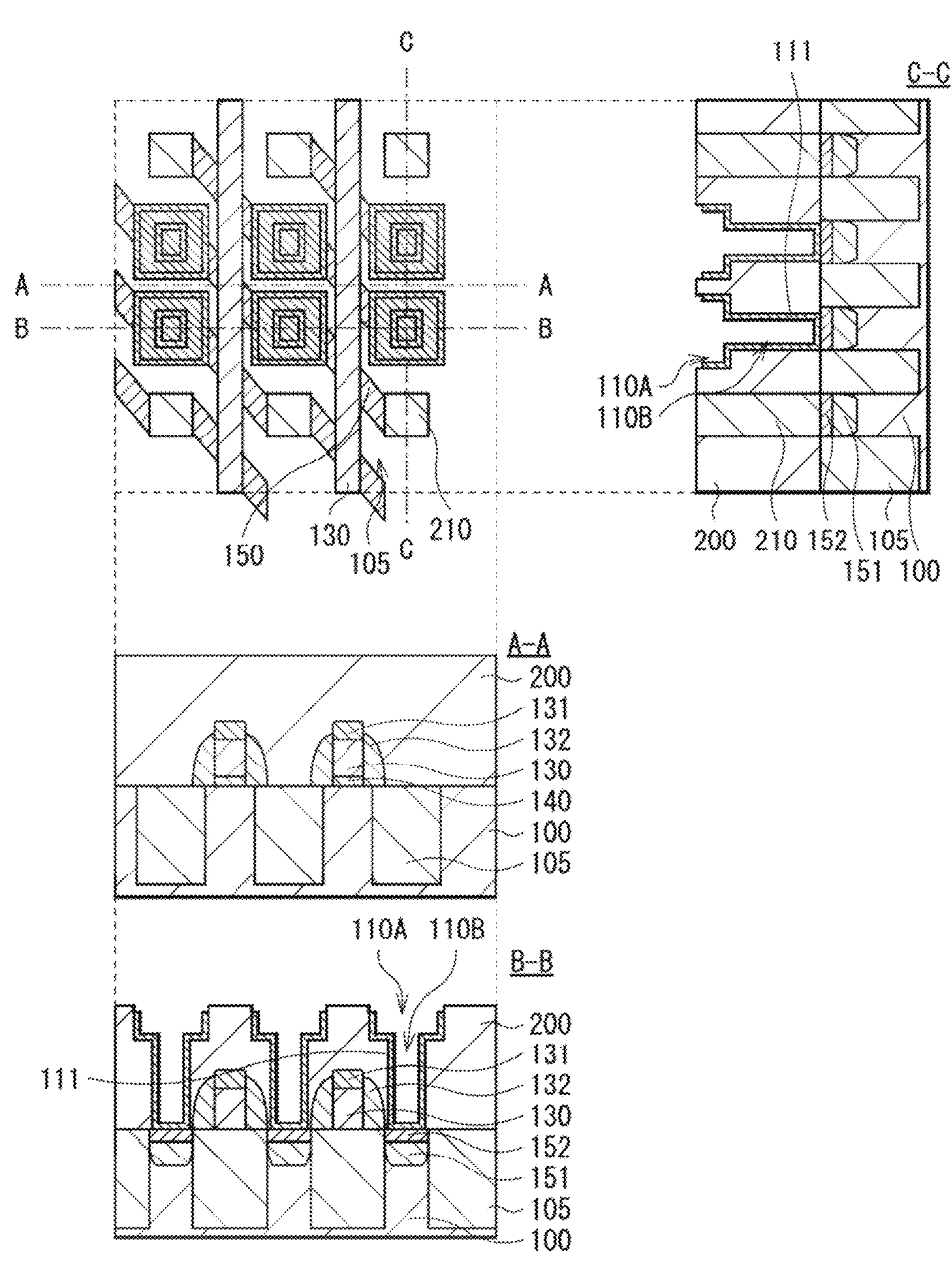

【FIG. 6F】
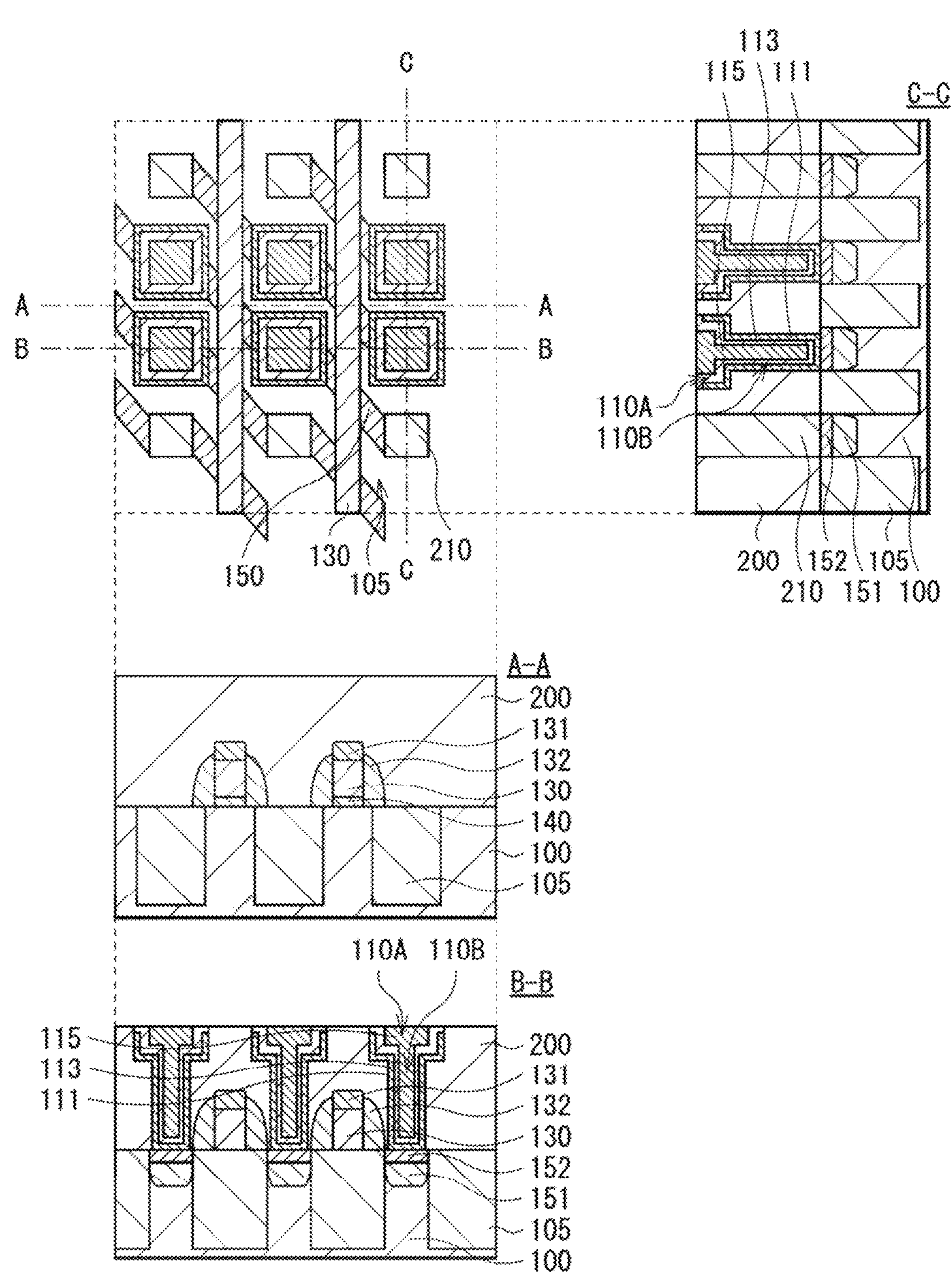

[ FIG. 6G ]
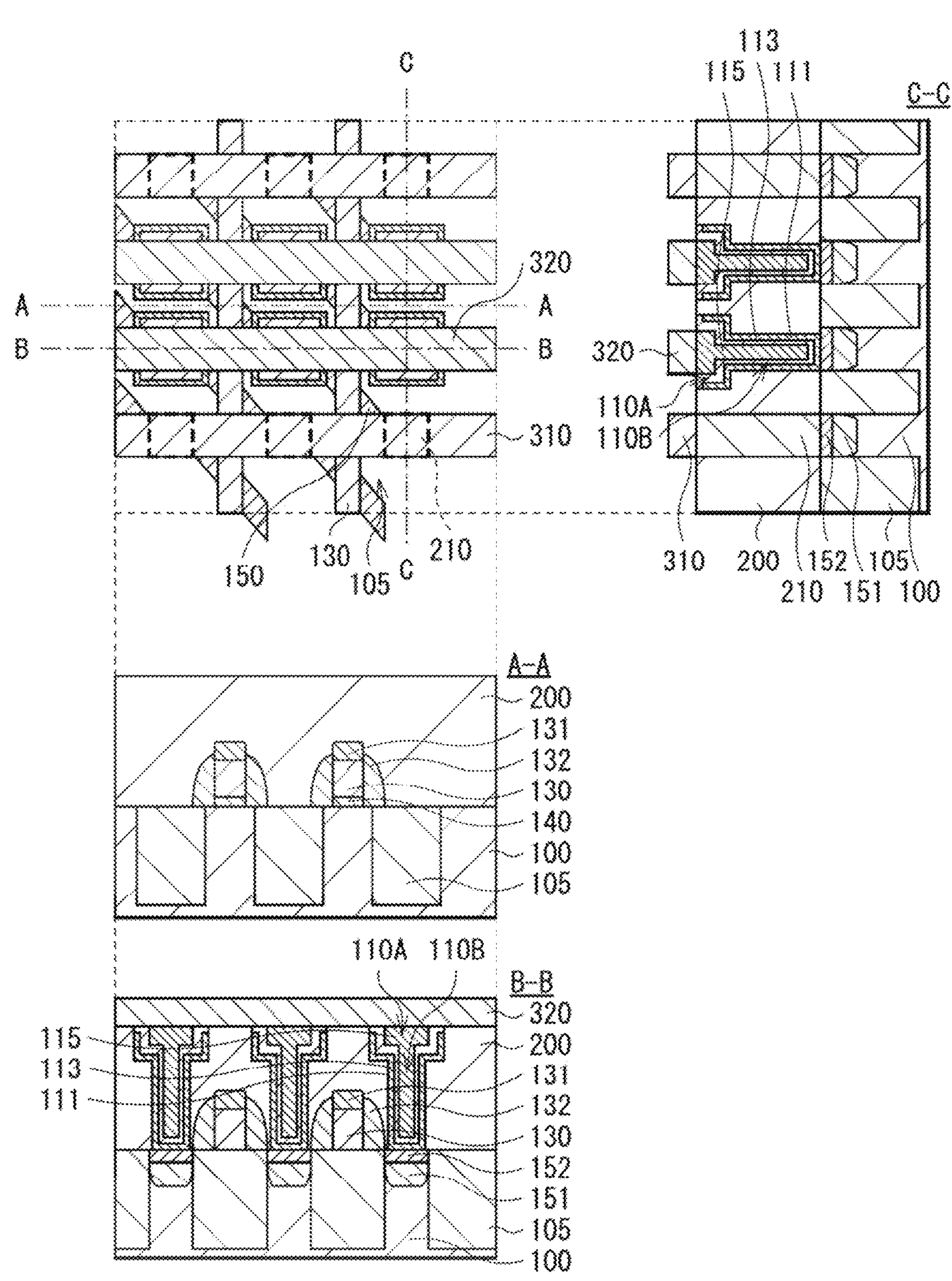

[ FIG. 7 ]
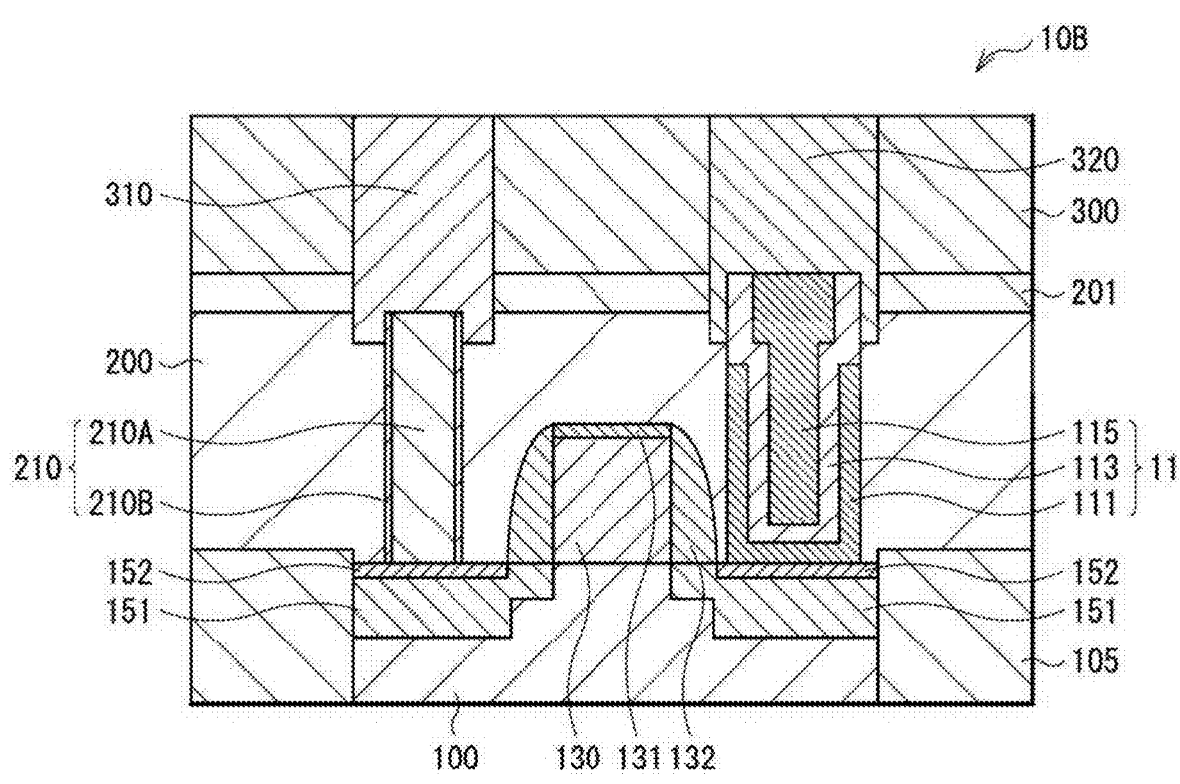

【FIG. 8】
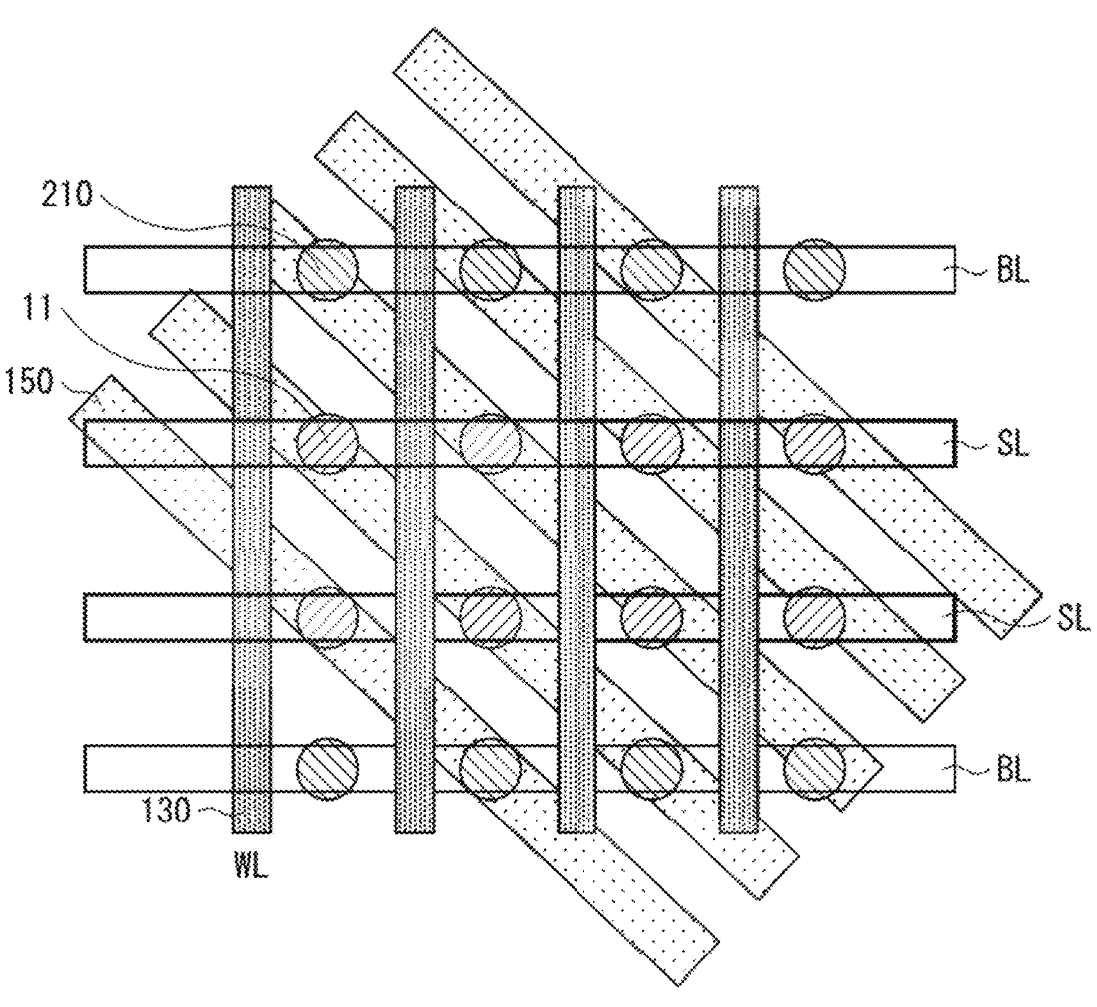

[ FIG. 9A ]
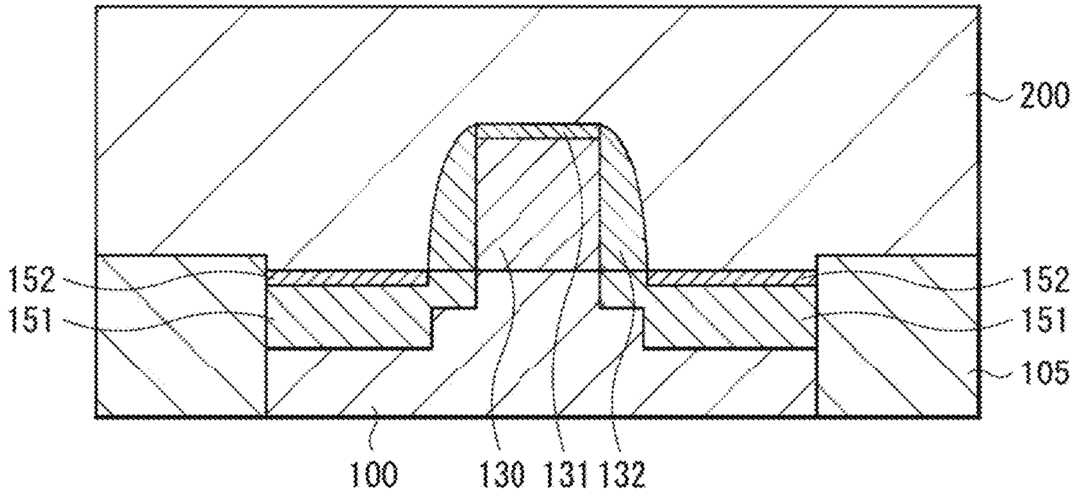
[ FIG. 9B ]
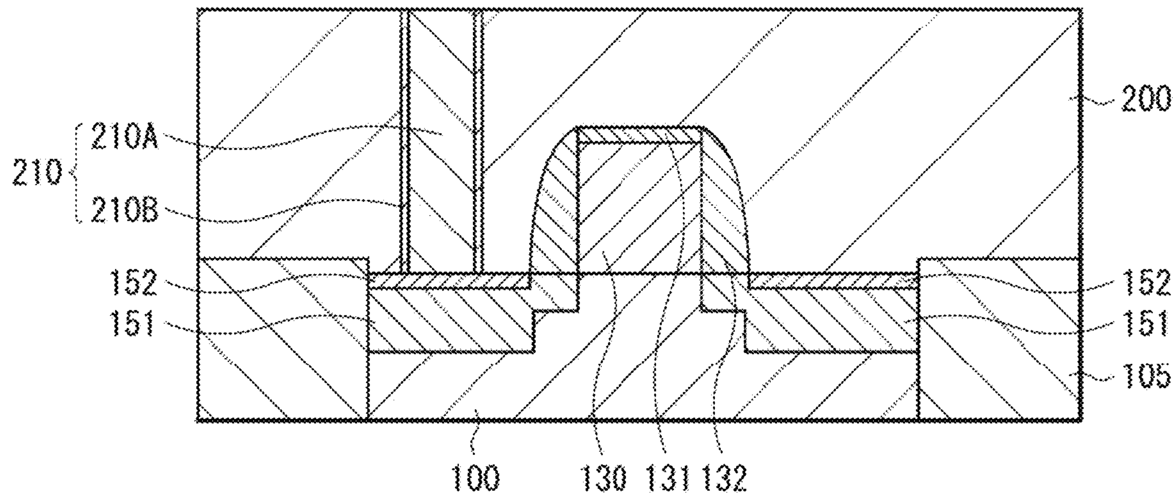

[ FIG. 9C ]
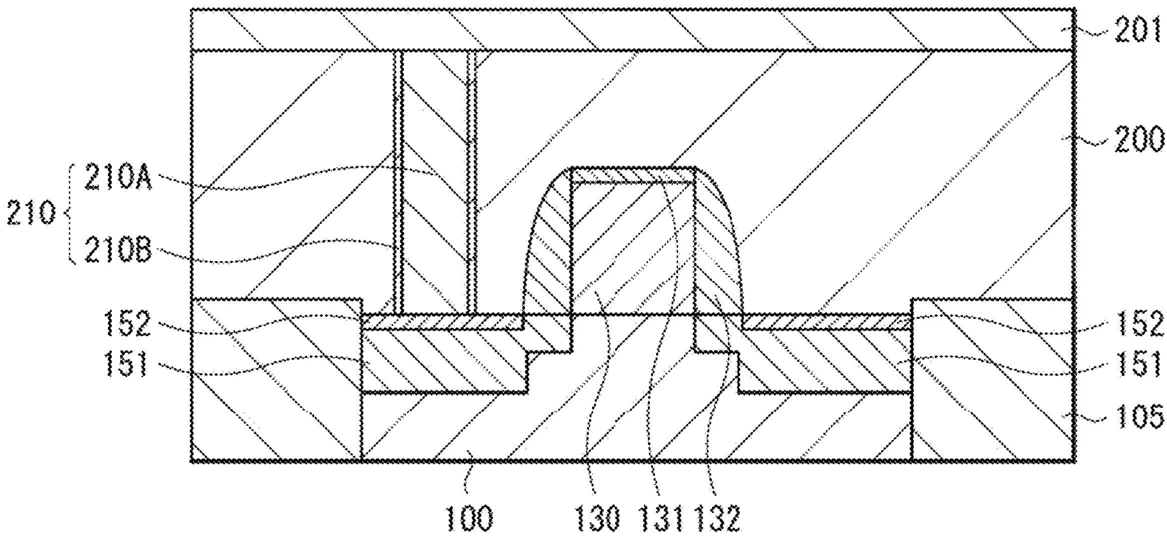
[ FIG. 9D ]
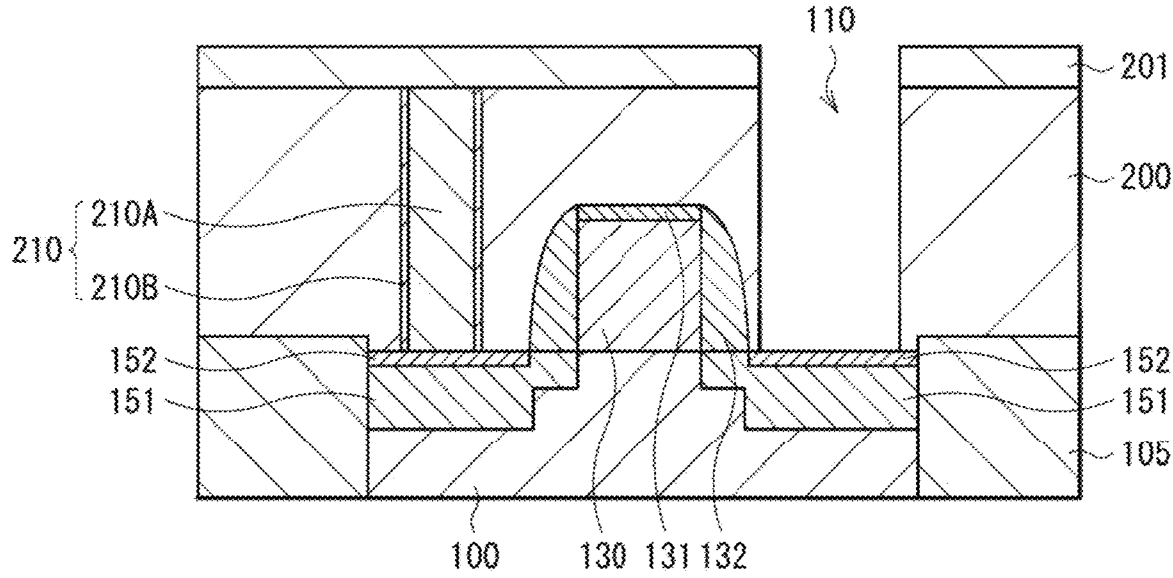

[ FIG. 9E ]
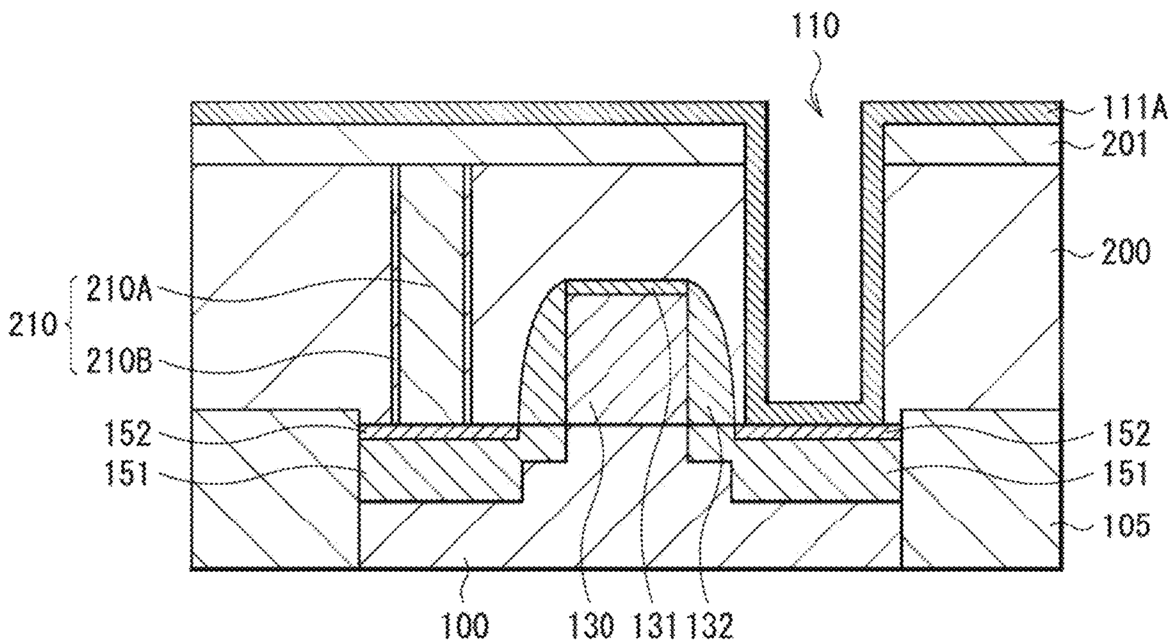
[ FIG. 9F ]
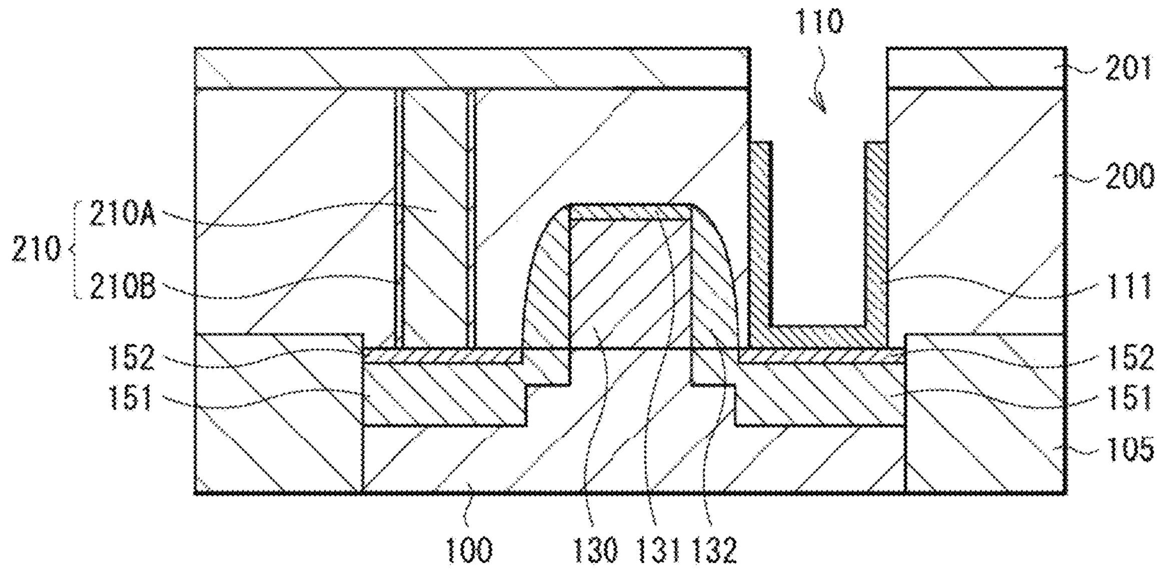

[ FIG. 9G ]
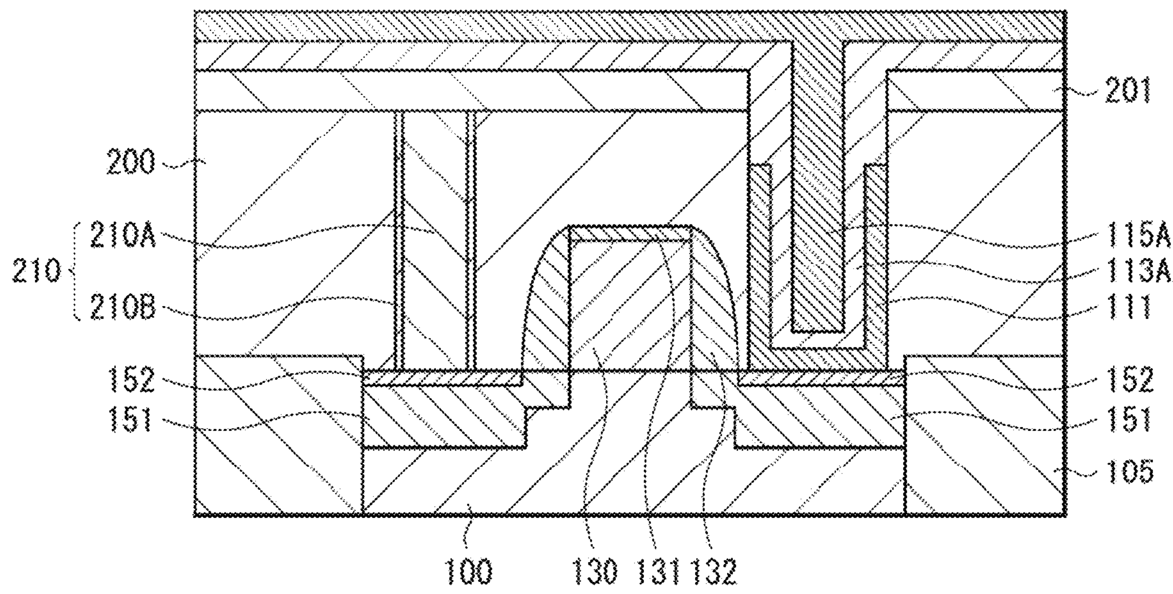
[ FIG. 9H ]
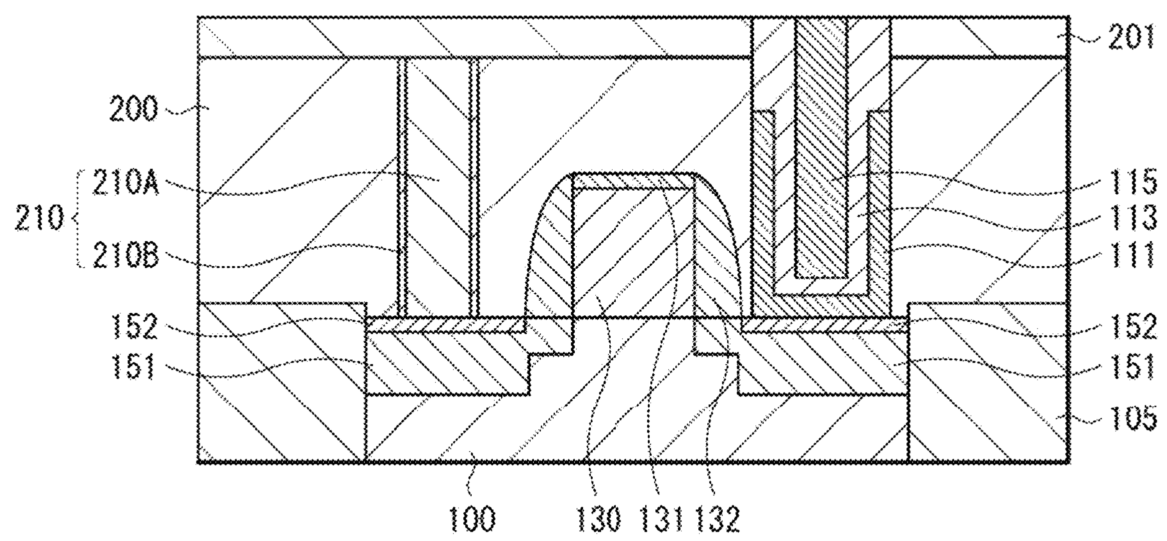

[ FIG. 91 ]
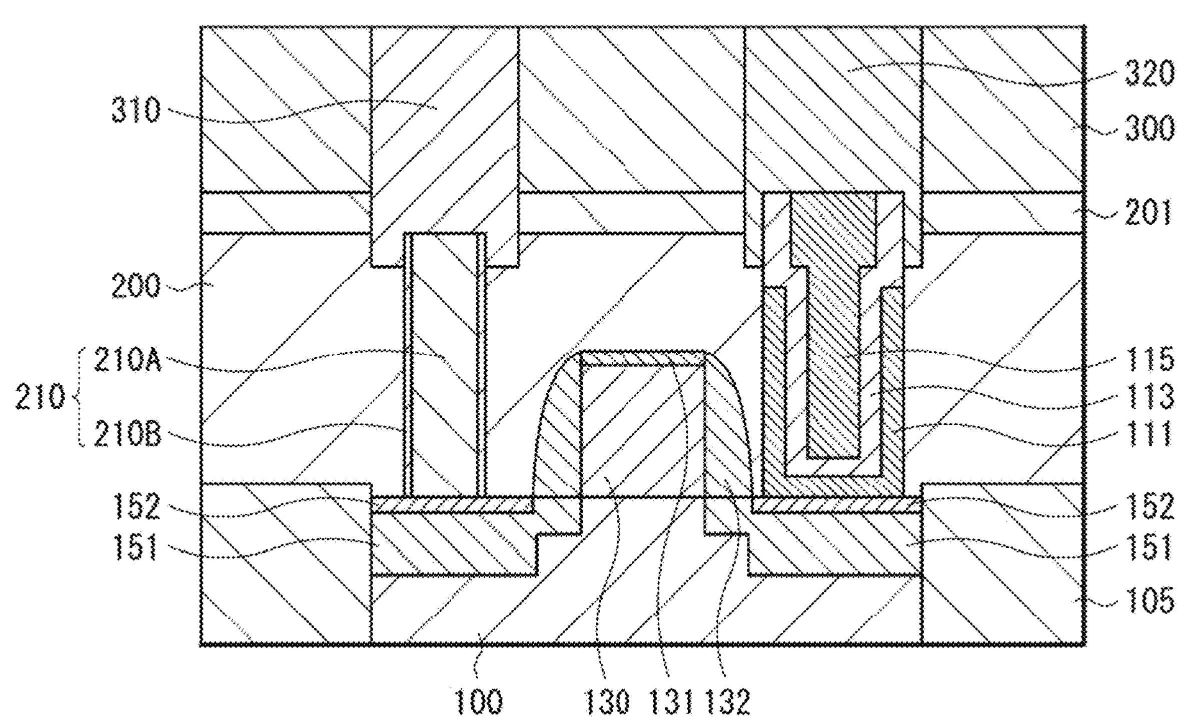

[ FIG. 10 ]
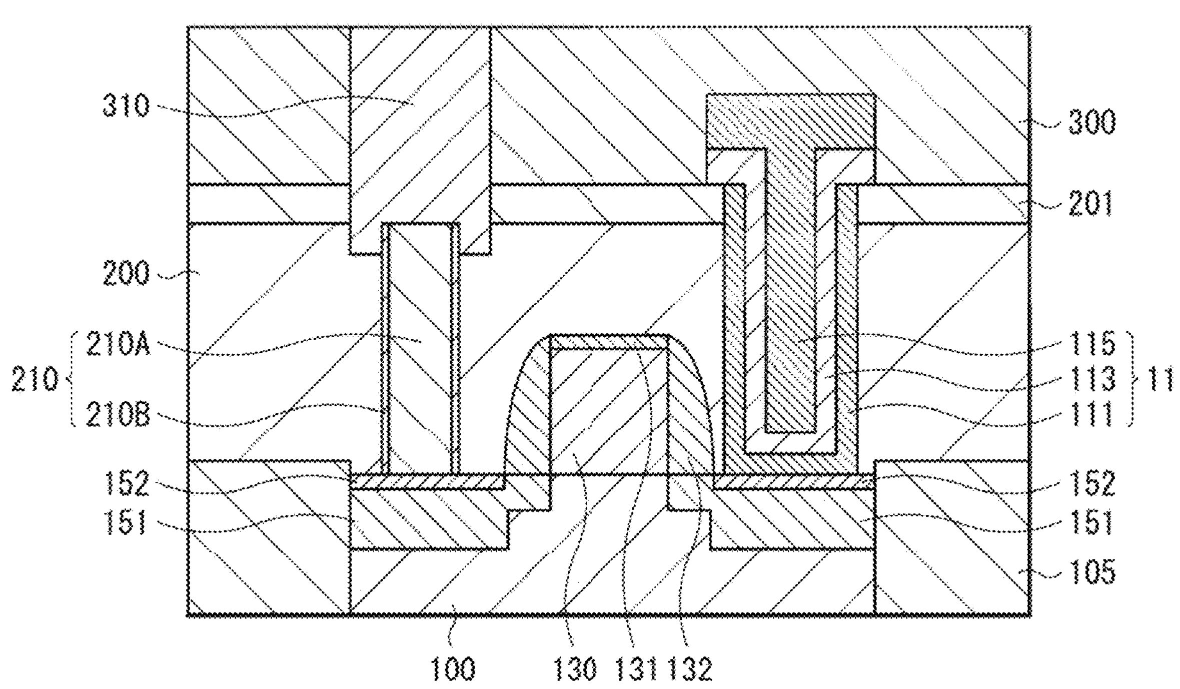

[ FIG. 11A ]
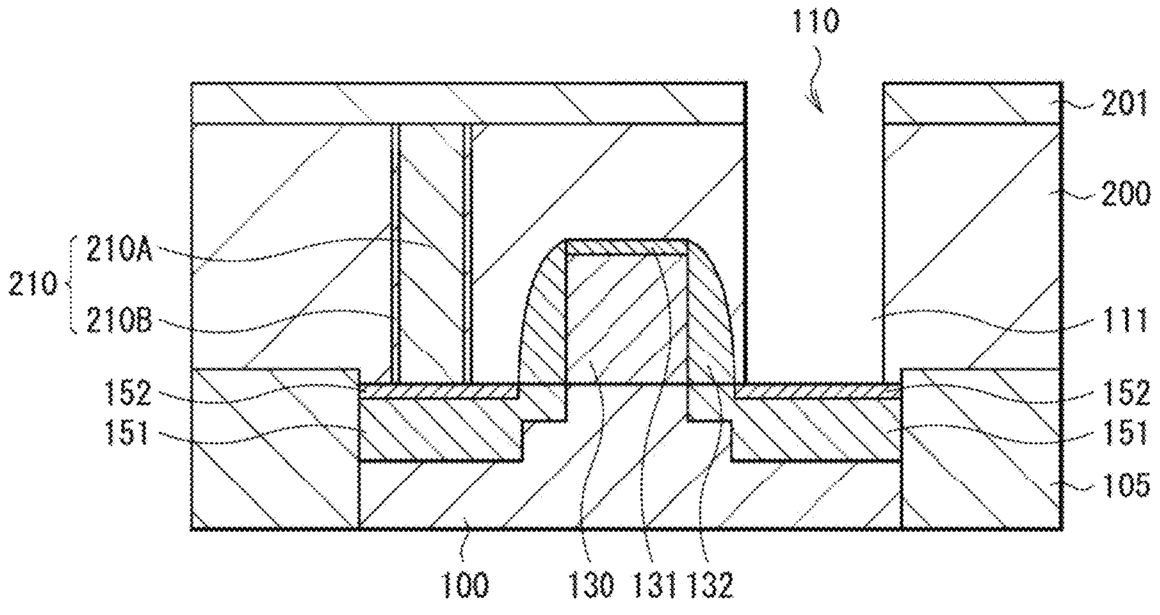
[ FIG. 11B ]
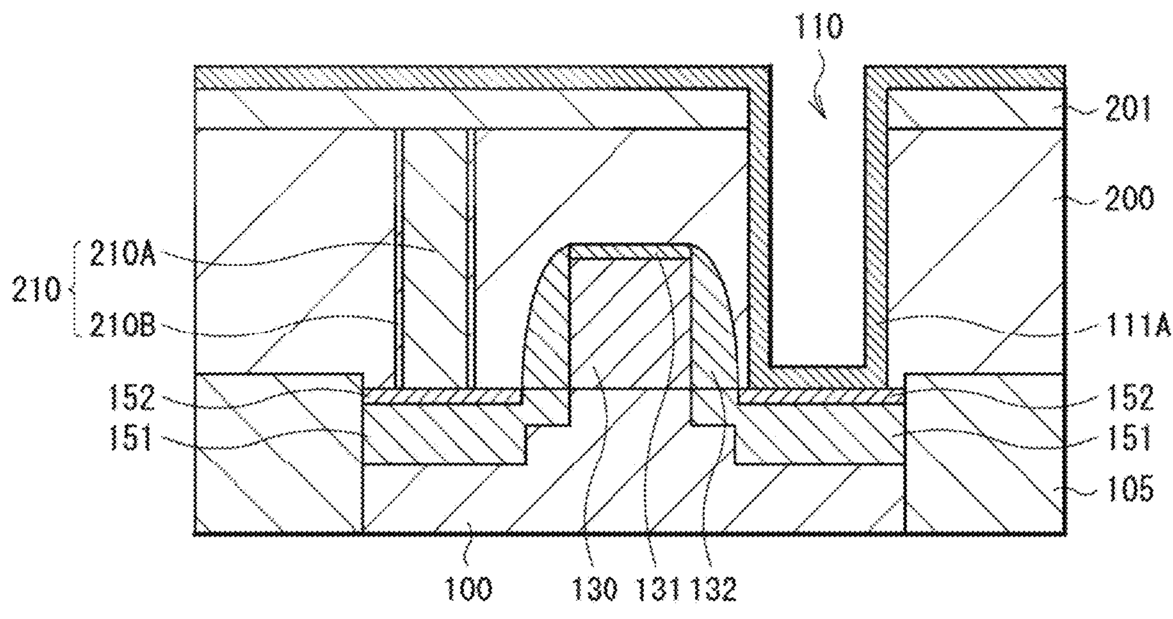

[ FIG. 11C ]
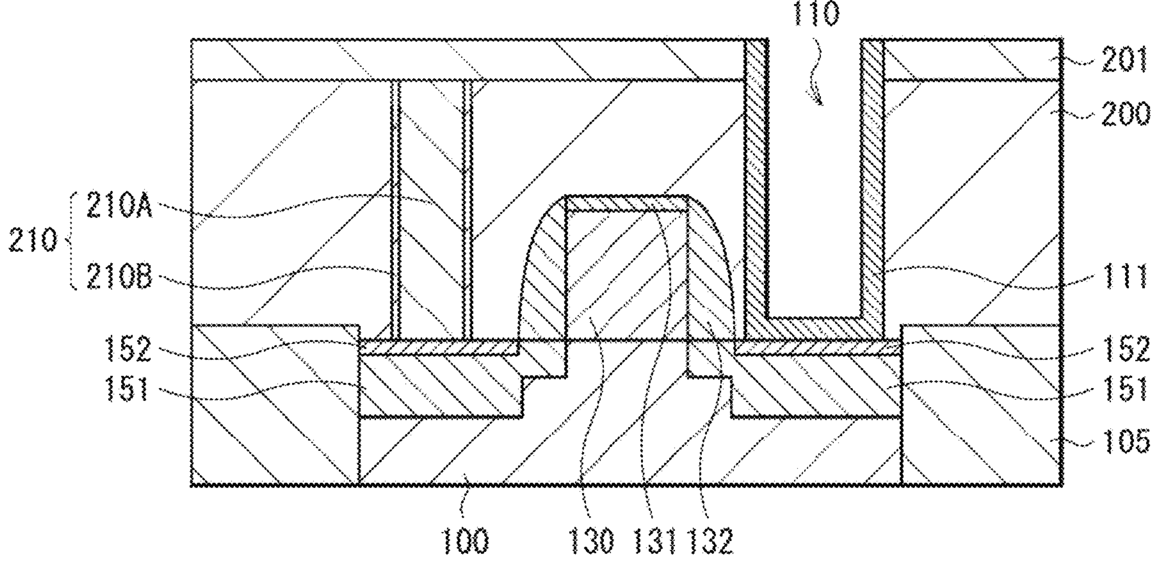
[ FIG. 11D ]
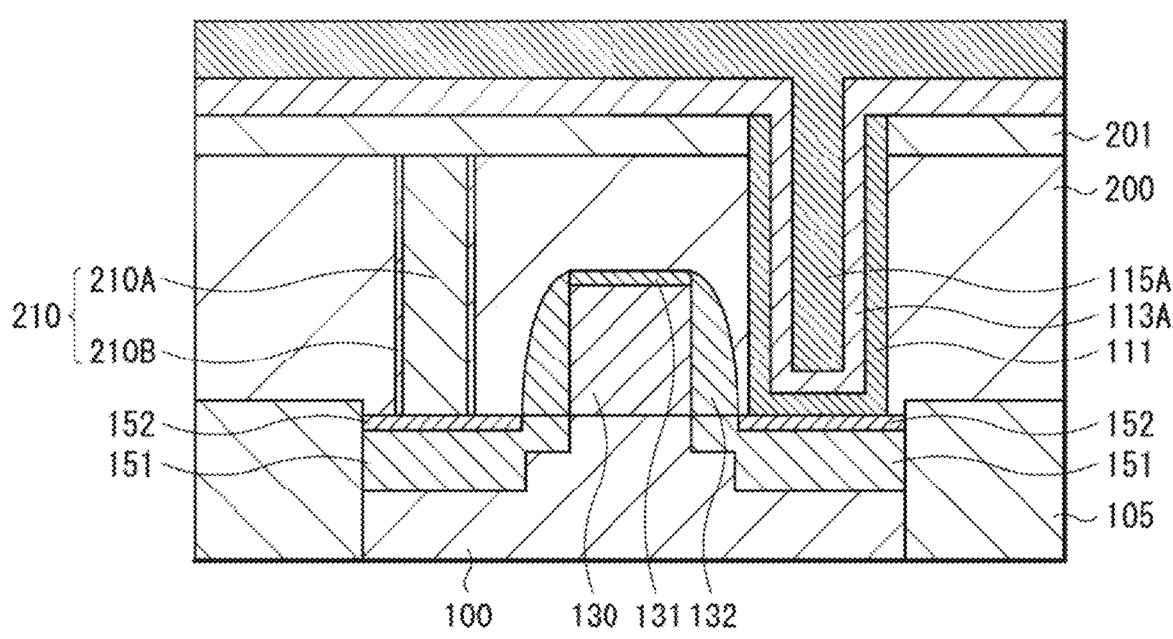

[ FIG. 11E ]
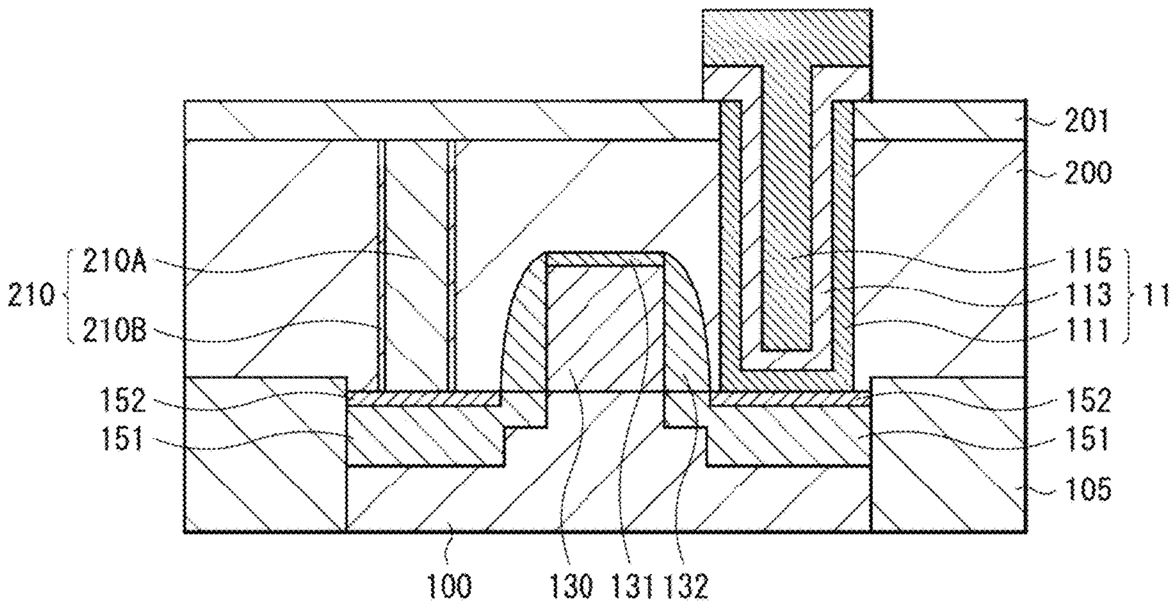
[ FIG. 11F ]
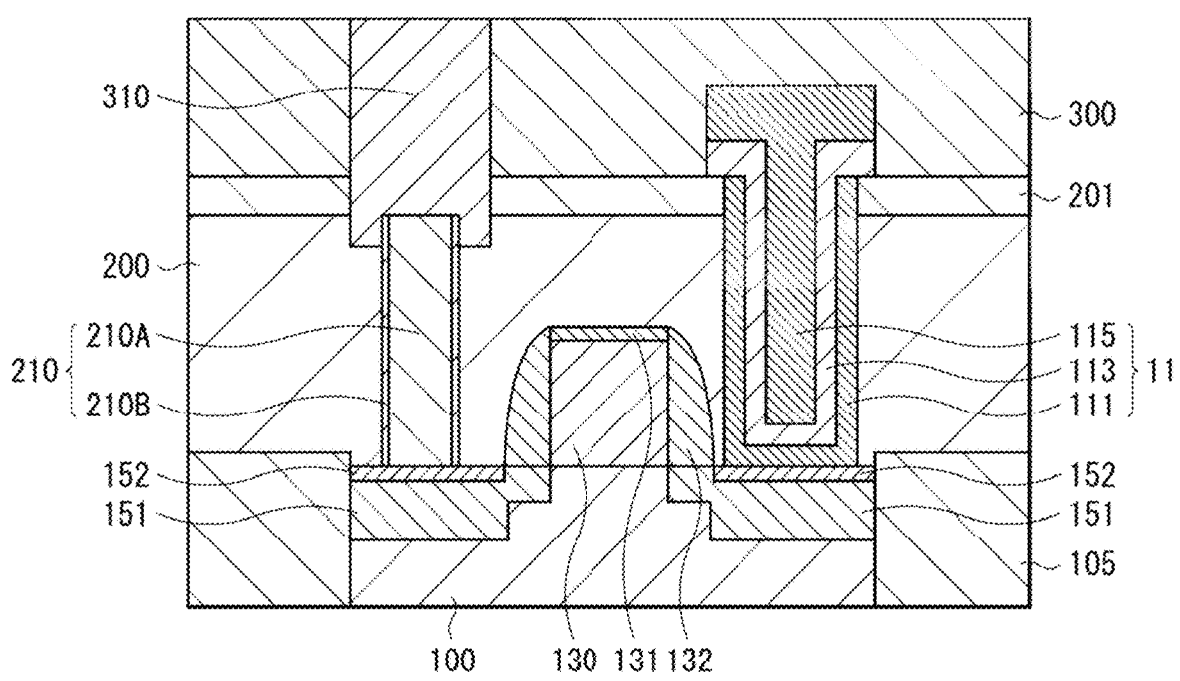

[ FIG. 12 ]
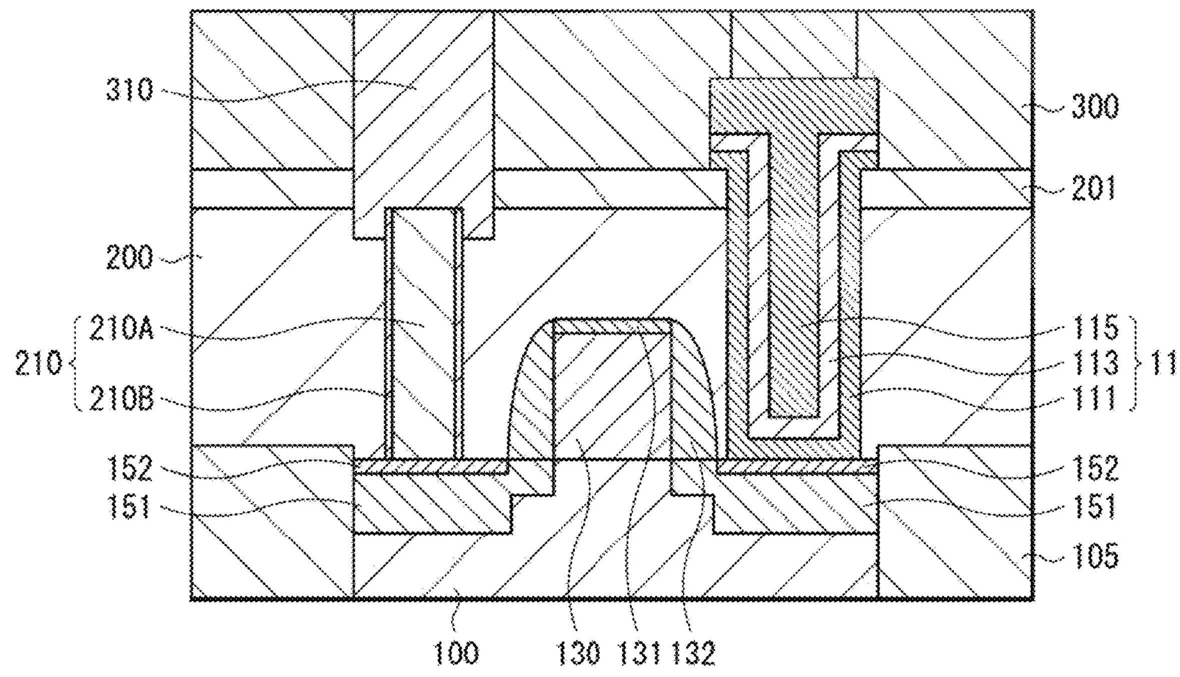
[ FIG. 13 ]
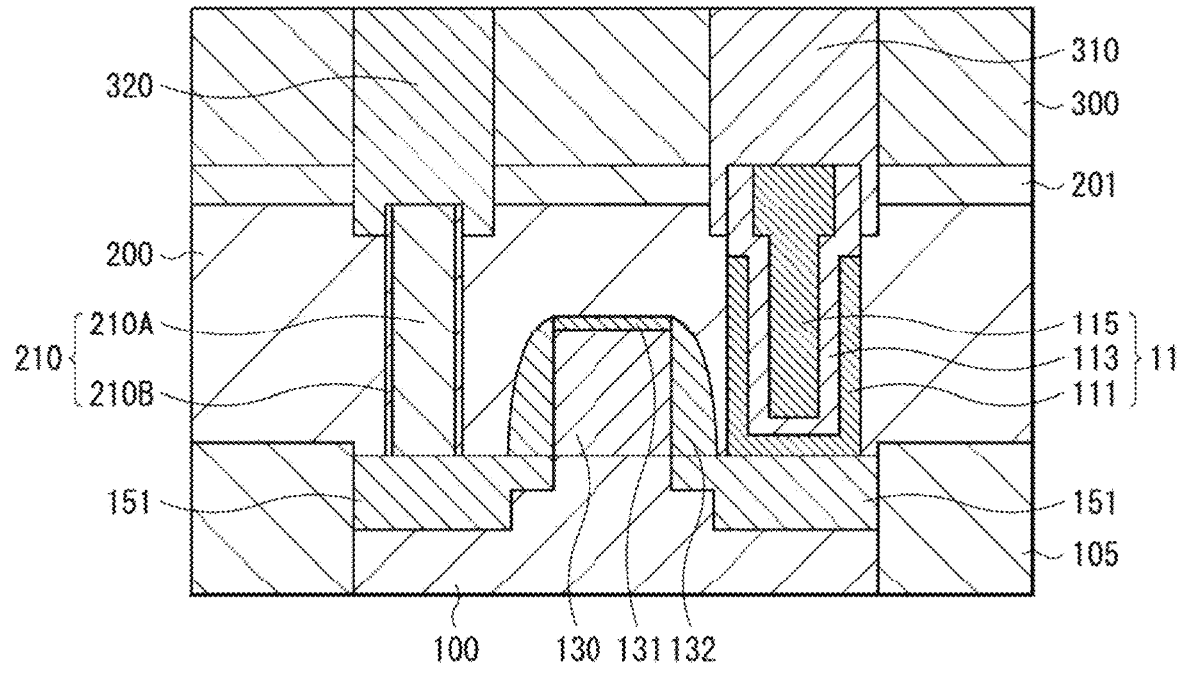

[ FIG. 14 ]
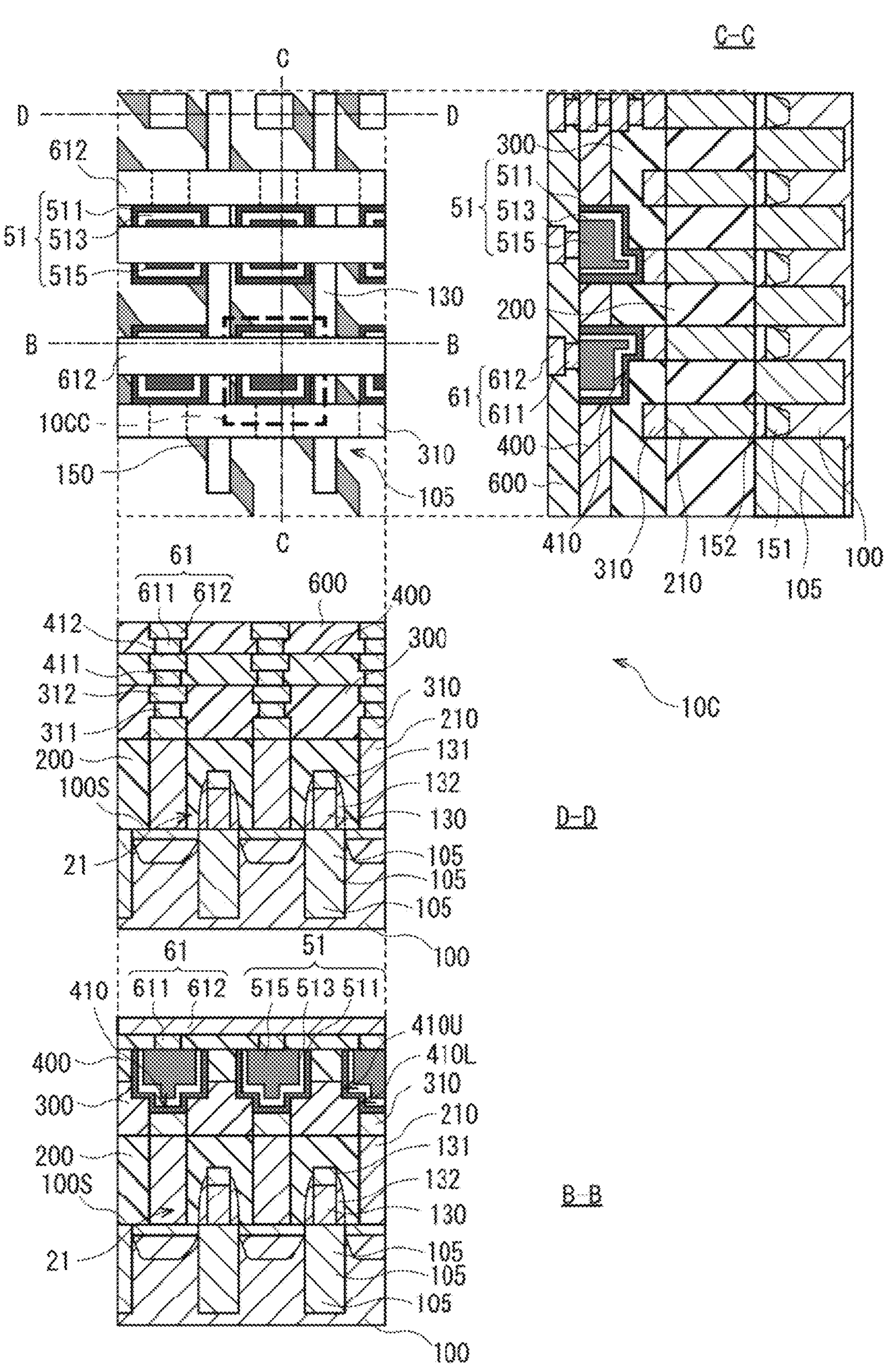

[ FIG. 15A ]
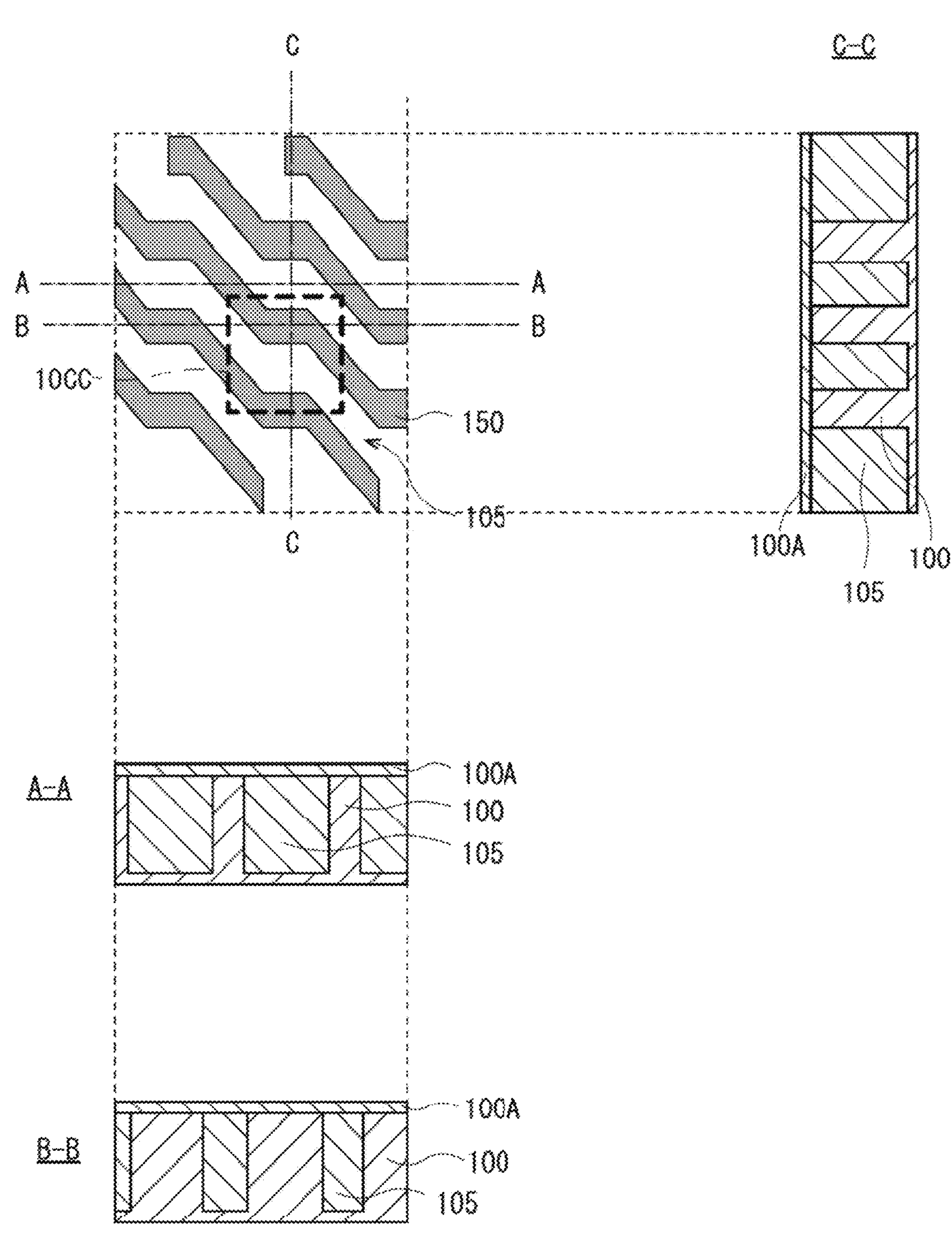

【 FIG. 15B 】
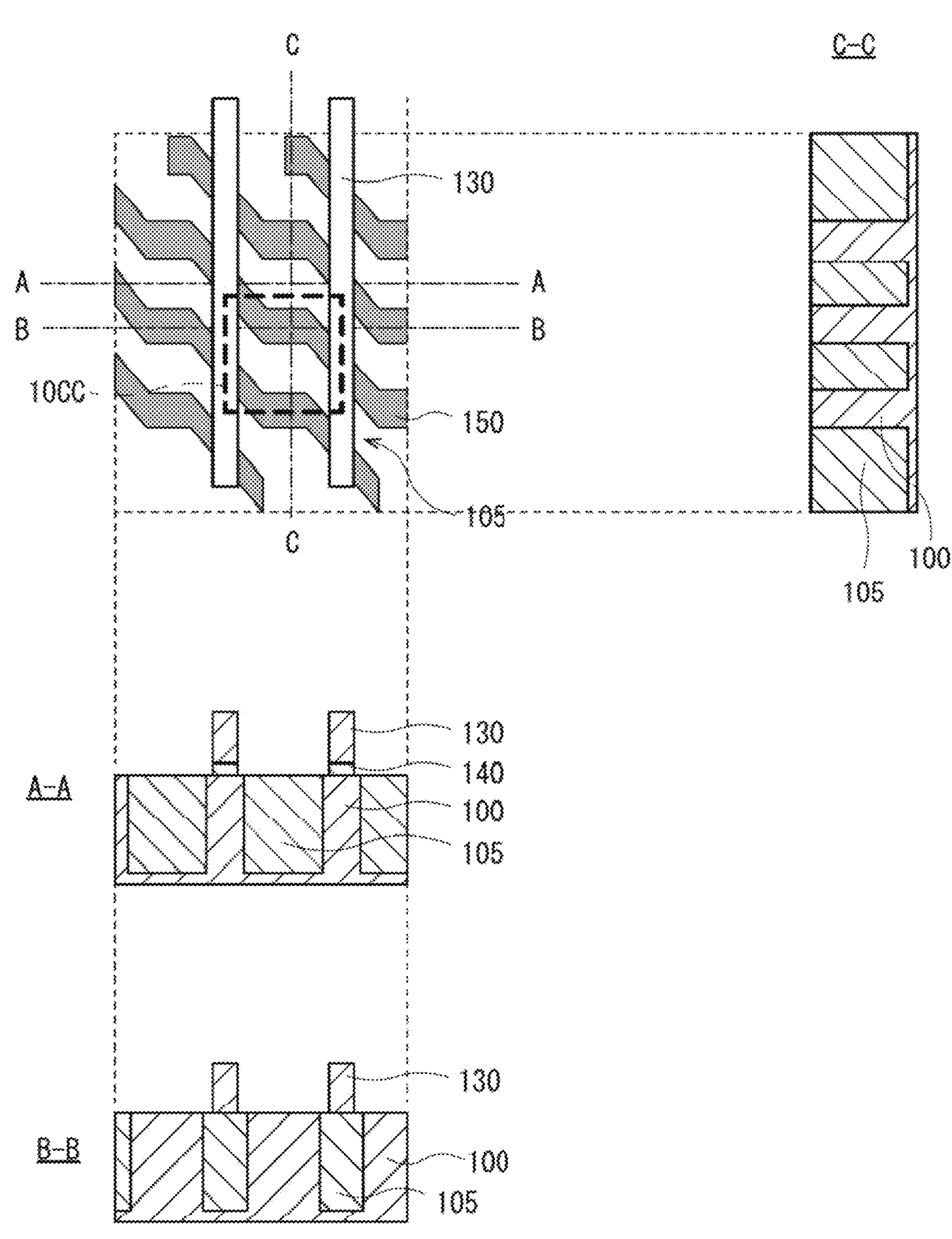

[ FIG. 15C ]
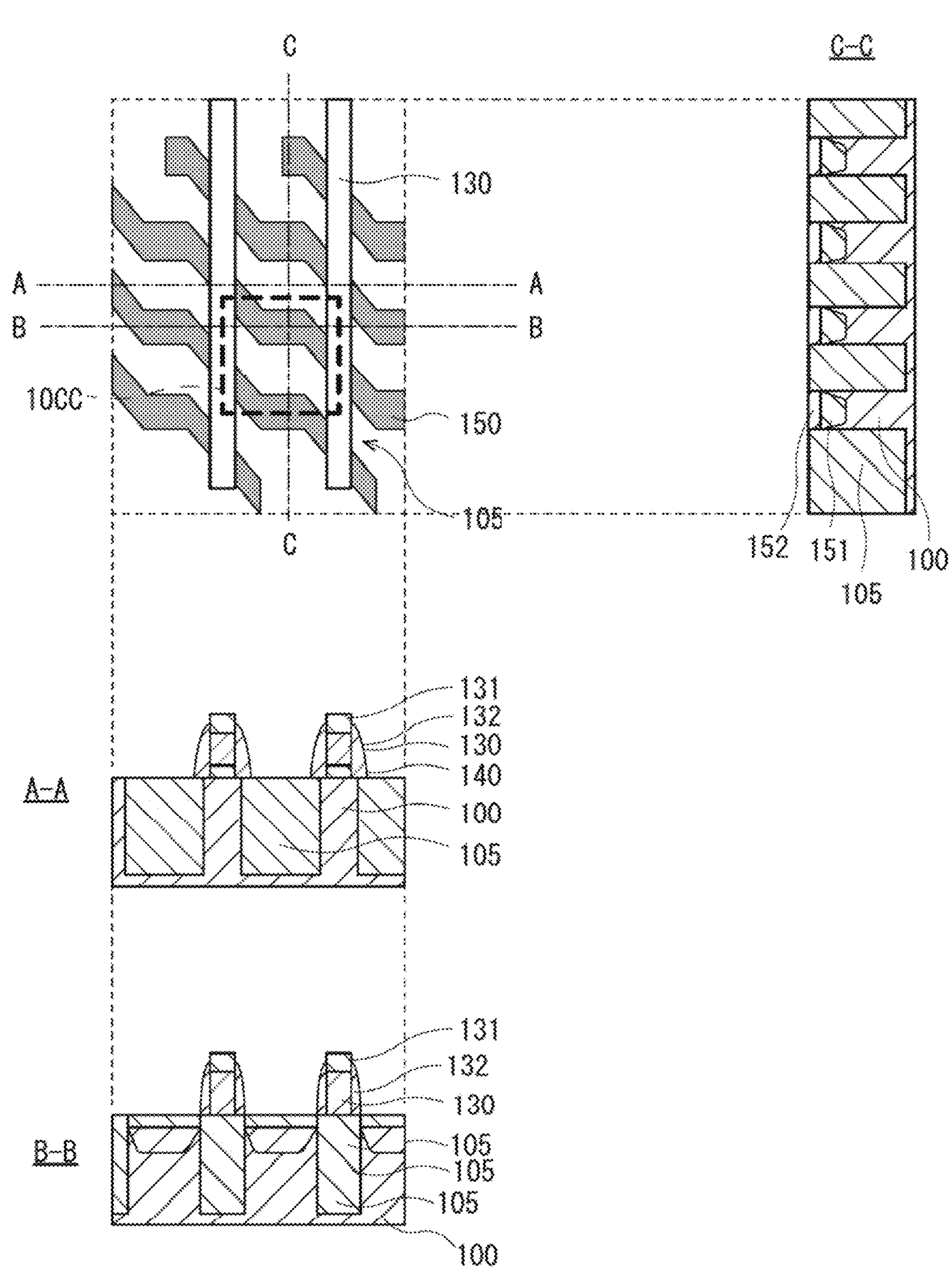

[ FIG. 15D ]
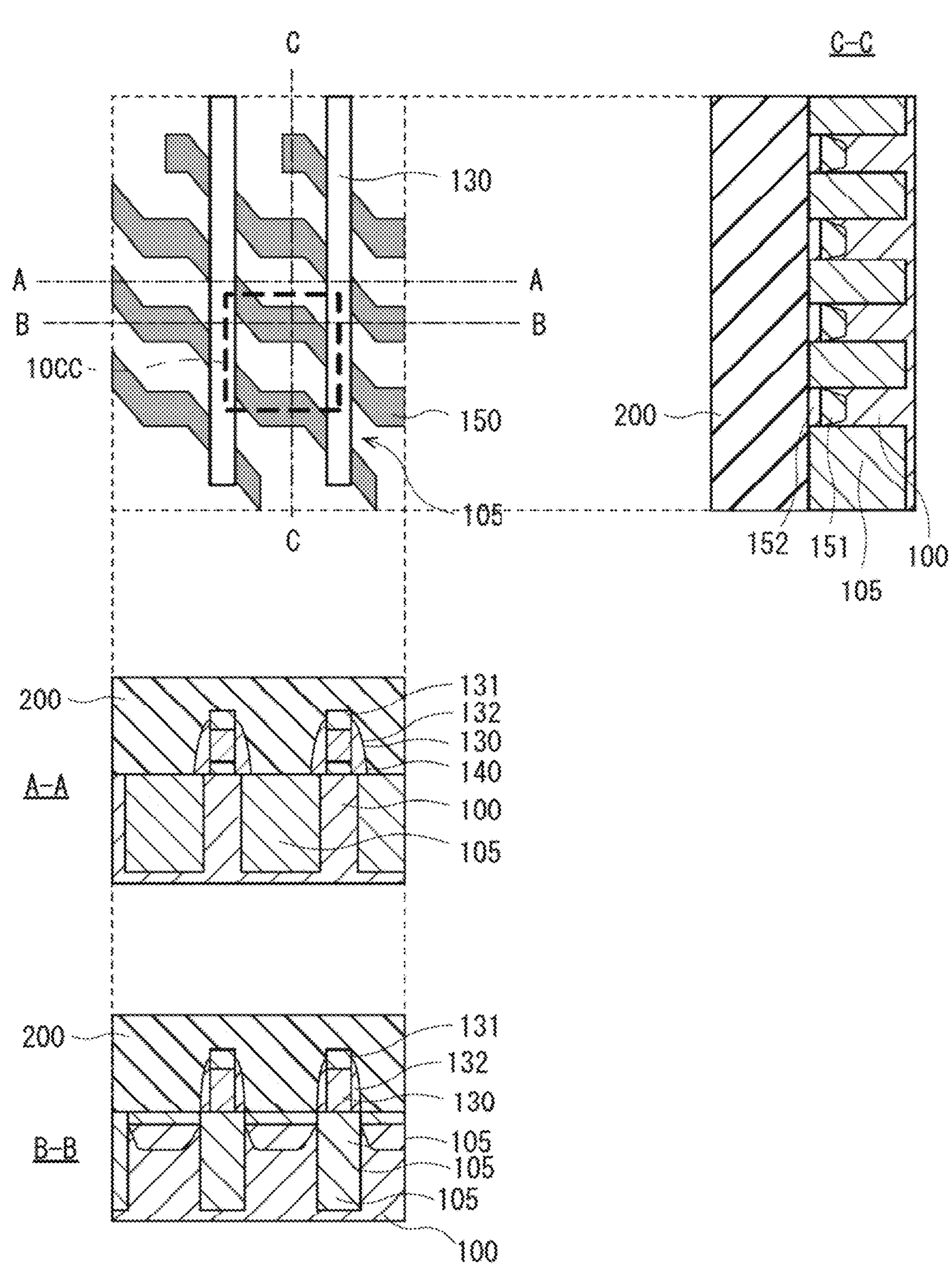

[ FIG. 15E ]
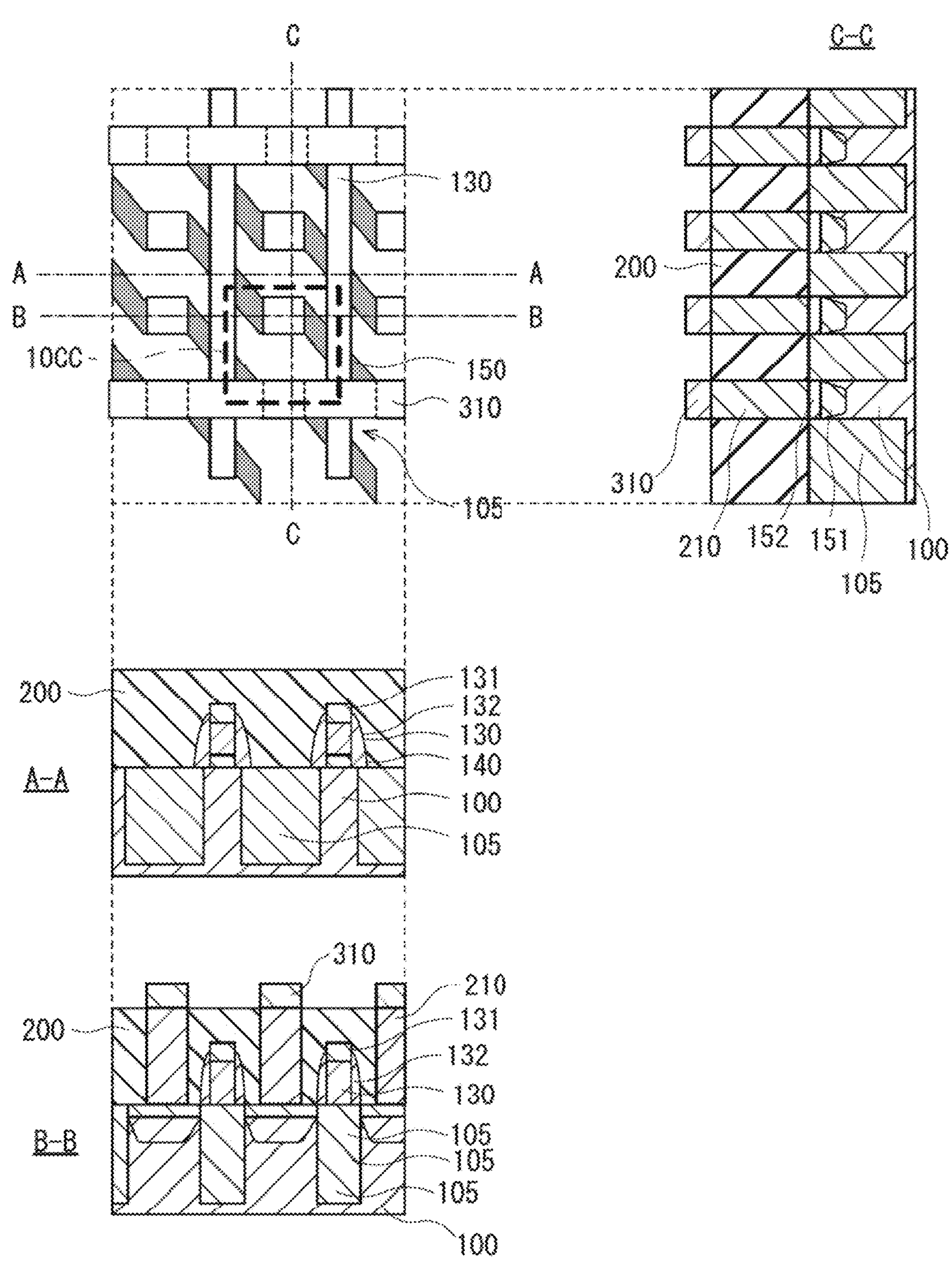

【FIG. 15F】
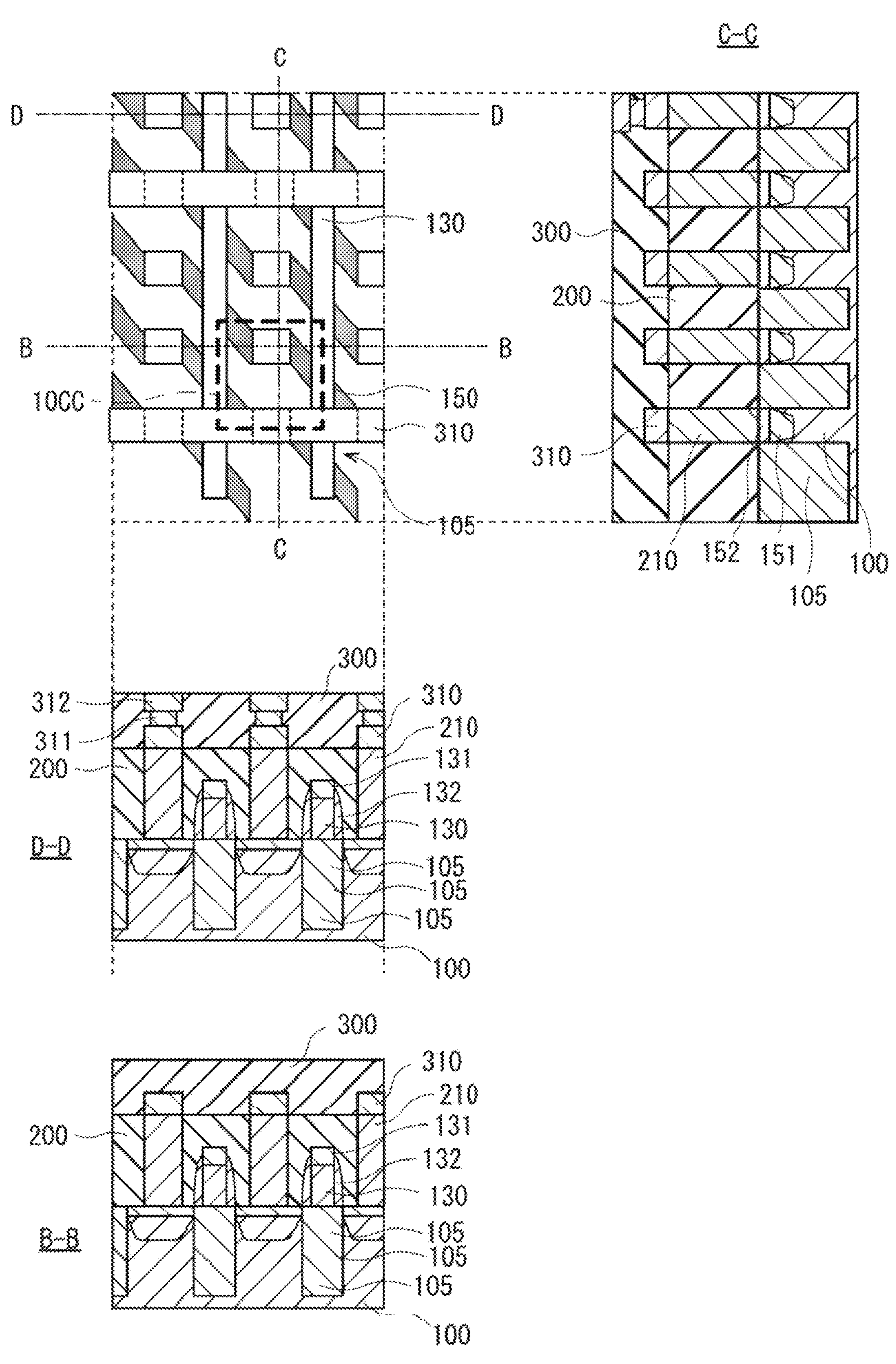

【FIG. 15G】
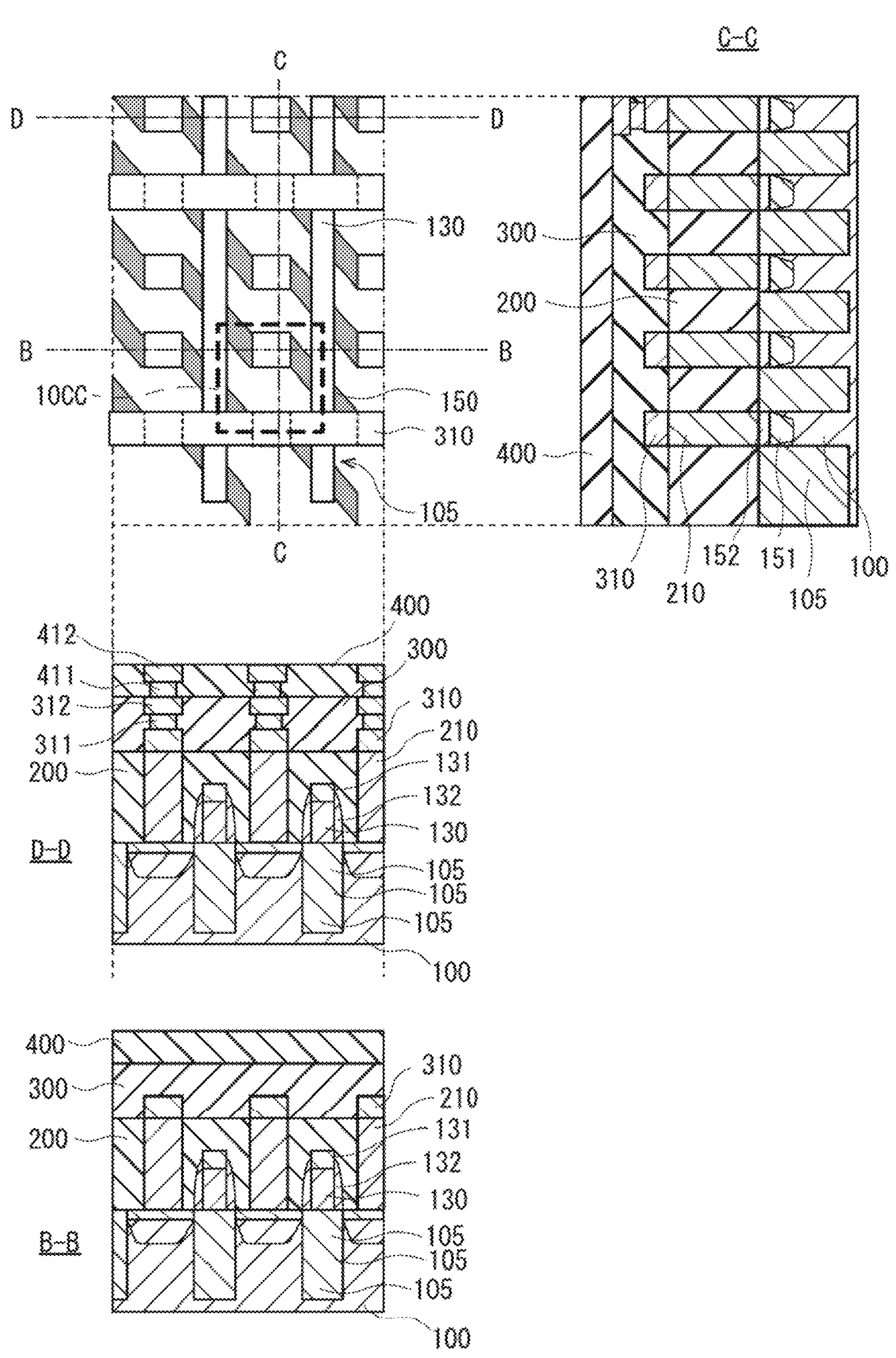

【FIG. 15H】
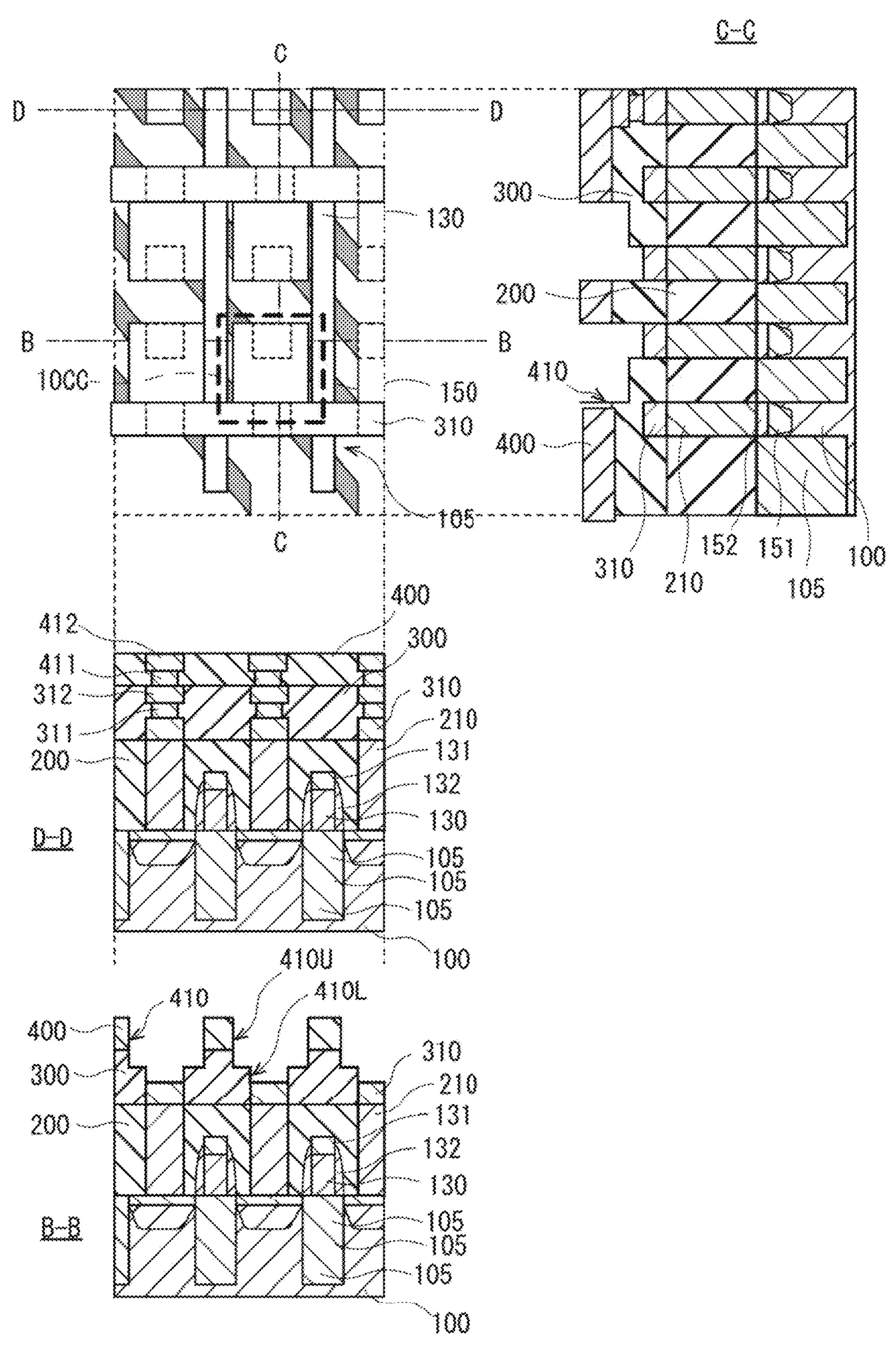

[ FIG. 15I ]
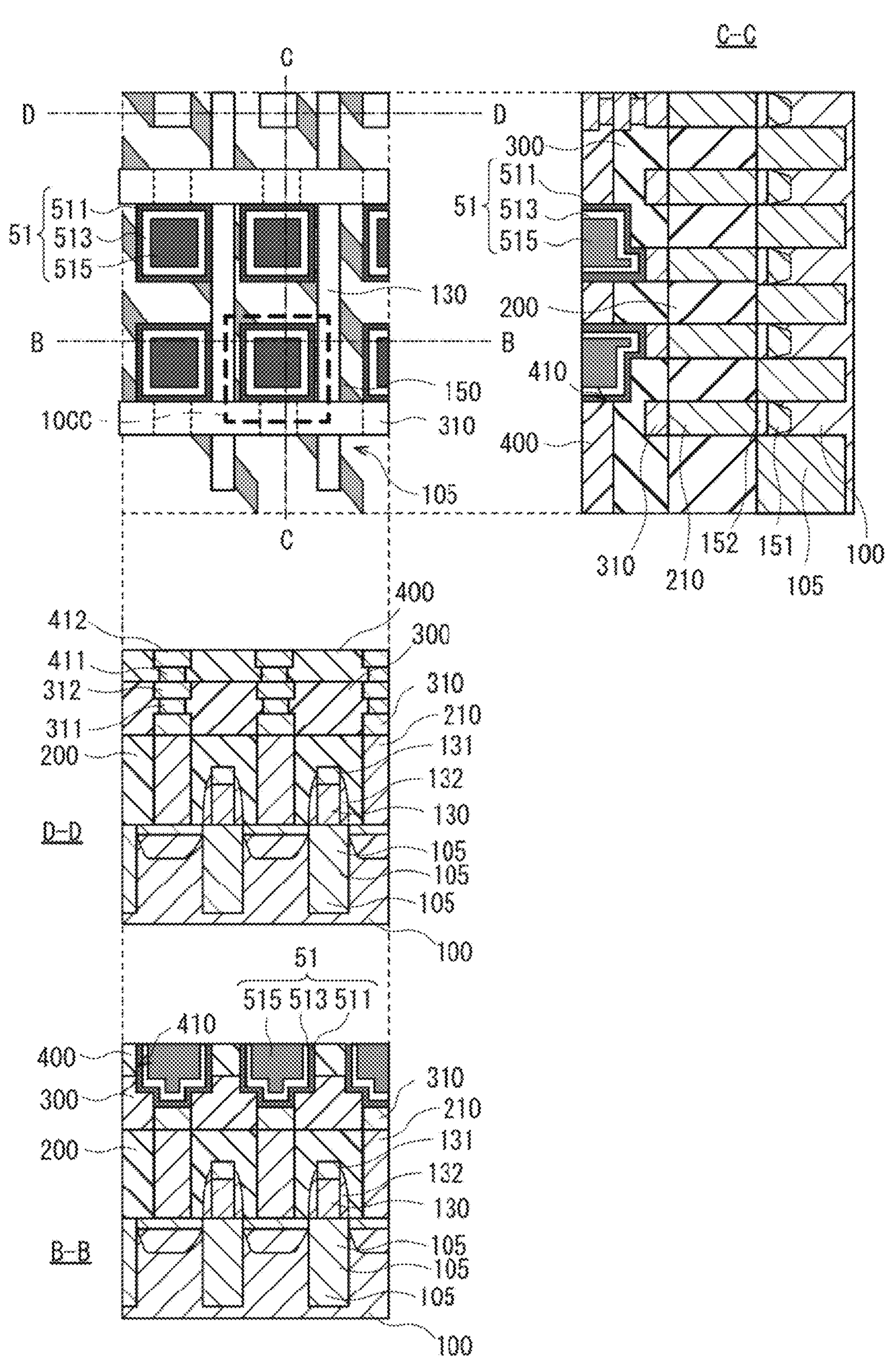

[ FIG. 16 ]
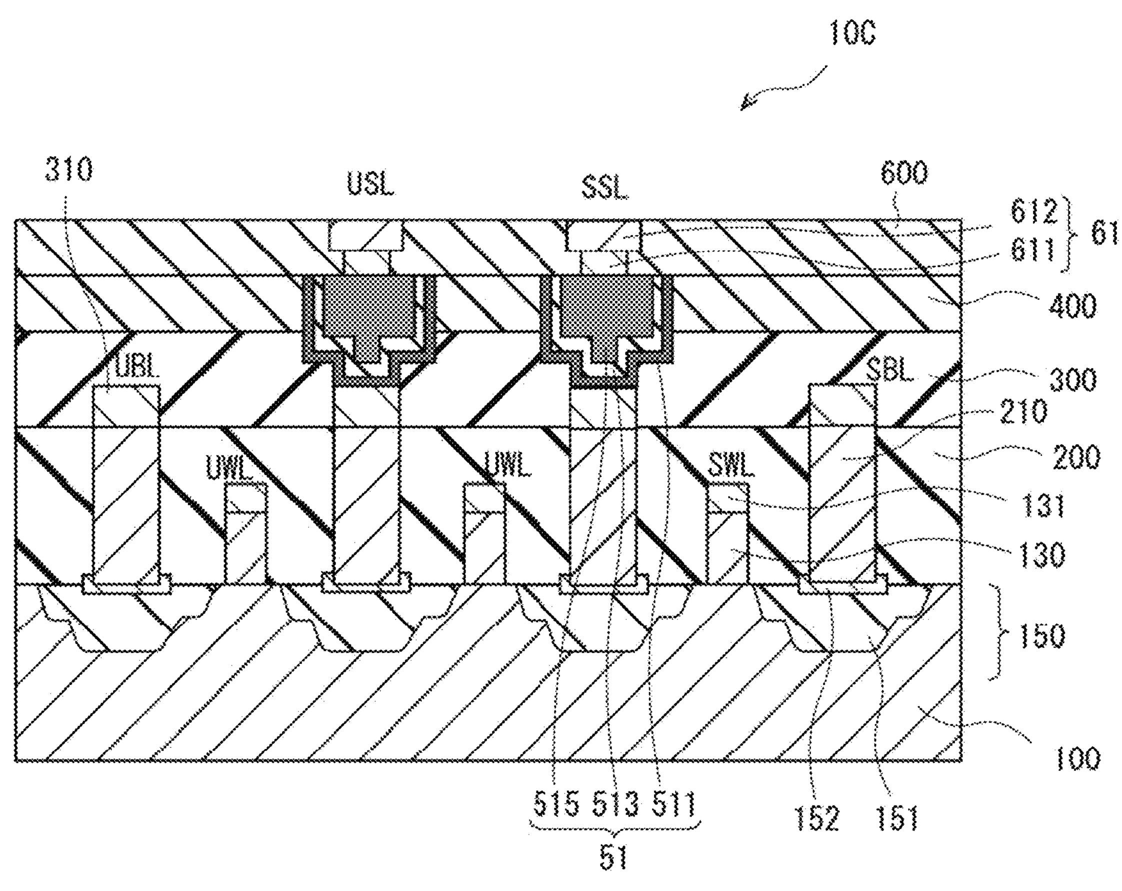

[ FIG. 17 ]
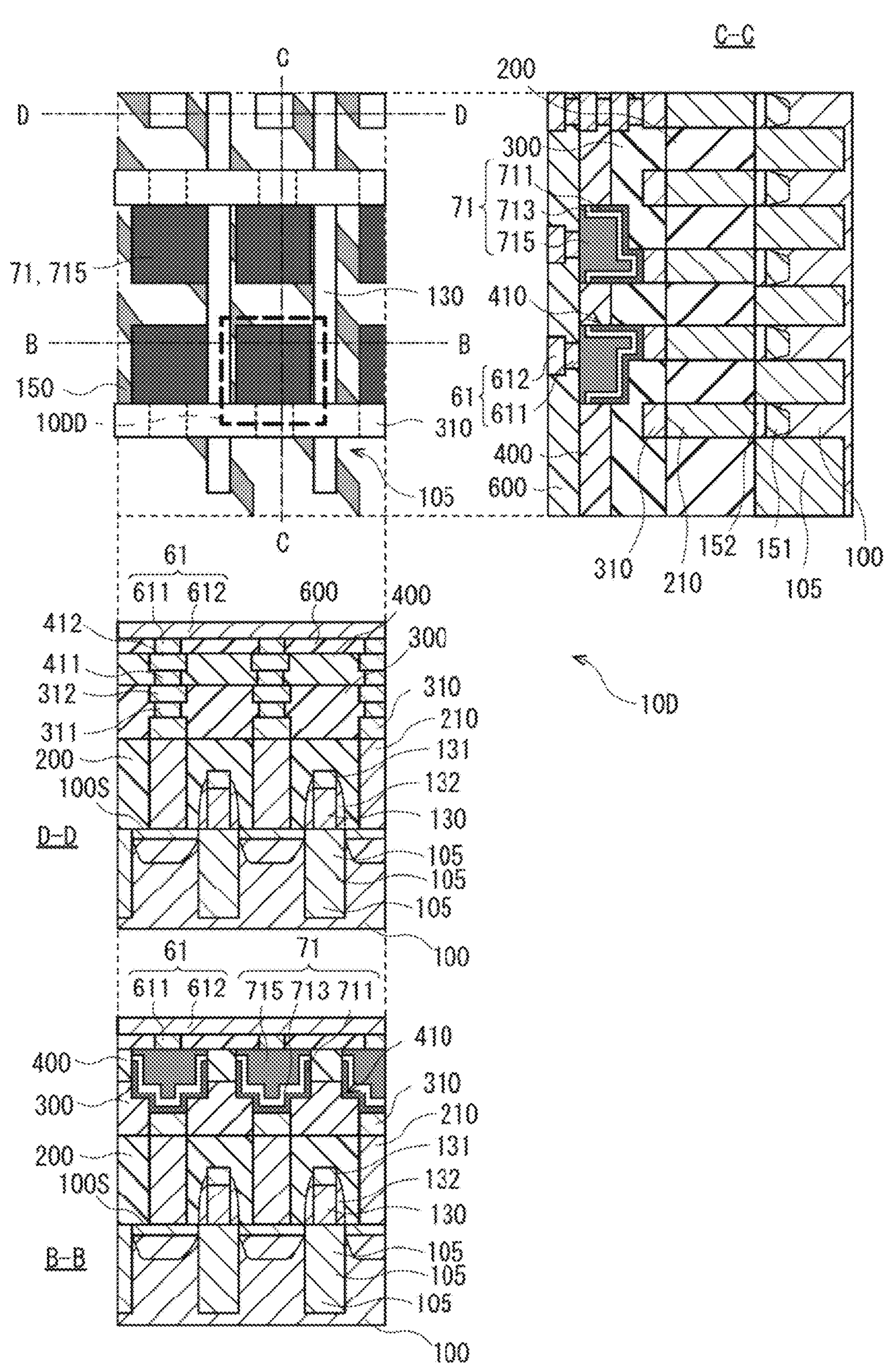

【FIG. 18A】
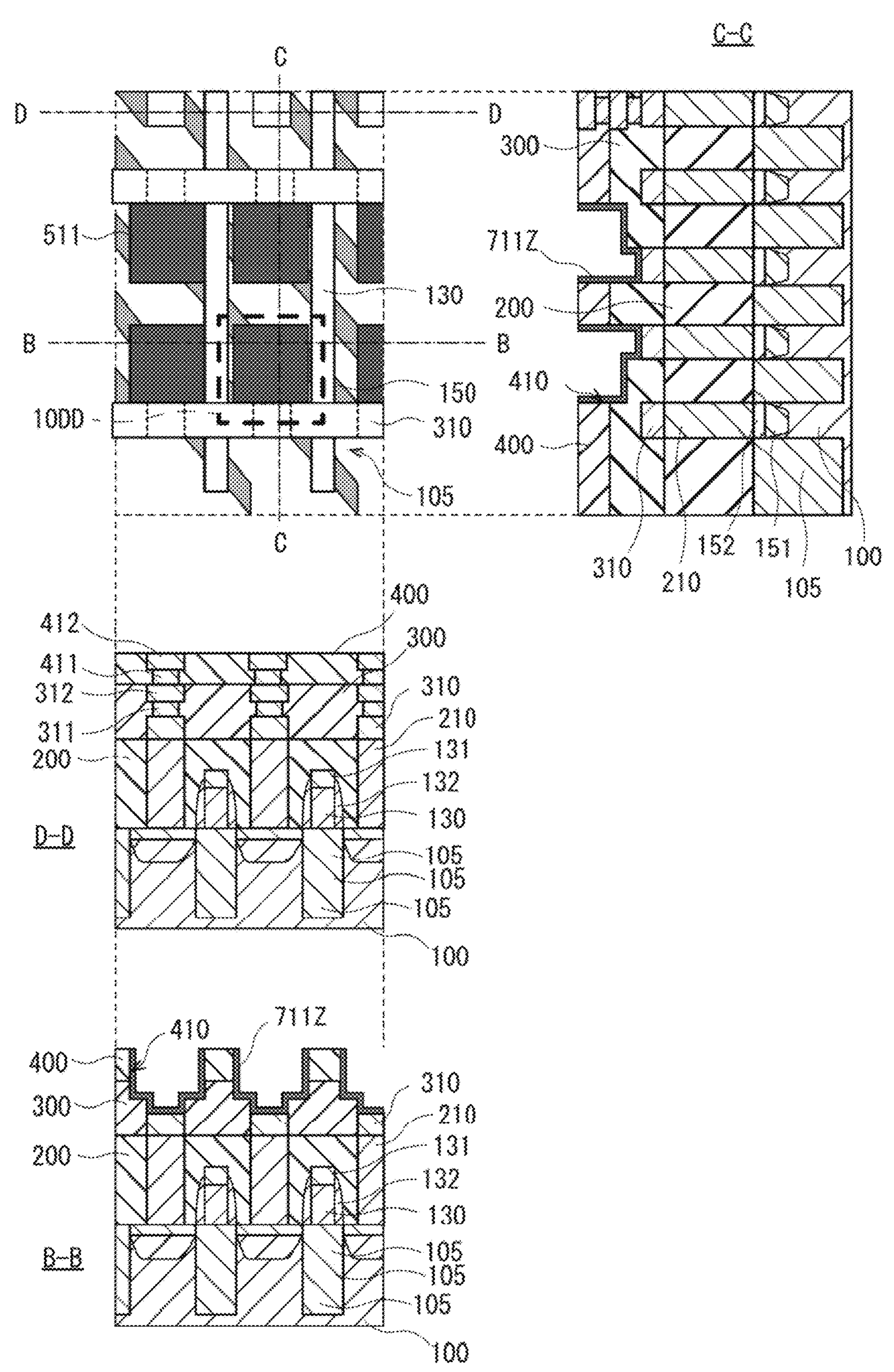

【FIG. 18B】
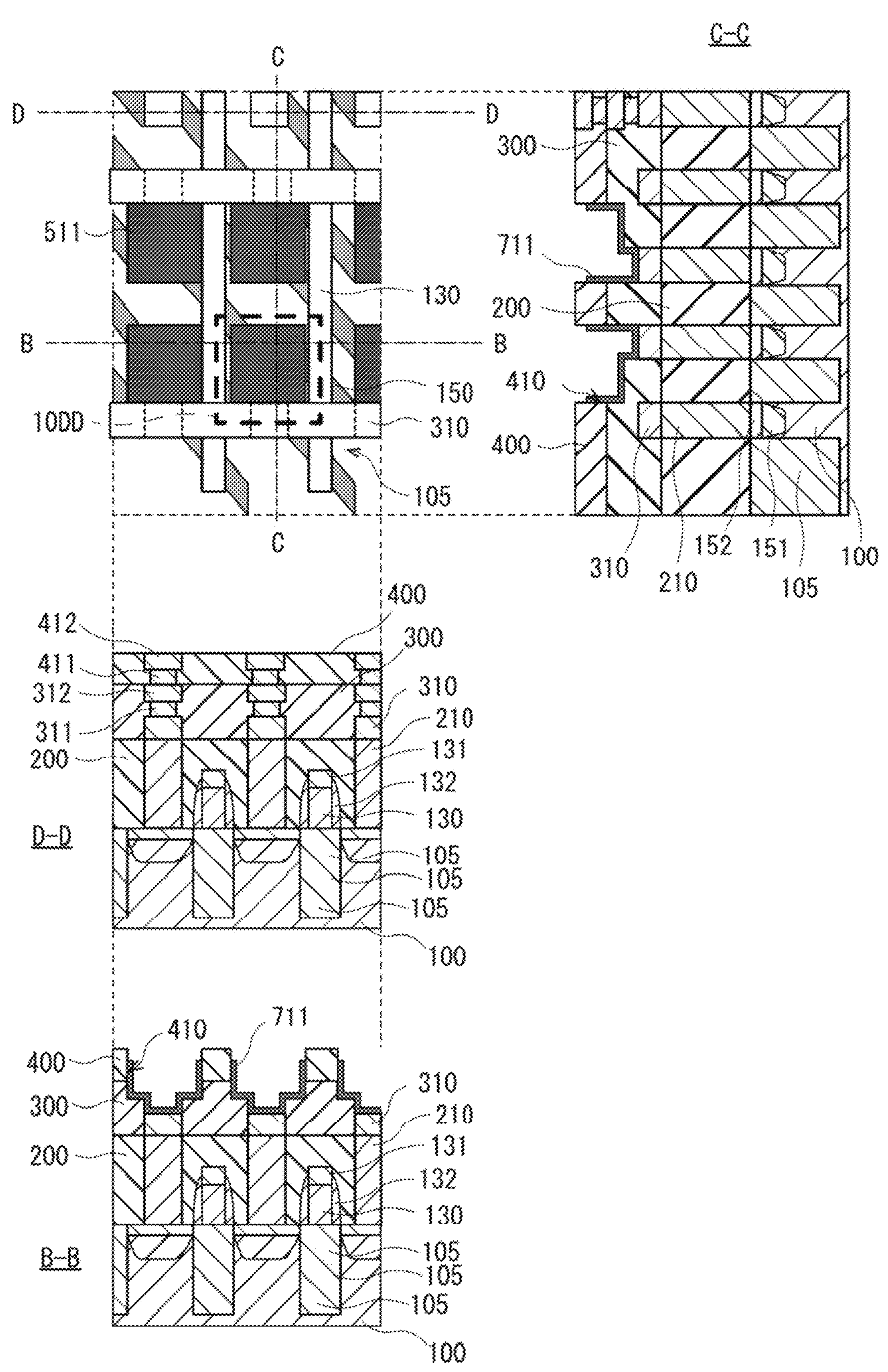

[ FIG. 18C ]
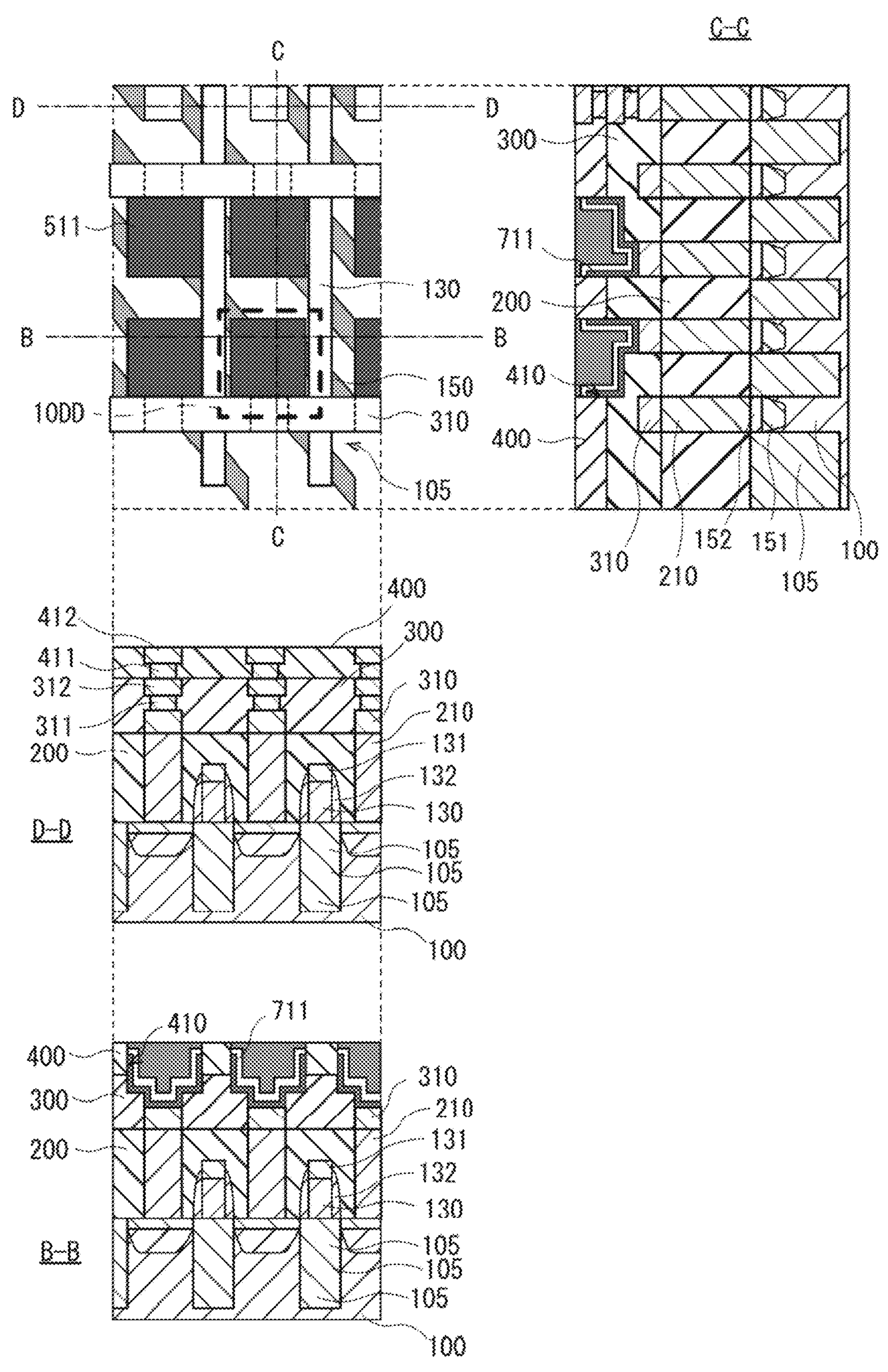

[ FIG. 19 ]
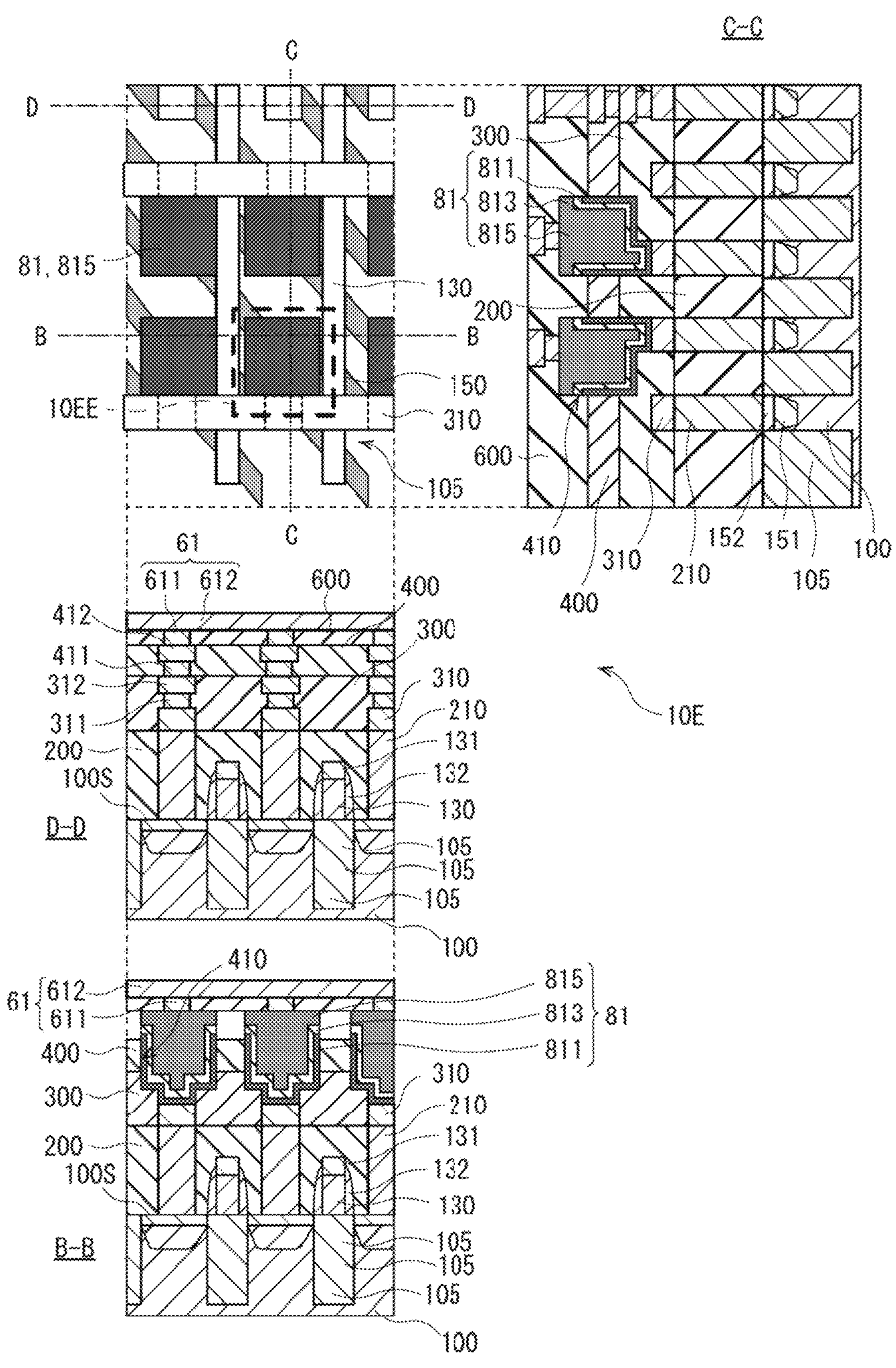

[ FIG. 20A ]
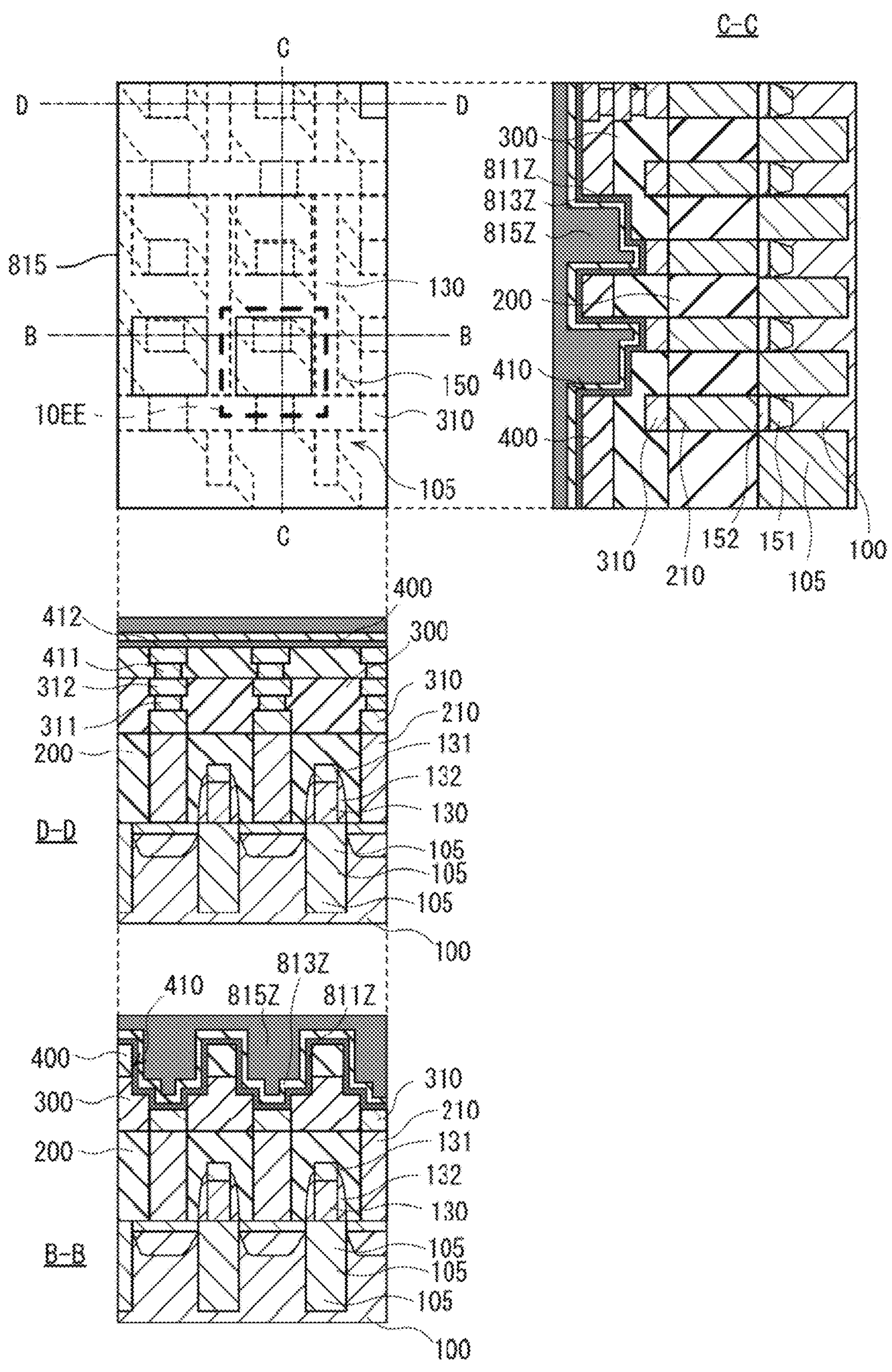

[ FIG. 20B ]
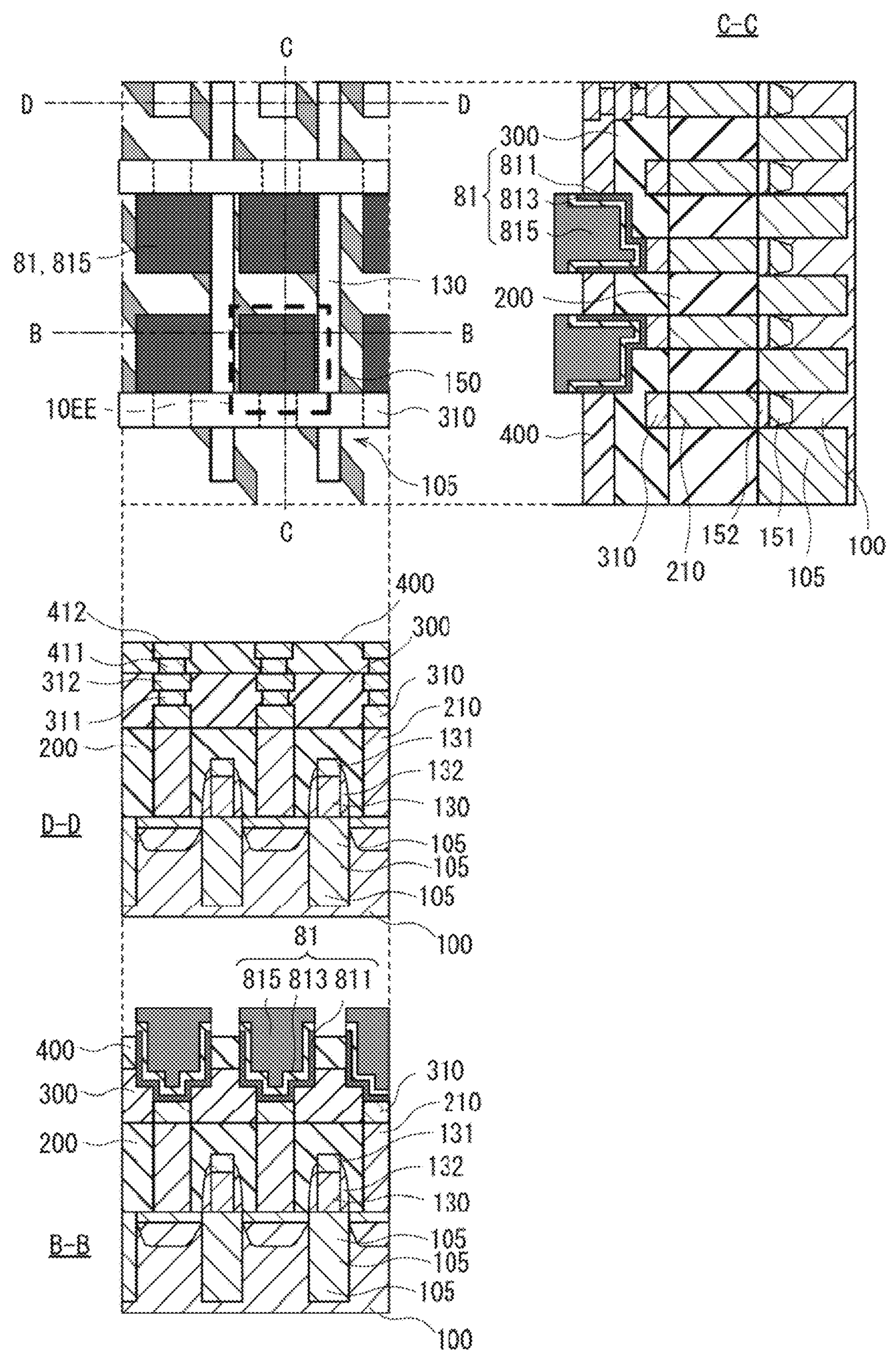

[ FIG. 21 ]
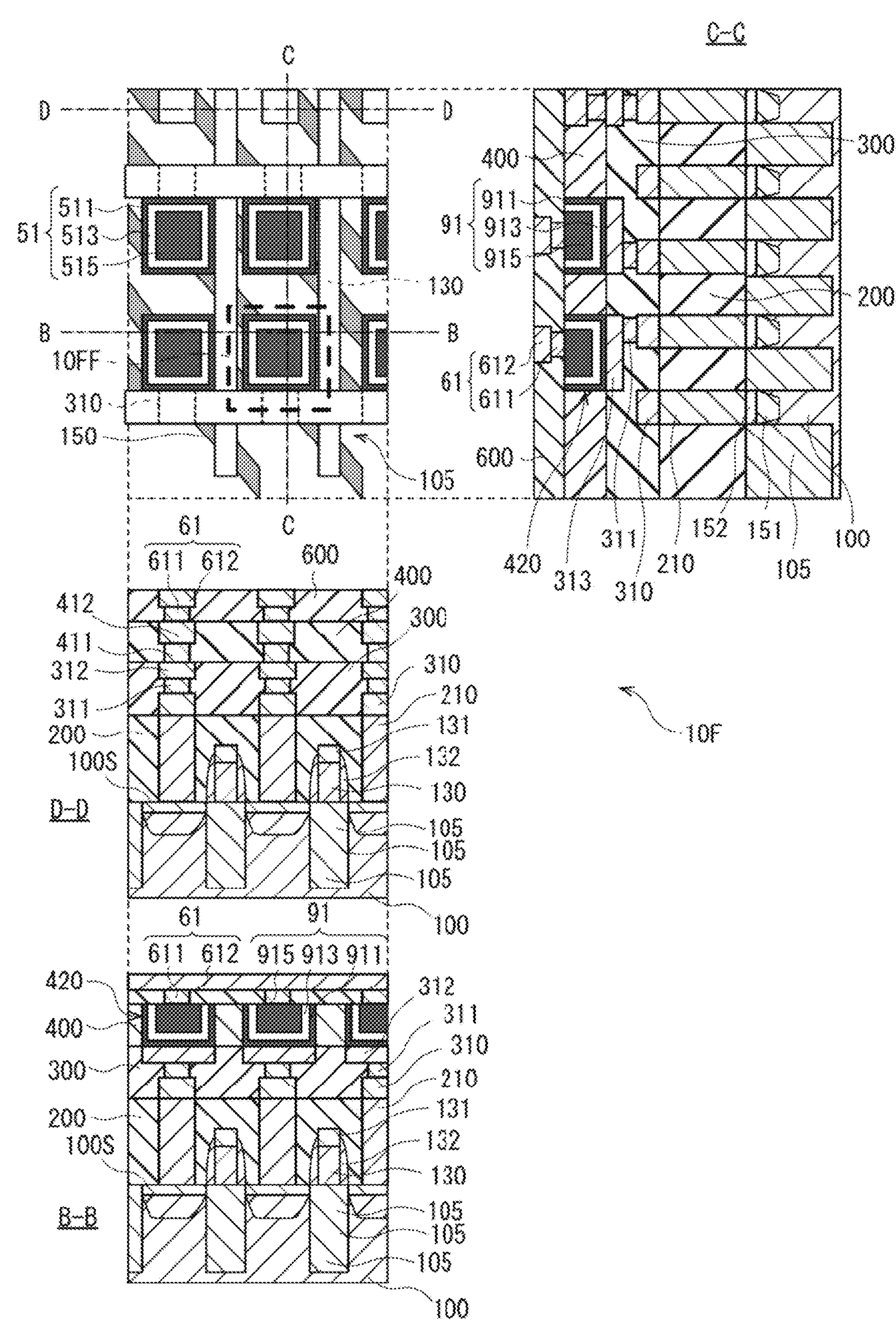

[ FIG. 22A ]
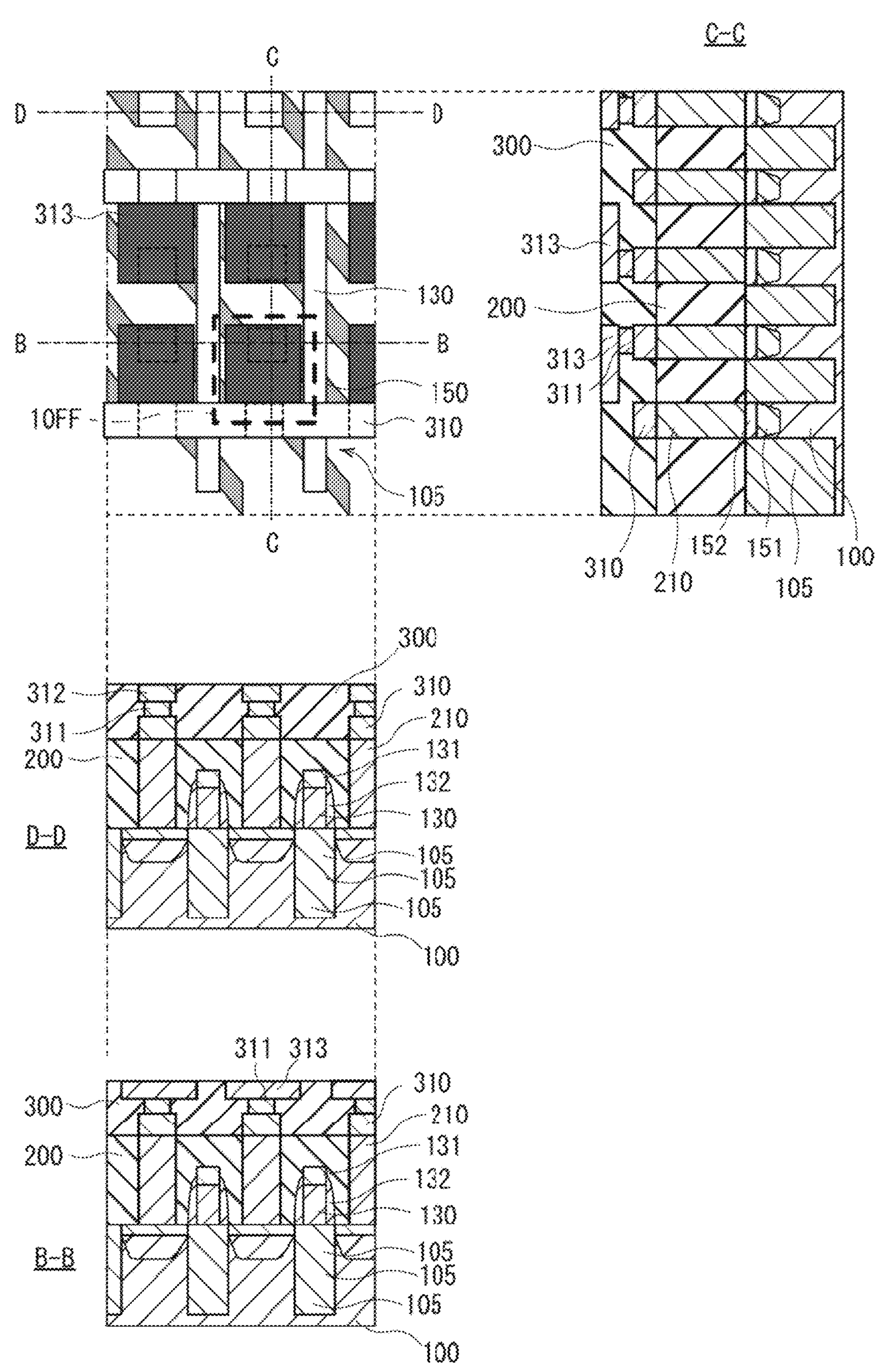

【FIG. 22B】
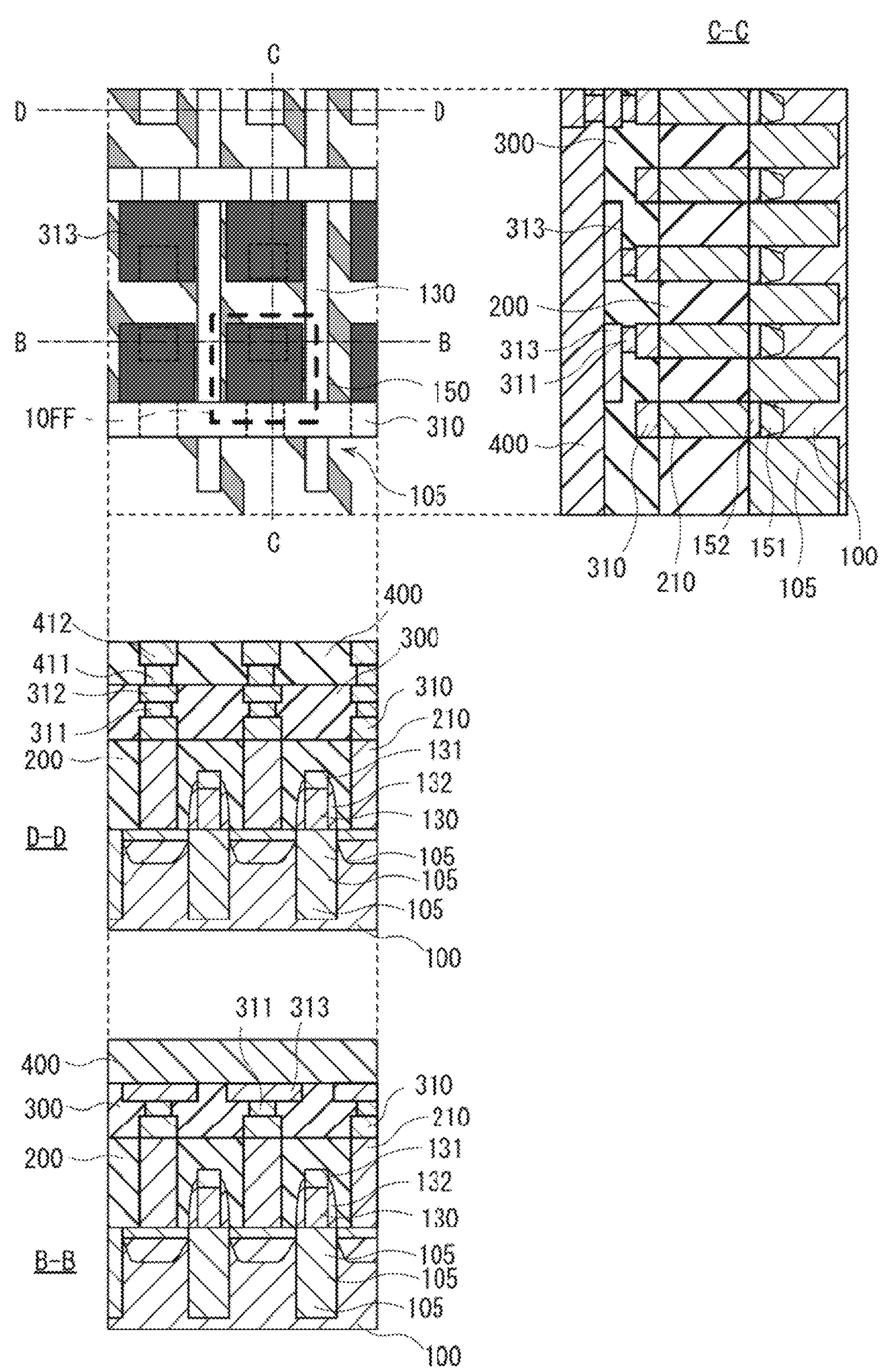

【FIG. 22C】
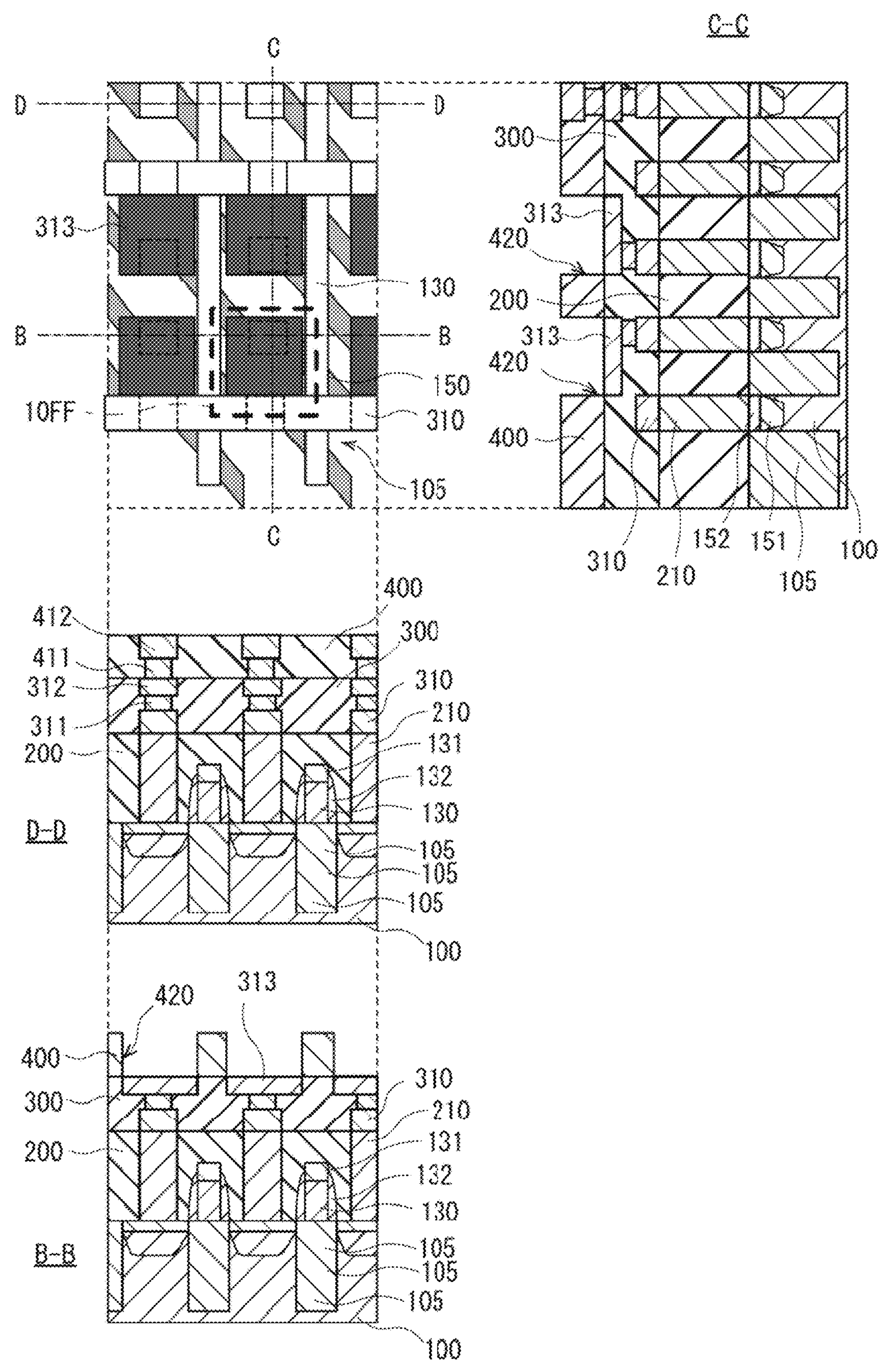

【FIG. 22D】
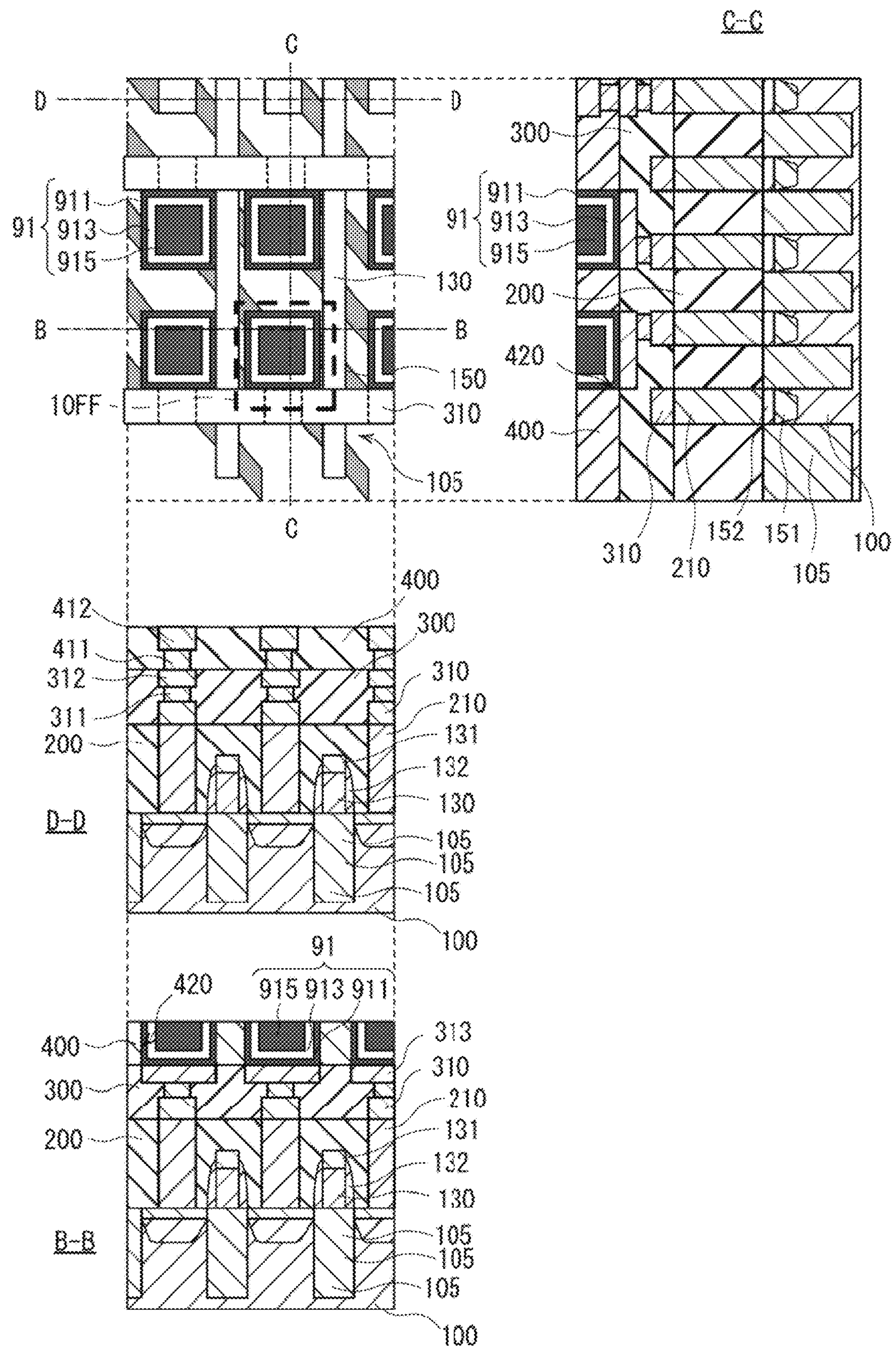

SEMICONDUCTOR STORAGE DEVICE AND METHOD OF MANUFACTURING SEMICONDUCTOR STORAGE DEVICE

CROSS REFERENCE TO RELATED APPLICATIONS

This application is a U.S. National Phase of International Patent Application No. PCT/JP2021/021238 filed on Jun. 3, 2021, which claims priority benefit of Japanese Patent Application No. JP 2021-026747 filed in the Japan Patent Office on Feb. 22, 2021 and which claims priority benefit of Japanese Patent Application No. JP 2020-101915 filed in the Japan Patent Office on Jun. 11, 2020. Each of the above-referenced applications is hereby incorporated herein by reference in its entirety.

TECHNICAL FIELD

The present disclosure relates to a semiconductor storage device and a method of manufacturing a semiconductor storage device.

BACKGROUND ART

CMOS (Complementary MOS) circuits each including an n-type field-effect transistor (nMOSFET) and a p-type field-effect transistor (pMOSFET) provided on the same substrate have been known as circuits that consume less power and are operable at high speed. In addition, the miniaturization and high integration of circuits are easy.

Therefore, CMOS circuits are used in a large number of LSI (Large Scale Integration) devices. It is to be noted that such LSI devices have been each commercialized in recent years as SoC (System on a Chip) which consolidates an analog circuit, a memory, a logic circuit, and the like in one chip.

For example, Static RAM (Static Random Access Memory: SRAM) or the like is used for a memory mounted on an LSI device. In recent years, it has been considered to use Dynamic RAM (DRAM), Magnetic RAM (MRAM), Ferroelectric RAM (FeRAM), or the like in place of SRAM to reduce the cost and the power consumption of an LSI device more.

Here, the FeRAM is a semiconductor storage device that stores information by using the direction of the remanent polarization of a ferroelectric. As an example of a structure of the FeRAM, a structure is disclosed in which, for example, a ferroelectric capacitor is formed in a contact hole or a damascene structure below a wiring line (e.g., PTL 1).

CITATION LIST

Patent Literature

PTL 1: Japanese Unexamined Patent Application Publication No. 2001-7304

SUMMARY OF THE INVENTION

Such FeRAM is requested to obtain a sufficient margin for operation by further increasing the capacitance of the ferroelectric capacitor. Specifically, a structure of a ferroelectric capacitor that is allowed to have larger area to increase the capacitance of the ferroelectric capacitor and a method of forming a ferroelectric capacitor are desired.

It is therefore desirable to provide a semiconductor storage device that is allowed to obtain a sufficient margin for operation and a method of manufacturing a semiconductor storage device.

A semiconductor storage device according to an embodiment of the present disclosure includes: a field-effect transistor; an interlayer insulating film; a contact; a first wiring layer; a first insulating layer; an opening section; and a ferroelectric capacitor. The field-effect transistor is provided in a semiconductor substrate. The interlayer insulating film is provided on the semiconductor substrate. The contact penetrates the interlayer insulating film and is electrically coupled to a drain of the field-effect transistor. The first wiring layer is provided on the contact. The first insulating layer is provided on the interlayer insulating film and has the first wiring layer buried therein. The opening section is provided in the first insulating layer and the interlayer insulating film from a layer upper than the first wiring layer. The ferroelectric capacitor is provided in the opening section and electrically coupled to a source of the field-effect transistor.

A semiconductor storage device according to an embodiment of the present disclosure includes: a field-effect transistor; an interlayer insulating film; an opening section; and a ferroelectric capacitor. The field-effect transistor is provided in a semiconductor substrate. The interlayer insulating film is provided on the semiconductor substrate. The opening section includes a first opening and a second opening having a smaller opening diameter than an opening diameter of the first opening. The first opening is formed in the interlayer insulating film. The second opening is formed in the first opening. The ferroelectric capacitor is provided in the opening section and electrically coupled to a source of the field-effect transistor.

A semiconductor storage device according to an embodiment of the present disclosure includes: a field-effect transistor; an interlayer insulating film; a contact; and a ferroelectric capacitor. The field-effect transistor is provided in a semiconductor substrate. The interlayer insulating film is provided on the semiconductor substrate. The contact penetrates the interlayer insulating film and is electrically coupled to a drain of the field-effect transistor. The ferroelectric capacitor is provided in an opening section at height different from height of the contact and electrically coupled to a source of the field-effect transistor. The opening section is provided to extend through at least the interlayer insulating film.

A method of manufacturing a semiconductor storage device according to an embodiment of the present disclosure includes: forming a field-effect transistor in a semiconductor substrate; forming an interlayer insulating film on the semiconductor substrate; forming a contact that penetrates the interlayer insulating film and is electrically coupled to a drain of the field-effect transistor; forming a first wiring layer on the contact; forming a first insulating layer on the interlayer insulating film; forming an opening section in the first insulating layer and the interlayer insulating film from a layer upper than the first wiring layer; and forming a ferroelectric capacitor in the opening section. The first insulating layer has the first wiring layer buried therein. The ferroelectric capacitor is electrically coupled to a source of the field-effect transistor.

A method of manufacturing a semiconductor storage device according to an embodiment of the present disclosure includes: forming a field-effect transistor in a semiconductor substrate; forming an interlayer insulating film on the semiconductor substrate; forming a first opening in the interlayer insulating film; forming a second opening in the first opening; and forming a ferroelectric capacitor in an opening section including the first opening and the second opening. The second opening has a smaller opening diameter than an opening diameter of the first opening. The ferroelectric capacitor is electrically coupled to a source of the field-effect transistor.

In the semiconductor storage device according to the embodiment of the present disclosure and the method of manufacturing a semiconductor storage device, the capacitor included in the semiconductor storage device is formed in the memory cell to have the three-dimensional structure that allows the capacitor to secure larger area. This allows, for example, the semiconductor storage device to increase the area of the capacitor without increasing the area of the memory cell. It is therefore possible to further increase the capacitance of the capacitor.

BRIEF DESCRIPTION OF DRAWING

FIG. 1 is a circuit diagram illustrating an equivalent circuit of a semiconductor storage device according to a first embodiment of the present disclosure.

FIG. 2 is a schematic diagram illustrating a planar configuration and a cross-sectional configuration of the semiconductor storage device according to the embodiment.

FIG. 3A is a schematic diagram describing a step of a method of manufacturing the semiconductor storage device according to the embodiment.

FIG. 3B is a schematic diagram describing a step of the method of manufacturing the semiconductor storage device according to the embodiment.

FIG. 3C is a schematic diagram describing a step of the method of manufacturing the semiconductor storage device according to the embodiment.

FIG. 3D is a schematic diagram describing a step of the method of manufacturing the semiconductor storage device according to the embodiment.

FIG. 3E is a schematic diagram describing a step of the method of manufacturing the semiconductor storage device according to the embodiment.

FIG. 3F is a schematic diagram describing a step of the method of manufacturing the semiconductor storage device according to the embodiment.

FIG. 3G is a schematic diagram describing a step of the method of manufacturing the semiconductor storage device according to the embodiment.

FIG. 3H is a schematic diagram describing a step of the method of manufacturing the semiconductor storage device according to the embodiment.

FIG. 4 is a schematic cross-sectional view of a cross section of the semiconductor storage device according to the embodiment taken along an active region.

FIG. 5 is a schematic diagram illustrating a planar configuration and a cross-sectional configuration of a semiconductor storage device according to a second embodiment of the present disclosure.

FIG. 6A is a schematic diagram describing a step of a method of manufacturing the semiconductor storage device according to the embodiment.

FIG. 6B is a schematic diagram describing a step of the method of manufacturing the semiconductor storage device according to the embodiment.

FIG. 6C is a schematic diagram describing a step of the method of manufacturing the semiconductor storage device according to the embodiment.

FIG. 6D is a schematic diagram describing a step of the method of manufacturing the semiconductor storage device according to the embodiment.

FIG. 6E is a schematic diagram describing a step of the method of manufacturing the semiconductor storage device according to the embodiment.

FIG. 6F is a schematic diagram describing a step of the method of manufacturing the semiconductor storage device according to the embodiment.

FIG. 6G is a schematic diagram describing a step of the method of manufacturing the semiconductor storage device according to the embodiment.

FIG. 7 is a schematic diagram illustrating a cross-sectional configuration of a semiconductor storage device according to a third embodiment of the present disclosure.

FIG. 8 is a schematic diagram illustrating a planar layout of the semiconductor storage device according to the embodiment.

FIG. 9A is a cross-sectional view describing a step of a method of manufacturing the semiconductor storage device according to the embodiment.

FIG. 9B is a cross-sectional view describing a step of the method of manufacturing the semiconductor storage device according to the embodiment.

FIG. 9C is a cross-sectional view describing a step of the method of manufacturing the semiconductor storage device according to the embodiment.

FIG. 9D is a cross-sectional view describing a step of the method of manufacturing the semiconductor storage device according to the embodiment.

FIG. 9E is a cross-sectional view describing a step of the method of manufacturing the semiconductor storage device according to the embodiment.

FIG. 9F is a cross-sectional view describing a step of the method of manufacturing the semiconductor storage device according to the embodiment.

FIG. 9G is a cross-sectional view describing a step of the method of manufacturing the semiconductor storage device according to the embodiment.

FIG. 9H is a cross-sectional view describing a step of the method of manufacturing the semiconductor storage device according to the embodiment.

FIG. 9I is a cross-sectional view describing a step of the method of manufacturing the semiconductor storage device according to the embodiment.

FIG. 10 is a schematic diagram illustrating a cross-sectional configuration of a semiconductor storage device according to a first modification example of the embodiment.

FIG. 11A is a cross-sectional view describing a step of a method of manufacturing the semiconductor storage device according to the modification example.

FIG. 11B is a cross-sectional view describing a step of the method of manufacturing the semiconductor storage device according to the modification example.

FIG. 11C is a cross-sectional view describing a step of the method of manufacturing the semiconductor storage device according to the modification example.

FIG. 11D is a cross-sectional view describing a step of the method of manufacturing the semiconductor storage device according to the modification example.

FIG. 11E is a cross-sectional view describing a step of the method of manufacturing the semiconductor storage device according to the modification example.

FIG. 11F is a cross-sectional view describing a step of the method of manufacturing the semiconductor storage device according to the modification example.

FIG. 12 is a schematic diagram illustrating a cross-sectional configuration of a semiconductor storage device according to a second modification example of the embodiment.

FIG. 13 is a schematic diagram illustrating a cross-sectional configuration of a semiconductor storage device according to a third modification example of the embodiment.

FIG. 14 is a schematic diagram illustrating a planar configuration and a cross-sectional configuration of a semiconductor storage device according to a fourth embodiment of the present disclosure.

FIG. 15A is a schematic diagram describing a step of a method of manufacturing the semiconductor storage device according to the embodiment.

FIG. 15B is a schematic diagram describing a step of the method of manufacturing the semiconductor storage device according to the embodiment.

FIG. 15C is a schematic diagram describing a step of the method of manufacturing the semiconductor storage device according to the embodiment.

FIG. 15D is a schematic diagram describing a step of the method of manufacturing the semiconductor storage device according to the embodiment.

FIG. 15E is a schematic diagram describing a step of the method of manufacturing the semiconductor storage device according to the embodiment.

FIG. 15F is a schematic diagram describing a step of the method of manufacturing the semiconductor storage device according to the embodiment.

FIG. 15G is a schematic diagram describing a step of the method of manufacturing the semiconductor storage device according to the embodiment.

FIG. 15H is a schematic diagram describing a step of the method of manufacturing the semiconductor storage device according to the embodiment.

FIG. 15I is a schematic diagram describing a step of the method of manufacturing the semiconductor storage device according to the embodiment.

FIG. 16 is a schematic cross-sectional view of a cross section of the semiconductor storage device according to the embodiment taken along an active region.

FIG. 17 is a schematic diagram illustrating a planar configuration and a cross-sectional configuration of a semiconductor storage device according to a fifth embodiment of the present disclosure.

FIG. 18A is a schematic diagram describing a step of a method of manufacturing the semiconductor storage device according to the embodiment.

FIG. 18B is a schematic diagram describing a step of the method of manufacturing the semiconductor storage device according to the embodiment.

FIG. 18C is a schematic diagram describing a step of the method of manufacturing the semiconductor storage device according to the embodiment.

FIG. 19 is a schematic diagram illustrating a planar configuration and a cross-sectional configuration of a semiconductor storage device according to a sixth embodiment of the present disclosure.

FIG. 20A is a schematic diagram describing a step of a method of manufacturing the semiconductor storage device according to the embodiment.

FIG. 20B is a schematic diagram describing a step of the method of manufacturing the semiconductor storage device according to the embodiment.

FIG. 21 is a schematic diagram illustrating a planar configuration and a cross-sectional configuration of a semiconductor storage device according to a seventh embodiment of the present disclosure.

FIG. 22A is a schematic diagram describing a step of a method of manufacturing the semiconductor storage device according to the embodiment.

FIG. 22B is a schematic diagram describing a step of the method of manufacturing the semiconductor storage device according to the embodiment.

FIG. 22C is a schematic diagram describing a step of the method of manufacturing the semiconductor storage device according to the embodiment.

FIG. 22D is a schematic diagram describing a step of the method of manufacturing the semiconductor storage device according to the embodiment.

MODES FOR CARRYING OUT THE INVENTION

The following describes embodiments of the present disclosure in detail with reference to the drawings. The embodiments described below are specific examples of the present disclosure. The technology according to the present disclosure should not be limited to the following modes. In addition, the disposition, dimensions, dimensional ratios, and the like of the respective components according to the present disclosure are not limited to the modes illustrated in the drawings.

It is to be noted that description is given in the following order.

1. First Embodiment
1.1. Overview
1.2. Configuration Example
1.3. Manufacturing Method
1.4. Operation Example
2. Second Embodiment
2.1. Configuration Example
2.2. Manufacturing Method
3. Third Embodiment
3.1. Configuration Example
3.2. Manufacturing Method
3.3. Modification Examples
4. Fourth Embodiment
4.1. Configuration Example
4.2. Manufacturing Method
4.3. Operation Example
5. Fifth Embodiment
5.1. Configuration Example
5.2. Manufacturing Method
6. Sixth Embodiment
6.1. Configuration Example
6.2. Manufacturing Method
7. Seventh Embodiment
7.1. Configuration Example
7.2. Manufacturing Method

1. First Embodiment

1.1. Overview

First, an overview of a semiconductor storage device according to a first embodiment of the present disclosure is described with reference to FIG. 1. FIG. 1 is a circuit diagram illustrating an equivalent circuit of the semiconductor storage device according to the present embodiment.

As illustrated in FIG. 1, a semiconductor storage device 10 according to the present embodiment includes a capacitor 11 and a transistor 21. The capacitor 11 stores information. The transistor 21 controls the selection and non-selection of the capacitor 11.

The capacitor 11 is a ferroelectric capacitor including a pair of electrodes and a ferroelectric film sandwiched between the pair of electrodes. The capacitor 11 is able to store 1-bit information by using the direction of the remanent polarization of the ferroelectric film. The capacitor 11 is electrically coupled to a source line SL at one of the pair of electrodes and electrically coupled to the source of the transistor 21 at the other of the pair of electrodes.

The transistor 21 is a field-effect transistor that controls the application of a voltage to the capacitor 11. The transistor 21 is electrically coupled to the other electrode of the capacitor 11 at the source and electrically coupled to a bit line BL at the drain. In addition, the transistor 21 is electrically coupled to a word line WL at the gate. The application of a voltage from the word line WL makes it possible to control the state of the channel.

In a case where information is written in the capacitor 11, a voltage is first applied to the word line WL in semiconductor storage device 10. This causes the channel of the transistor 21 to transition to the on state. After that, the source line SL and the bit line BL each have a potential applied thereto. This applies the electric field corresponding to the information to be written to the ferroelectric film of the capacitor 11. This allows the semiconductor storage device 10 to write information in the capacitor 11 by controlling the direction of the remanent polarization of the ferroelectric film of the capacitor 11 with an external electric field.

In contrast, in a case where information is read out from the capacitor 11, a voltage is first applied to the word line WL in semiconductor storage device 10. This causes the channel of the transistor 21 to transition to the on state. After that, the source line SL and the bit line BL each have a predetermined potential applied thereto. This causes the polarization direction of the ferroelectric film of the capacitor 11 to transition to a predetermined direction. In this case, the magnitude of a current flowing into the capacitor 11 in a case of transition changes depending on the polarization direction of the ferroelectric film before the transition. The semiconductor storage device 10 is thus able to read out the information stored in the capacitor 11 by measuring the magnitude of the current flowing into the capacitor 11.

This allows the semiconductor storage device 10 according to the present embodiment to operate as FeRAM (Ferroelectric Random Access Memory) that stores information in the capacitor 11 including a ferroelectric film.

The semiconductor storage device 10 according to the present embodiment is provided with the capacitor 11 in an opening section that is formed to be deeper. Specifically, in the semiconductor storage device 10, an opening section is formed from a layer upper than a first wiring layer provided on an interlayer insulating film having the transistor 21 buried therein. The capacitor 11 is provided in the opening section. This allows the semiconductor storage device 10 to further increase the capacitance of the capacitor 11. It is therefore possible to obtain a signal having a sufficient margin for operation.

1.2. Configuration Example

Subsequently, a specific configuration example of the semiconductor storage device 10 according to the present embodiment is described with reference to FIG. 2. FIG. 2 is a schematic diagram illustrating a planar configuration and a cross-sectional configuration of the semiconductor storage device 10 according to the present embodiment.

It is to be noted that the upper left plan view of FIG. 2 omits a planarization film 200 and a first insulating layer 300 to clarify the disposition of the respective components. The planarization film 200 and the first insulating layer 300 are formed to extend over the whole surface of the semiconductor substrate 100. Each of the cross-sectional views of FIG. 2 illustrates a cross section taken along the A-A line, the B-B line, or the C-C line illustrated in the upper left plan view.

In addition, the following describes one of a "p type" or an "n type" as a "first electrical conduction type" and describes the other of the "p type" or the "n type" different from the "first electrical conduction type" as a "second electrical conduction type".

As illustrated in FIG. 2, the semiconductor storage device 10 is provided on the semiconductor substrate 100. The semiconductor storage device 10 is a semiconductor memory that is able to store a large volume of information by having a large number of memory cells disposed on the semiconductor substrate 100.

The capacitor 11 is provided inside an opening section 110 formed on a source or drain region 151 to extend through the planarization film 200 and the first insulating layer 300. Specifically, the capacitor 11 includes a lower electrode 111, a ferroelectric film 113, and an upper electrode 115. The lower electrode 111 is provided along the inside of the opening section 110. The ferroelectric film 113 is provided on the lower electrode 111 along the opening section 110. The upper electrode 115 is provided on the ferroelectric film 113 to fill the opening section 110. The lower electrode 111 is electrically coupled to the source or drain region 151 (e.g., source) of the transistor 21. The upper electrode 115 is electrically coupled to a second wiring layer that is not illustrated. The second wiring layer functions as the source line SL.

The transistor 21 includes a gate insulating film 140, a gate electrode 130, and a source or drain region 151. The gate insulating film 140 is provided on the semiconductor substrate 100. The gate electrode 130 is provided on the gate insulating film 140. The source or drain region 151 is provided in an active region 150 of the semiconductor substrate 100. One (e.g., source) of the source or drain region 151 is coupled to the lower electrode 111 to be electrically coupled to the capacitor 11. The other (e.g., drain) of the source or drain region 151 is electrically coupled to a first wiring layer 310 through a contact 210. The first wiring layer 310 functions as the bit line BL. The gate electrode 130 is provided over the plurality of active regions 150 across the element isolation layer 105. This causes the gate electrode 130 to function as the word line WL.

In the semiconductor storage device 10, the first wiring layer 310 is provided to extend in a first direction serving as the in-plane direction of the semiconductor substrate 100. The gate electrode 130 is provided to extend in a second direction orthogonal to the first direction. In addition, the active region 150 is provided in the shape of a strip to extend in a third direction that obliquely crosses both the first direction and the second direction. This makes it possible to efficiently dispose the capacitors 11 and the transistors 21 in the semiconductor storage device 10. It is thus possible to suppress an increase in the occupied area in the semiconductor storage device 10.

Here, the structure in which a capacitor is provided by burying a dielectric and an electrode in an opening provided in the planarization film 200, the semiconductor substrate 100, or the like includes stacked cylinder-shaped DRAM (Dynamic Random Access Memory). DRAM that stores information by using electric charge accumulated in a capacitor is, however, requested to have, for example, a capacitor capacitance of about 20 fF for a bit line having a capacitance of 100 fF to read out the stored information with sufficient accuracy.

For example, in a case where a dielectric used for a capacitor has a relative dielectric constant of 25 and a dielectric film has a width of 60 nm and a film thickness of 5 nm, an opening for forming a capacitor having a capacitance of 20 fF has to have a depth of about 8 μm. The opening having such depth is extremely difficult to process. This makes the miniaturization and high integration of DRAM difficult.

The semiconductor storage device 10 according to the present embodiment functions as FeRAM that stores information by using the remanent polarization of a ferroelectric. FeRAM has an operating principle different from that of DRAM. This makes it possible to read out information with sufficient accuracy by forming the capacitor 11 in an opening having a depth of about 200 nm as long as a ferroelectric has a remanent polarization of about 25 $\mu C/cm^2$, for example, even in a case where a bit line has a capacitance of 100 fF. It is thus possible to advance the miniaturization and high integration of the semiconductor storage device 10 according to the present embodiment more easily.

The following describes each of components of the semiconductor storage device 10 more specifically.

The semiconductor substrate 100 includes a semiconductor material. The semiconductor substrate 100 is a substrate that on which the capacitor 11 and the transistor 21 are formed. The semiconductor substrate 100 may be a silicon substrate. Alternatively, the semiconductor substrate 100 may be an SOI (Silicon On Insulator) substrate having an insulating film such as $SiO_2$ inserted into a silicon substrate. In addition, the semiconductor substrate 100 may be a substrate including another element semiconductor such as germanium. Alternatively, the semiconductor substrate 100 may be a substrate including a compound semiconductor such as gallium arsenide (GaAs), gallium nitride (GaN), or silicon carbide (SiC).

The element isolation layer 105 includes an insulating material and electrically isolates the respective transistors 21 provided on the semiconductor substrate 100 from each other. The element isolation layer 105 is provided in strip-shaped regions isolated from each other to extend in the third direction (e.g., the direction from the upper left to the lower right in a case where FIG. 2 is viewed face to face). It is to be noted that the third direction is a direction which obliquely crosses both the first direction (e.g., the left/right direction in a case where FIG. 2 is viewed face to face) and the second direction (e.g., the up/down direction in a case where FIG. 2 is viewed face to face). The first wiring layer 310 extends in the first direction. The gate electrode 130 extends in the second direction. For example, the element isolation layer 105 may include an insulating material such as silicon oxide (SiOx), silicon nitride (SiNx), or silicon oxynitride (SiON).

For example, it is possible to form the element isolation layer 105 by removing a portion of the semiconductor substrate 100 in a predetermined region by etching or the like with an STI (Shallow Trench Isolation) method and then filling an opening formed by etching or the like with silicon oxide ($SiO_x$). Alternatively, the element isolation layer 105 may be formed by thermally oxidizing the semiconductor substrate 100 in a predetermined region with a LOCOS (LOCal Oxidation of Silicon) method.

The strip-shaped regions isolated from each other by the element isolation layer 105 each function as the active region 150 in which the transistor 21 is provided. For example, an impurity of the first electrical conduction type (e.g., a p-type impurity such as boron (B) or aluminum (Al)) is introduced into the active region 150.

The element isolation layer 105 and the active region 150 may be each provided to have a strip shape that extends in the third direction as illustrated in FIG. 2. This makes it possible to efficiently dispose the capacitors 11 and the transistors 21 in the semiconductor storage device 10. It is thus possible to suppress an increase in the occupied area in the semiconductor storage device 10.

The gate insulating film 140 includes an insulating material and is provided on the active region 150 of the semiconductor substrate 100. The gate insulating film 140 may include an insulating material known as a gate insulating film of a field-effect transistor. For example, the gate insulating film 140 may be formed by using an oxide such as silicon oxide ($SiO_x$).

The gate electrode 130 includes an electrically conductive material and is provided on the gate insulating film 140. Specifically, the plurality of gate electrodes 130 is provided in the second direction at a predetermined interval. The second direction is orthogonal to the first direction in which the first wiring layer 310 extends. The plurality of gate electrodes 130 is provided to extend in the first direction that obliquely crosses the third direction in which the element isolation layer 105 extends. Each of the gate electrodes 130 is provided to exceed the element isolation layer 105 and extend over the plurality of active regions 150. This causes the gate electrode 130 to function as the word line WL that electrically couples the gates of the transistors 21 of the respective memory cells.

For example, the gate electrode 130 may be formed by using polysilicon or the like. Alternatively, the gate electrode 130 may be formed by using metal, alloy, a metal compound, or an alloy of metal (such as Ni) and polysilicon (so-called silicide). Specifically, the gate electrode 130 may be formed to have a stacked structure of a polysilicon layer and a metal layer including TiN or TaN provided on the gate insulating film 140. Such a stacked structure allows the gate electrode 130 to have reduced wiring resistance as compared with a case where the gate electrode 130 is formed by using only a polysilicon layer.

The source or drain region 151 is a region of the second electrical conduction type formed in the semiconductor substrate 100. Specifically, the respective source or drain regions 151 are provided in the active regions 150 across the gate electrodes 130. Each of the active regions 150 extends in the third direction. The source side of the source or drain region 151 is electrically coupled to the lower electrode 111. The drain side of the source or drain region 151 is electrically coupled to the first wiring layer 310 through the contact 210. The first wiring layer 310 serves as the bit line BL.

For example, it is possible to form the source or drain region 151 by introducing an impurity of the second electrical conduction type (e.g., an n-type impurity such as phosphorus (P) or arsenic (As)) into the semiconductor substrate 100 in the active region 150. It is to be noted that an LDD (Lightly-Doped Drain) region may be formed in the semiconductor substrate 100 between the source or drain region 151 and the gate electrode 130. The LDD region has a lower concentration of impurities of the second electrical conduction type than that of the source or drain region 151.

A side wall insulating film 132 includes an insulating material and is provided on a side surface of the gate electrode 130 as a side wall. It is possible to form the side wall insulating film 132 by uniformly depositing an insulating film in a region including the gate electrode 130 and then performing vertical anisotropic etching on the insulating film. For example, the side wall insulating film 132 may be formed as a single layer or a plurality of layers by using an insulating oxynitride such as silicon oxide ($SiO_x$), silicon nitride ($SiN_x$), or silicon oxynitride (SiON).

The side wall insulating film 132 makes it possible to control the positional relationship between the gate electrode 130 and the source or drain region 151 in a self-aligning manner by blocking an impurity of the second electrical conduction type in a case where the impurity of the second electrical conduction type is introduced into the semiconductor substrate 100. In addition, the side wall insulating film 132 makes it possible to gradually control the introduction of an impurity of the second electrical conduction type into the semiconductor substrate 100. This makes it possible to form the LDD region described above between the source or drain region 151 and the gate electrode 130 in a self-aligning manner.

There is provided a cap layer 131 on the gate electrode 130. The cap layer 131 functions as the word line WL. The word line WL electrically couples the gate electrodes 130 of the respective memory cells. For example, the cap layer 131 may be formed by using metal or a metal compound. In addition, as described for the gate electrode 130 described above, the cap layer 131 may include metal, alloy, or a metal compound provided on polysilicon or an alloy (so-called silicide) of metal (such as Ni) and polysilicon. In other words, the gate electrode 130 and the cap layer 131 may each include a metal layer that is provided on the gate insulating film 140 and includes TiN or TaN and may have a stacked structure of a polysilicon layer (gate electrode 130) and a metal layer (cap layer 131) including TiN or TaN. Such a stacked structure allows the semiconductor storage device 10 to have wiring resistance more reduced.

There is provided a contact region 152 on the surface of the semiconductor substrate 100 in the source or drain region 151. The contact region 152 makes it possible to reduce the contact resistance between the source or drain region 151 and the lower electrode 111 or the contact 210. Specifically, the contact region 152 may include an alloy (so-called silicide) of metal such as Ni and silicon.

The planarization film 200 includes an insulating material and is provided to extend over the whole surface of the semiconductor substrate 100 with the transistor 21 buried therein. For example, the planarization film 200 may include an insulating oxynitride such as silicon oxide ($SiO_x$), silicon nitride ($SiN_x$), or silicon oxynitride (SiON).

Although not illustrated in FIG. 2, there may be provided a liner layer over the whole surfaces of the semiconductor substrate 100, the side wall insulating film 132, and the cap layer 131. The liner layer includes an insulating material. The linear layer makes it possible to provide high etching selectivity between the linear layer and the planarization film 200 in a step of forming an opening for providing the capacitor 11 or the contact 210 in the planarization film 200. This allows the linear layer to prevent etching from proceeding up to the semiconductor substrate 100 in an etching step. The liner layer may be formed by using an insulating oxynitride such as silicon oxide (SiOx), silicon nitride (SiNx), or silicon oxynitride (SiON). For example, in a case where the planarization film 200 includes silicon oxide (SiOx), the liner layer may include silicon nitride (SiNx).

In addition, the liner layer may be configured as a layer that applies compression stress or tensile stress to the semiconductor substrate 100 below the gate insulating film 140. In such a case, the liner layer makes it possible to control the carrier mobility of a channel formed in the semiconductor substrate 100 by the stress effects.

The opening section 110 is provided to extend through the planarization film 200 and the first insulating layer 300 from a layer upper than the first wiring layer 310 to expose the source or drain region 151. Providing the opening section 110 from an upper layer allows the semiconductor storage device 10 to further increase the area of the capacitor 11 having a cylinder-shaped structure. The capacitor 11 is provided in the opening section 110. This allows the semiconductor storage device 10 to further increase the capacitance of the capacitor 11 that is provided in the opening section 110.

The lower electrode 111 includes an electrically conductive material and is provided along the inside of the opening section 110 formed in the planarization film 200 and the first insulating layer 300. Specifically, the opening section 110 is provided to expose one of the source or drain region 151. The lower electrode 111 is provided on one of the source or drain region 151 exposed by the opening section 110. This allows the lower electrode 111 to be electrically coupled to the source side of the source or drain region 151. In addition, the lower electrode 111 is provided to retract (be recessed) from the opening surface of the opening section 110 provided in the first insulating layer 300. This allows the capacitor 11 to prevent the lower electrode 111 from being short-circuited with the upper electrode 115 or the like.

For example, the lower electrode 111 may include metal such as titanium (Ti) or tungsten (W). Alternatively, the lower electrode 111 may include a metal compound such as titanium nitride (TiN) or tantalum nitride (TaN). In addition, the lower electrode 111 may include ruthenium (Ru), ruthenium oxide (RuO2), or the like. It is possible to form the lower electrode 111 by using ALD (Atomic Layer Deposition), CVD (Chemical Vapor Deposition), sputtering in which IMP (Ionized Metal Plasma) is used, or the like.

The ferroelectric film 113 includes a ferroelectric material and is provided on the lower electrode 111 along the inside of the opening section 110 provided in the planarization film 200 and the first insulating layer 300. The ferroelectric film 113 is formed by using a ferroelectric material that spontaneously polarizes and allows the direction of the remanent polarization to be controlled by an external electric field.

For example, the ferroelectric film 113 may be formed by using a ferroelectric material such as lead zirconate titanate ($Pb(Zr,Ti)O_3$: PZT) or strontium bismuth tantalate ($SrBi_2Ta_2O_9$: SBT) having a perebskite structure. In addition, the ferroelectric film 113 may be a ferroelectric film in which a film including a high dielectric material such as $HfO_x$, $ZrO_x$, or $HfZrO_x$ is altered by heat treatment or the like. Alternatively, the ferroelectric film 113 may be a ferroelectric film that is altered by introducing an atom such as lanthanum (La), silicon (Si), or gadolinium (Gd) to the above-described film including a high dielectric material. Further, the ferroelectric film 113 may be formed as a single layer or a plurality of layers. For example, the ferroelectric film 113 may be a single layer film including a ferroelectric material such as $HfO_x$. It is possible to form the ferroelectric film 113 by using ALD (Atomic Layer Deposition), CVD (Chemical Vapor Deposition), or the like.

The upper electrode 115 includes an electrically conductive material and is provided on the ferroelectric film 113 to fill the opening section 110 formed in the planarization film 200 and the first insulating layer 300. For example, the upper electrode 115 may include metal such as titanium (Ti) or tungsten (W). Alternatively, the upper electrode 115 may include a metal compound such as titanium nitride (TiN) or tantalum nitride (TaN). In addition, the upper electrode 115 may include ruthenium (Ru), ruthenium oxide (RuO2), or the like. It is possible to form the upper electrode 115 by using ALD (Atomic Layer Deposition), CVD (Chemical Vapor Deposition), or the like.

The capacitor 11 includes the above-described ferroelectric film 113 sandwiched by the lower electrode 111 and the upper electrode 115. This allows the semiconductor storage device 10 to store information by using the polarization direction of the ferroelectric film 113 of the capacitor 11.

The contact 210 includes an electrically conductive material and is provided to penetrate the planarization film 200. Specifically, the contact 210 is provided on the other of the source or drain region 151. The contact 210 electrically couples the drain side of the source or drain region 151 and the first wiring layer 310 serving as the bit line BL.

For example, the contact 210 may include metal such as titanium (Ti) or tungsten (W). Alternatively, the contact 210 may include a metal compound such as titanium nitride (TiN) or tantalum nitride (TaN). The contact 210 may be formed as a single layer or a stacked body of a plurality of layers. For example, the contact 210 may be formed as a stacked body of Ti or TiN and W.

The first wiring layer 310 includes an electrically conductive material and is provided on the planarization film 200. Specifically, the first wiring layer 310 is provided on the contact 210 as a wiring line extending in the first direction orthogonal to the second direction in which the gate electrode 130 (word line WL) extends. The first wiring layer 310 is electrically coupled to the drain side of the source or drain region 151 through the contact 210. This causes the first wiring layer 310 to function as the bit line BL. The first wiring layer 310 may include, for example, a metal material such as aluminum (Al) and may have a damascene structure or a dual damascene structure of copper (Cu).

The first insulating layer 300 has the first wiring layer 310 buried therein and is provided on the planarization film 200 to extend over the whole surface of the semiconductor substrate 100. The first insulating layer 300 may be formed by using, for example, an insulating oxynitride such as silicon oxide ($SiO_x$), silicon nitride ($SiN_x$), or silicon oxynitride (SiON).

A via contact 311 includes an electrically conductive material and is provided on the first wiring layer 310. Specifically, the via contact 311 is provided to penetrate the first insulating layer 300. The via contact 311 electrically couples the first wiring layer 310 that is a lower layer and an upper wiring layer 312 that is an upper layer. The via contact 311 may include a metal material such as aluminum (Al) and may have a damascene structure of copper (Cu).

The upper wiring layer 312 includes an electrically conductive material and is provided on the via contact 311. The upper wiring layer 312 may include, for example, a metal material such as aluminum (Al) and may have a damascene structure of copper (Cu). The upper wiring layer 312 may be formed at the same time as a wiring line of another circuit provided in a logic region or the like. Alternatively, the upper wiring layer 312 may be formed to be shared with a wiring line of another circuit provided in a logic region or the like.

It is to be noted that the upper electrode 115 of the capacitor 11 is electrically coupled to the second wiring layer that is not illustrated. The second wiring layer includes an electrically conductive material and is provided in a layer that is still upper than the first insulating layer 300 and the upper wiring layer 312. Specifically, the second wiring layer is provided on the upper electrode 115 of the capacitor 11 as a wiring line extending in the first direction as with the first wiring layer 310. The second wiring layer is electrically coupled to the upper electrode 115. This causes the second wiring layer to function as the source line SL. The second wiring layer may include, for example, a metal material such as aluminum (Al) and may have a damascene structure or a dual damascene structure of copper (Cu).

According to the structure described above, the semiconductor storage device 10 is provided with the capacitor 11 in the opening section 110 that extends through the planarization film 200 and the first insulating layer 300. The capacitor 11 is a ferroelectric capacitor. This allows the semiconductor storage device 10 to increase the area of the capacitor 11. It is thus possible to increase the capacitance of the capacitor 11. This allows the semiconductor storage device 10 to obtain a signal having a sufficient margin for operation.

In addition, the respective extending directions are defined for the active region 150, the word line WL, the source line SL, and the bit line BL. This makes it possible to dispose the transistors 21 and the capacitors 11 more efficiently in the semiconductor storage device 10. This allows the semiconductor storage device 10 to suppress an increase in the area occupied by the memory cells.

1.3. Manufacturing Method

Subsequently, a method of manufacturing the semiconductor storage device 10 according to the present embodiment is described with reference to FIGS. 3A, 3B, 3C, 3D, 3E, 3F, 3G, and 3H. Each of FIGS. 3A, 3B, 3C, 3D, 3E, 3F 3G, and 3H is a schematic diagram describing a step of the method of manufacturing the semiconductor storage device 10 according to the present embodiment.

It is to be noted that FIGS. 3A, 3B, 3C, 3D, 3E, 3F, 3G, and 3H also omit the description of the layers provided to extend over the whole surface of the semiconductor substrate 100 as with FIG. 2. In addition, the respective cross-sectional views of FIGS. 3A, 3B, 3C, 3D, 3E, 3F, 3G, and 3H illustrate cross sections taken along the A-A lines, the B-B lines, or the C-C lines illustrated in the upper left plan views.

First, as illustrated in FIG. 3A, the element isolation layer 105 is formed in the semiconductor substrate 100 and the active region 150 is formed in which the transistor 21 is formed in a subsequent step.

Specifically, a $SiO_2$ film is formed on the semiconductor substrate 100 including Si by dry oxidation or the like. Further, a $Si_3N_4$ film is formed by low-pressure CVD or the like. Subsequently, a resist layer patterned to protect a region in which the active region 150 is provided is formed on the $Si_3N_4$ film. After that, the $SiO_2$ film, the $Si_3N_4$ film, and the semiconductor substrate 100 are etched to a depth of 350 nm to 400 nm. Next, $SiO_2$ is deposited to have a film thickness of 650 nm to 700 nm and fills an opening formed by etching. This makes it possible to form the element isolation layer 105. For example, high-density plasma CVD may be used to deposit $SiO_2$. The high-density plasma CVD exhibits favorable step difference coverage and allows a dense $SiO_2$ film to be formed.

Subsequently, the excessively deposited $SiO_2$ film is removed by using CMP (Chemical Mechanical Polishing) or the like, thereby planarizing the surface of the semiconductor substrate 100. It is sufficient if the $SiO_2$ film is removed by CMP, for example, until the $Si_3N_4$ film is exposed.

Further, hot phosphoric acid or the like is used to remove the $Si_3N_4$ film. It is to be noted that it is also possible to anneal the semiconductor substrate 100 in an $N_2$, $O_2$ or $H_2/O_2$ environment before removing the $Si_3N_4$ film to make the $SiO_2$ film of the element isolation layer 105 a denser film or round the corners of the active region 150. Next, the surface of the region of the semiconductor substrate 100 corresponding to the active region 150 is oxidized to a thickness of about 10 nm to form an oxide film 100A. After that, the semiconductor substrate 100 of the active region 150 is converted into a well of the first electrical conduction type by ion-implanting an impurity of the first electrical conduction type (e.g., boron (B) or the like).

Next, as illustrated in FIG. 3B, the gate insulating film 140 is deposited. After that, the gate electrode 130 is formed on the gate insulating film 140.

Specifically, the oxide film 100A that covers the surface of the semiconductor substrate 100 is first peeled off by using a hydrofluoric acid solution or the like. After that, the gate insulating film 140 including $SiO_2$ is formed on the semiconductor substrate 100 to have a film thickness of 1.5 nm to 10 nm by dry oxidization that uses $O_2$ at 700° C. or RTA (Rapid Thermal Anneal) processing. It is to be noted that a mixed gas of $H_2/O_2$, $N_2O$, or NO may be used as a gas used for the dry oxidation in addition to $O_2$. In addition, the use of plasma nitridation to form the gate insulating film 140 also makes it possible to dope the $SiO_2$ film with nitrogen.

Next, polysilicon is deposited to have a film thickness of 50 nm to 150 nm by using low-pressure CVD in which a $SiH_4$ gas is used as a raw material gas and the deposition temperature is set at 580° C. to 620° C. After that, anisotropic etching is performed on the deposited polysilicon with a patterned resist used as a mask, thereby forming the gate electrode 130. It is possible to use, for example, a HBr-based gas or a Cl-based gas for the anisotropic etching. For example, the gate electrode 130 may be formed in a 40-nm node by setting a gate width of about 40 nm to 50 nm.

It is to be noted that the gate electrode 130 functions as the word line WL. In addition, the gate electrode 130 may be formed at the same time as the gate electrode of another transistor provided in a logic region or the like. Alternatively, the gate electrode 130 may be formed to be shared with the gate electrode of another transistor provided in a logic region or the like.

Next, as illustrated in FIG. 3C, the side wall insulating films 132 are formed on both side surfaces of the gate electrode 130 and the source or drain region 151 is formed in the active region 150 of the semiconductor substrate 100.

Specifically, arsenic (As), which is an impurity of the second electrical conduction type, is ion-implanted on both sides of the gate electrode 130 at a concentration of $5\times10^{13}$ ions/$cm^2$ to $20\times10^{13}$ ions/$cm^2$ at 5 keV to 20 keV to form an LDD region. The formation of an LDD region makes it possible to suppress a short channel effect. This makes it possible to suppress characteristic variations of the transistor 21. It is to be noted that it is also possible to use phosphorus (P) as an impurity of the second electrical conduction type.

Next, $SiO_2$ is deposited to have a film thickness of 10 nm to 30 nm by plasma CVD. After that, $Si_3N_4$ is deposited to have a film thickness of 30 nm to 50 nm by plasma CVD to form an insulating film for a side wall. After that, anisotropic etching is performed on the insulating film for a side wall to form the side wall insulating film 132 on each of both side surfaces of the gate electrode 130.

After that, arsenic (As), which is an impurity of the second electrical conduction type, is ion-implanted at a concentration of $1\times10^{15}$ ions/$cm^2$ to $2\times10^{15}$ ions/$cm^2$ at 20 keV to 50 keV and the impurity of the second electrical conduction type is introduced to both sides of the gate electrode 130. This forms the source or drain regions 151 in the active regions 150 on both sides of the gate electrode 130. Further, RTA (Rapid Thermal Annealing) is performed at 1000° C. for 5 seconds to activate the ion-implanted impurity. This forms the transistor 21. It is to be noted that it is also possible to activate the impurity by spike RTA to accelerate the activation of the introduced impurity and suppress the diffusion of the impurity.

Further, Ni is deposited over the whole surface of the semiconductor substrate 100 to have a film thickness of 6 nm to 8 nm by sputtering or the like. After that, RTA is performed at 300° C. to 450° C. for 10 seconds to 60 seconds to silicify (NiSi) Ni on Si. The Ni that has not reacted on the $SiO_2$ is removed by using $H_2SO_4/H_2O_2$. This forms the cap layer 131 and the contact region 152 each including NiSi having low resistance on the gate electrode 130 and the source or drain region 151. It is to be noted that the cap layer 131 and the contact region 152 may be each formed by depositing Co or NiPt in place of Ni and using $CoSi_2$ or NiPtSi. The temperature of RTA in a case where Co or NiPt is deposited may be set as appropriate.

Subsequently, as illustrated in FIG. 3D, to bury the transistor 21, the planarization film 200 is formed that extends over the whole surface of the semiconductor substrate 100.

Specifically, $SiO_2$ is deposited on the semiconductor substrate 100 by using CVD or the like to have a film thickness of 100 nm to 500 nm and then planarized in a CMP method to form the planarization film 200.

It is to be noted that, although not illustrated, a linear layer including $SiN_x$ may be formed on the semiconductor substrate 100 over the whole surface of the semiconductor substrate 100 before the formation of the planarization film 200. For example, the liner layer is formed by depositing $SiN_x$ to have a film thickness of 10 nm to 50 nm with plasma CVD. In addition, the liner layer may be formed as a layer that applies compression stress or tensile stress to the semiconductor substrate 100. The formation of the liner layer makes it possible to etch the planarization film 200 under the condition that the etching selectivity between the planarization film 200 and the liner layer becomes high in a subsequent step. This makes it possible to perform etching with higher controllability.

Next, as illustrate in FIG. 3E, the other of the source or drain region 151 and the contact 210 that is electrically coupled to each of the gate electrodes 130 are formed. After that, the first wiring layer 310 is formed on the contact 210.

Specifically, the planarization film 200 is etched to form an opening on the other of the source or drain region 151. Subsequently, Ti and TiN are deposited on the formed opening by CVD or the like. Further, W is deposited. After that, planarization is performed in a CMP method. This makes it possible to form the contact 210 on the other of the source or drain region 151. It is to be noted that Ti and TiN may be deposited in a sputtering method or the like in which IMP (Ion Metal Plasma) is used. In addition, planarization may be performed by using full-surface etch-back in place of a CMP method.

It is to be noted that it is possible to form a contact which is electrically coupled to the gate electrode 130 in a similar step. Further, these contacts 210 may be formed at the same time as the contact of another transistor that is provided in a logic region or the like.

After that, the first wiring layer 310 is formed on the planarization film 200 by using Al or the like as a wiring material. The first wiring layer 310 is extended on the contact 210 in the first direction. This causes the first wiring layer 310 to function as the bit line BL. It is to be noted that the first wiring layer 310 may be formed by using a damascene structure with Cu used as a wiring material.

Subsequently, as illustrated in FIG. 3F, the first insulating layer 300 is formed to bury the first wiring layer 310. After that, the opening section 110 is formed that extends through the planarization film 200 and the first insulating layer 300 and exposes the source or drain region 151.

Specifically, $SiO_2$ is deposited on the planarization film 200 to have a film thickness of 100 nm to 500 nm and bury the first wiring layer 310 by using CVD or the like and then planarized in a CMP method. This forms the first insulating layer 300. The first insulating layer 300 may be formed by using a low dielectric constant material (e.g., SiOC including carbon) having a lower dielectric constant than that of $SiO_2$. It is to be noted that, although not illustrated, a linear layer including $SiN_x$ may be formed on the planarization film 200 before the formation of the first insulating layer 300. For example, the liner layer may be formed by depositing $SiN_x$ to have a film thickness of 10 nm to 50 nm with plasma CVD.

Next, the opening section 110 is formed by anisotropic etching in the planarization film 200 and the first insulating layer 300 on the other of the source or drain region 151. In the anisotropic etching, a resist patterned by lithography is used as a mask. It is possible to form the opening section 110 having, for example, a width of 60 nm. In this case, the opening section 110 having an aspect ratio of about 20 or less makes it is possible to perform etching to form the opening section 110 and perform deposition in a subsequent step to fill the opening section 110 without raising any issue. It is possible to perform anisotropic etching by using, for example, a fluorocarbon-based gas. In addition, it is possible to stop etching with favorable controllability by using the linear layer described above.

Next, as illustrated in FIG. 3G, the capacitor 11 is formed in the opening section 110.

Specifically, first, ALD, CVD, or sputtering in which IMP is used is used to deposit TiN having a film thickness of 5 nm to 10 nm on the source or drain region 151 along the inner shape of the opening section 110, thereby forming the lower electrode 111. After that, a resist is applied onto the deposited lower electrode 111 and etch-back is then performed under the condition that the resist and the lower electrode 111 have substantially the same selectivity. This retracts the lower electrode 111 from the opening surface of the opening section 110. This makes it possible to form a recess by retracting the shoulders of the lower electrode 111 while leaving the lower electrode 111 on the bottom and the side surfaces of the opening section 110.

Next, hafnium oxide ($HfO_x$), which is a high dielectric material, is deposited on the lower electrode 111 along the inner shape of the opening section 110 by CVD or ALD to have a film thickness of 3 nm to 10 nm, thereby forming the ferroelectric film 113. It is to be noted that the hafnium oxide ($HfO_x$), which is a high dielectric material, is converted to a ferroelectric material by being subjected to annealing treatment in a subsequent step.

It is to be noted that it is also possible to use a high dielectric material such as zirconium oxide ($ZrO_x$) or hafnium zirconium oxide ($HfZrO_x$) in place of hafnium oxide. In addition, it is also possible to convert these high dielectric materials into ferroelectric materials by doping the high dielectric materials with lanthanum (La), silicon (Si), gadolinium (Gd), or the like.

After that, TiN is deposited on the ferroelectric film 113 by using CVD, ALD, sputtering, or the like to have a film thickness of 5 nm to 20 nm and fill the opening section 110, thereby forming the upper electrode 115. It is to be noted that it is also possible to use TaN or the like as a material for forming the upper electrode 115. Subsequently, crystallization annealing is performed to convert the $HfO_x$ included in the ferroelectric film 113 into a ferroelectric material. It is to be noted that the crystallization annealing for converting $HfO_x$ into a ferroelectric material may be performed in this step or another step. It is possible to optionally change the temperature of the crystallization annealing, for example, within a range of 500° C. or less and the heat resistance range of another component such as the transistor 21, NiSi, or a wiring line. After that, the ferroelectric film 113 and the upper electrode 115 excessively deposited on the first insulating layer 300 are removed by performing CMP or the like. This forms the capacitor 11.

After that, as illustrated in FIG. 3H, the via contact 311 and the upper wiring layer 312 are formed on the first wiring layer 310. Specifically, the use of a damascene structure in which Cu or the like is used as a wiring material makes it possible to form the via contact 311 and the upper wiring layer 312. It is to be noted that the via contact 311 and the upper wiring layer 312 may be each formed by using Al or the like.

The steps described above make it possible to form the semiconductor storage device 10 according to the present embodiment.

1.4. Operation Example

Next, a write operation and a readout operation of the semiconductor storage device 10 according to the present embodiment are described. FIG. 4 is a schematic cross-sectional view of a cross section of the semiconductor storage device 10 according to the present embodiment taken along the active region 150.

As illustrated in FIG. 4, the semiconductor storage device 10 includes the transistor 21 and the capacitor 11 that is coupled to the source side of the source or drain region 151 of the transistor 21. The semiconductor storage device 10 is driven by the word line WL, the bit line BL, and the source line SL. The word line WL is coupled to the gate electrode 130 of the transistor 21. The bit line BL is coupled to the drain side of the source or drain region 151 of the transistor 21 through the contact 210. The source line SL is coupled to the capacitor 11.

Table 1 below is a table indicating examples of respective voltages (unit: V) to be applied in a write operation and a readout operation of the semiconductor storage device 10 to SWL, SBL, SSL, Well, UWL, UBL, and USL illustrated in FIG. 4.

It is to be noted that Vth represents a threshold voltage for bringing the channel of the transistor 21 into the on state and Vw represents a voltage that allows the polarization state of the capacitor 11 to be inverted in Table 1. In addition, SWL, SBL, and SSL respectively represent the word line WL, the bit line BL, and the source line SL of a selected memory cell and UWL, UBL, and USL respectively represent the word line WL, the bit line BL, and the source line SL of a non-selected memory cell. Well represents the active region 150 of the semiconducting substrate 100.

TABLE 1

| | SWL | SBL | SSL | Well | UWL | UBL | USL |
|---|---|---|---|---|---|---|---|
| "1" is written | Vw + Vth | Vw | 0 | 0 | 0 | 0 | 0 |
| "0" is written | Vw + Vth | 0 | Vw | 0 | 0 | 0 | 0 |
| readout | Vw + Vth | Vw | 0 | 0 | 0 | 0 | 0 |

For example, in a case where information of "1" is written in a memory cell, Vw+Vth is applied the word line WL coupled to a selected memory cell of the semiconductor storage device 10, Vw is applied to the bit line BL, 0 V is applied to the source line SL, and 0 V is applied to the active region 150 of the semiconductor substrate 100. In addition, 0 V is applied to the word line WL, the bit line BL, and the source line SL coupled to a non-selected memory cell of the semiconductor storage device 10.

According to this, Vw is applied to the bit line BL in the selected memory cell, thereby causing the potential of the other of the source or drain region 151 of the transistor 21 to be Vw. Therefore, the potential of the lower electrode 111 of the capacitor 11 is Vw. Meanwhile, the potential of the source line SL is 0 V and the potential of the upper electrode 115 is therefore 0 V. The electric field of Vw having a high potential on the lower electrode 111 side is thus applied to the ferroelectric film 113 of the capacitor 11. The polarization state of the ferroelectric film 113 is therefore controlled. The operation described above makes it possible to write, for example, information of "1" in a memory cell.

In this case, the potential of the source or drain region 151 of the transistor 21 of the selected memory cell is Vw, but the potentials of the word line WL and the gate electrode 130 of the transistor 21 of the non-selected memory cell are 0 V. No potential is thus applied to the lower electrode 111 in an adjacent non-selected memory cell. No electric field is applied to the ferroelectric film 113 of the capacitor 11.

In addition, in a case where information of "0" is written in a memory cell, Vw+Vth is applied to the word line WL coupled to the selected memory cell of the semiconductor storage device 10 and Vw is applied to the source line SL. The bit line BL has 0 V applied thereto and the active region 150 of the semiconductor substrate 100 has 0 V applied thereto. In addition, 0 V is applied to the word line WL, the bit line BL, and the source line SL coupled to a non-selected memory cell of the semiconductor storage device 10.

According to this, 0 V is applied to the bit line BL in the selected memory cell. This causes the potential of the other of the source or drain region 151 of the transistor 21 to be 0 V. Thus, the potential of the lower electrode 111 of the capacitor 11 is 0 V. Meanwhile, the potential of the source line SL is Vw and the potential of the upper electrode 115 is therefore Vw. The potential difference of Vw having a high potential on the upper electrode 115 side is thus applied to the ferroelectric film 113 of the capacitor 11. The polarization state of the ferroelectric film 113 is therefore controlled. The operation described above makes it possible to write, for example, information of "0" in a memory cell.

In this case, the potential of the source line SL of the selected memory cell is Vw, but the potentials of the word line WL and the gate electrode 130 of the transistor 21 of the non-selected memory cell are 0 V. No potential is thus applied to the lower electrode 111 in an adjacent non-selected memory cell. No electric field is applied to the ferroelectric film 113 of the capacitor 11.

It is to be noted that information is read out from a memory cell of the semiconductor storage device 10 by using a changing displacement current, for example, on the basis of information ("0" or "1") stored before writing the information. The displacement current occurs in a case where predetermined information (e.g., "1") is written in the memory cell.

For example, Table 1 indicates the respective voltages to be applied to SWL, SBL, SSL, Well, UWL, UBL, and USL in a case where information of "1" is written in a memory cell to read out information from the memory cell. In such a case, the amount of displacement currents is small in a case where the memory cell stores information of "1". In a case where a memory cell stores information of "0", the amount of displacement currents is large. This allows the semiconductor storage device 10 to determine whether the information stored in the memory cell is "0" or "1".

However, in a case where information is read out from a memory cell by the readout operation described above, the information stored in the memory cell is replaced with the predetermined information written upon reading out the information. In other words, the semiconductor storage device 10 uses destructive readout to read out information from a memory cell. The semiconductor storage device 10 thus performs, after a readout operation, a rewrite operation of restoring the information destructed by the readout operation.

2. Second Embodiment

2.1. Configuration Example

Subsequently, a semiconductor storage device according to a second embodiment of the present disclosure is described with reference to FIG. 5. FIG. 5 is a schematic diagram illustrating a planar configuration and a cross-sectional configuration of a semiconductor storage device 10A according to the present embodiment.

It is to be noted that the upper left plan view of FIG. 5 omits the planarization film 200 to clarify the disposition of the respective components. The planarization film 200 is formed to extend over the whole surface of the semiconductor substrate 100. Each of the cross-sectional views of FIG. 5 illustrates a cross section taken along the A-A line, the B-B line, or the C-C line illustrated in the upper left plan view.

As illustrated in FIG. 5, the semiconductor storage device 10A according to the second embodiment is different from the semiconductor storage device 10 according to the first embodiment in that the capacitor 11 is provided in the opening section 110 including a first opening 110A and a second opening 110B having opening diameters different from each other.

Specifically, the first opening 110A is formed in the planarization film 200 to have a larger opening diameter than that of the second opening 110B. The first opening 110A may have such an opening diameter that prevents, for example, the first opening 110A from coming into contact with the first opening 110A of a memory cell adjacent in the first direction and prevents the first opening 110A from overlapping with the gate electrode 130 in the second direction. In addition, the first opening 110A may have such opening depth that prevents the first opening 110A from coming into contact with the gate electrode 130, the side wall insulating film 132, and the cap layer 131.

The second opening 110B has a smaller opening diameter than that of the first opening 110A. The second opening 110B is formed in the planarization film 200 in the first opening 110A (i.e., at the bottom). The size of the second opening 110B may be substantially the same, for example, as the size of the source or drain region 151. In addition, the opening depth of the second opening 110B may be depth that allows the source or drain region 151 to be exposed from the bottom of the first opening 110A.

The opening section 110 including the first opening 110A and the second opening 110B is thus provided to have a shape having a larger opening diameter on the upper side opposite to the lower side on which the semiconductor substrate 100 is provided. The semiconductor storage device 10A is provided with the capacitor 11 in the opening section 110 including the first opening 110A and the second opening 110B. This makes it possible to further increase the area of the capacitor 11 while suppressing a short circuit between the capacitor 11 and the gate electrode 130. This allows the semiconductor storage device 10A to obtain a signal having a sufficient margin for operation while having higher device reliability.

It is to be noted that the semiconductor storage device 10A according to the second embodiment may be provided with the opening section 110 which extends through only the planarization film 200. As with the semiconductor storage device 10 according to the first embodiment, the semiconductor storage device 10A according to the second embodiment may be provided with the opening section 110 which extends through the planarization film 200 and the first insulating layer 300 from a layer upper than the first wiring layer 310.

2.2. Manufacturing Method

Next, a method of manufacturing the semiconductor storage device 10A according to the present embodiment is described with reference to FIGS. 6A, 6B, 6C, 6D, 6E, 6F, and 6G. Each of FIGS. 6A, 6B, 6C, 6D, 6E, 6F, and 6G is a schematic diagram describing a step of the method of manufacturing the semiconductor storage device 10A according to the present embodiment.

It is to be noted that FIGS. 6A, 6B, 6C, 6D, 6E, 6F, and 6G also omit the description of the layers provided to extend over the whole surface of the semiconductor substrate 100 as with FIG. 5. In addition, the respective cross-sectional views of FIGS. 6A, 6B, 6C, 6D, 6E, 6F, and 6G illustrate cross sections taken along the A-A lines, the B-B lines, or the C-C lines illustrated in the upper left plan views.

First as illustrated in FIG. 6A, the transistor 21, the planarization film 200, and the contact 210 are formed in steps similar to the steps illustrated in FIGS. 3A, 3B, 3C, 3D, and 3E in the first embodiment.

Next, as illustrated in FIG. 6B, the first opening 110A is formed by anisotropic etching in the planarization film 200 on the other of the source or drain region 151. In the anisotropic etching, a resist patterned by lithography is used as a mask. It is possible to form the first opening 110A having, for example, a width of 90 nm and a depth of 100 nm.

Subsequently, as illustrated in FIG. 6C, a spacer 117 is formed on an inner side surface of the first opening 110A. Specifically, amorphous silicon (a-Si) is deposited on the planarization film 200 including the first opening 110A to have a film thickness of 15 nm. After that, anisotropic etching is performed on the a-Si. This makes it possible to form the spacer 117 on only the inner side surface of the first opening 110A. It is possible to form the spacer 117 by using a material that serves as a mask in a case of etching to form the second opening 110B in a subsequent step. It is also possible to form the spacer 117 by using, for example, silicon nitride (SiNx), silicon oxynitride (SiON), silicon carbide (SiC), or the like. It is to be noted that the deposition temperature of the a-Si is selected by taking into consideration the influence on the transistor 21 or the like serving as a base.

Next, as illustrated in FIG. 6D, the second opening 110B is formed on the bottom of the first opening 110A. After that, the lower electrode 111 is formed along the inner shapes of the first opening 110A and the second opening 110B.

Specifically, it is possible to form the second opening 110B by etching the planarization film 200 with the spacer 117 used as a mask. For example, etching is performed up to the contact region 152 on the source or drain region 151 after etching is stopped in the liner layer by using a high selectivity etching condition of $SiO_2$/SiN. This makes it possible to form the second opening 110B with favorable controllability. It is possible to form the second opening 110B having, for example, smaller width (e.g., 60 nm) than that of the first opening 110A. This makes it possible to increase the distance between the gate electrode 130 and the second opening 110B. It is therefore possible to suppress the occurrence of a short circuit between the gate electrode 130 and the capacitor 11. In this case, it is also possible to remove the spacer 117. Specifically, it is possible to remove only the spacer 117 with favorable controllability by increasing the etching selectivity between Si and $SiO_2$ with chemical dry etching (Chemical Dry Etching: CDE).

After that, TiN is deposited on the source or drain region 151 along the inner shapes of the first opening 110A and the second opening 110B by using ALD or CVD to have a film thickness of 5 nm to 10 nm. This makes it possible to form the lower electrode 111. It is to be noted that it is also possible to use TaN or the like as a material for forming the lower electrode 111.

Subsequently, as illustrated in FIG. 6E, a resist is applied onto the deposited lower electrode 111 and etch-back is then performed under the condition that the resist and the lower electrode 111 have substantially the same selectivity. This retracts the lower electrode 111 from the opening surface of the first opening 110A. This makes it possible to form a recess by retracting the shoulders of the lower electrode 111 while leaving the lower electrode 111 on the bottoms and the side surfaces of the first opening 110A and the second opening 110B.

Next, as illustrated in FIG. 6F, the ferroelectric film 113 and the upper electrode 115 are deposited on the lower electrode 111, thereby forming the capacitor 11.

Specifically, first, hafnium oxide (HfOx), which is a high dielectric material, is deposited on the lower electrode 111 along the inner shape of the opening section 110 by CVD or ALD to have a film thickness of 3 nm to 10 nm, thereby forming the ferroelectric film 113. It is to be noted that hafnium oxide (HfOx), which is a high dielectric material, is converted to a ferroelectric material by being subjected to annealing treatment in a subsequent step.

It is to be noted that it is also possible to use a high dielectric material such as zirconium oxide (ZrOx) or hafnium zirconium oxide (HfZrOx) in place of hafnium oxide. In addition, it is also possible to convert these high dielectric materials into ferroelectric materials by doping the high dielectric materials with lanthanum (La), silicon (Si), gadolinium (Gd), or the like.

After that, TiN is deposited on the ferroelectric film 113 by using CVD, ALD, sputtering, or the like to have a film thickness of 5 nm to 20 nm and fill the first opening 110A and the second opening 110B, thereby forming the upper electrode 115. It is to be noted that it is also possible to use TaN or the like as a material for forming the upper electrode 115. Subsequently, crystallization annealing is performed to convert the HfOx included in the ferroelectric film 113 into a ferroelectric material. It is to be noted that the crystallization annealing for converting HfOx into a ferroelectric material may be performed in this step or another step. It is possible to optionally change the temperature of the crystallization annealing, for example, within a range of 500° C. or less and the heat resistance range of another component such as the transistor 21, NiSi, or a wiring line. After that, the ferroelectric film 113 and the upper electrode 115 excessively deposited on the planarization film 200 are removed by performing CMP or the like. This forms the capacitor 11.

Subsequently, as illustrated in FIG. 6G, the first wiring layer 310 is formed on the contact 210 and a second wiring layer 320 is formed on the upper electrode 115 of the capacitor 11.

Specifically, the use of a damascene structure in which Cu is used as a wiring material makes it possible to form the first wiring layer 310 on the contact 210. The first wiring layer 310 is extended on the contact 210 in the first direction. This causes the first wiring layer 310 to function as the bit line BL. Similarly, the use of a damascene structure in which Cu or the like is used as a wiring material makes it possible to form the second wiring layer 320 on the upper electrode 115. The second wiring layer 320 is extended on the upper electrode 115 of the capacitor 11 in the first direction. This causes the second wiring layer 320 to function as the source line SL. It is to be noted that the first wiring layer 310 and the second wiring layer 320 may be each formed by using Al or the like.

The steps described above make it possible to form the semiconductor storage device 10A according to the present embodiment.

3. Third Embodiment

3.1. Configuration Example

Next, a semiconductor storage device according to a third embodiment of the present disclosure is described with reference to FIGS. 7 and 8. FIG. 7 is a schematic diagram illustrating a cross-sectional configuration of a semiconductor storage device 10B according to the present embodiment. FIG. 8 is a schematic diagram illustrating a planar layout of the semiconductor storage device 10B according to the present embodiment.

As illustrated in FIG. 7, the semiconductor storage device 10B according to the third embodiment is FeRAM including the capacitor 11 and the transistor 21 as with the semiconductor storage device 10 according to the first embodiment and the semiconductor storage device 10A according to the second embodiment. The capacitor 11 stores information. The transistor 21 is controls the selection and non-selection of the capacitor 11.

Specifically, the transistor 21 includes the source or drain region 151 provided on the semiconductor substrate 100 and the gate electrode 130 provided on the semiconductor substrate 100. The drain side of the source or drain region 151 is electrically coupled to the contact 210 and the source side of the source or drain region 151 is electrically coupled to the capacitor 11 having a three-dimensional structure.

The surface of the gate electrode 130 is provided with the cap layer 131 including silicide, which is an alloy of cobalt (Co) or nickel (Ni) and silicon (Si). In addition, the surface of the source or drain region 151 is similarly provided with the contact region 152 including silicide, which is an alloy of cobalt (Co) or nickel (Ni) and silicon (Si).

For example, the contact 210 is provided by filling the inside of an opening provided in the planarization film 200 with a barrier metal layer 210B and an electrically conductive layer 210A. The planarization film 200 includes silicon oxide (SiOx). The electrically conductive layer 210A includes tungsten (W), polysilicon (poly-Si), or the like and electrically couples the contact region 152 and the first wiring layer 310. The barrier metal layer 210B includes, for example, Ti, TiN, Ru, or the like. The barrier metal layer 210B covers the surface of the electrically conductive layer 210A to suppress the interaction between the electrically conductive layer 210A and the planarization film 200. It is to be noted that the contact 210 may have any structure and include any material as long as it is possible to form ohmic electrical coupling to the contact region 152 and the source or drain region 151.

The capacitor 11 is provided in an opening provided in the planarization film 200 and an interlayer insulating film 201. In the semiconductor storage device 10B according to the present embodiment, the capacitor 11 is provided at height different from that of the contact 210. For example, the capacitor 11 may be provided to be higher than the contact 210 by the height of the interlayer insulating film 201.

The interlayer insulating film 201 includes, for example, silicon oxide (SiOx), silicon nitride (SiNx), or the like and is provided on the planarization film 200. The interlayer insulating film 201 is provided for preventing the contact 210 from being exposed to a cleaning solution or the like and being damaged in a subsequent step of forming the capacitor 11.

The capacitor 11 has a configuration in which the lower electrode 111 including Ti, TiN, or the like, the ferroelectric film 113, and the upper electrode 115 including Ti, TiN, or the like are stacked in order. The capacitor 11 is a buried capacitor in which the lower electrode 111 and the upper electrode 115 are insulated with the ferroelectric film 113 interposed in between. In the capacitor 11, the area in which the lower electrode 111 and the upper electrode 115 are opposed to each other in parallel and a fringe component from each of the respective electrode ends of the lower electrode 111 and the upper electrode 115 become the area which is effective as capacitance.

The ferroelectric film 113 may include a high dielectric material such as hafnium oxide (HfOx), zirconium oxide (ZrOx), or hafnium zirconium oxide (HfZrOx). In addition, the ferroelectric film 113 may include a ferroelectric material that is converted by doping the high dielectric material described above with lanthanum (La), silicon (Si), gadolinium (Gd), or the like.

The first insulating layer 300 is provided on the interlayer insulating film 201. The first insulating layer 300 is provided with the first wiring layer 310 that is electrically coupled to the contact 210 and the second wiring layer 320 that is electrically coupled to the upper electrode 115 of the capacitor 11. It is to be noted that the lower end of the second wiring layer 320 is provided to avoid contact with the lower electrode 111 by covering the ferroelectric film 113 and the upper electrode 115 of the capacitor 11.

As illustrated in FIG. 8, the semiconductor storage device 10B includes the active region 150, the gate electrode 130, the contact 210, the capacitor 11, the first wiring layer 310, and the second wiring layer 320. The active region 150 is provided in the semiconductor substrate 100. The gate electrode 130 functions as the word line WL. The first wiring layer 310 functions as the bit line BL. The second wiring layer 320 functions as the source line SL.

The first wiring layer 310 that functions as the bit line BL and the second wiring layer 320 that functions as the source line SL are provided to extend in the first direction serving as the in-plane direction of the semiconductor substrate 100. In addition, the gate electrode 130 that functions as the word line WL is provided to extend in the second direction orthogonal to the first direction. The active region 150 is a region in which the transistor 21 is provided. The active region 150 is provided to extend in the third direction that obliquely crosses both the first direction and the second direction. Further, the contact 210 is provided at an intersection between the active region 150 and the first wiring layer 310. The capacitor 11 is provided at an intersection between the active region 150 and the second wiring layer 320.

3.2. Manufacturing Method

Subsequently, a method of manufacturing the semiconductor storage device 10B according to the present embodiment is described with reference to FIGS. 9A, 9B, 9C, 9D, 9E, 9F, 9G, 9H, and 9I. Each of FIGS. 9A, 9B, 9C, 9D, 9E, 9F, 9G, 9H, and 9I is a cross-sectional view describing a step of the method of manufacturing the semiconductor storage device 10B according to the present embodiment.

First, as illustrated in FIG. 9A, the transistor 21 is formed in the semiconductor substrate 100 through known steps (e.g., steps illustrated in FIGS. 3A, 3B, 3C, and 3D). The planarization film 200 is deposited on the semiconductor substrate 100 to bury the transistor 21.

Subsequently, as illustrated in FIG. 9B, an opening is formed in the planarization film 200 in the region corresponding to one of the source or drain region 151 and the contact 210 is formed in the formed opening.

Next, as illustrated in FIG. 9C, the interlayer insulating film 201 is formed on the planarization film 200. It is possible to form the interlayer insulating film 201 by using, for example, silicon oxide ($SiO_x$), silicon nitride ($SiN_x$), or the like. The interlayer insulating film 201 is provided for preventing the contact 210 from being exposed to a cleaning solution or the like and being damaged in a subsequent step of forming the capacitor 11.

Subsequently, as illustrated in FIG. 9D, the opening section 110 for forming the capacitor 11 is formed in the planarization film 200 in the region corresponding to the other of the source or drain region 151.

Here, it is desirable to clean the bottom of the opening section 110 by using a cleaning solution including sulfuric acid or a cleaning solution including ammonium hydroxide ($NH_4OH$) and hydrogen peroxide ($H_2O_2$) for the contact resistance between the capacitor 11 and the transistor 21 and a favorable variation in contact resistance. The cleaning solution may damage the contact 210, but the semiconductor storage device 10B according to the present embodiment is provided with the interlayer insulating film 201 on the contact 210. This makes it possible to prevent the cleaning solution from damaging the contact 210.

After that, as illustrated in FIG. 9E, an electrically conductive material is deposited in the opening section 110 and on the interlayer insulating film 201, thereby forming a lower electrode layer 111A.

Subsequently, as illustrated in FIG. 9F, a resist is applied onto the deposited lower electrode layer 111A and etch-back is then performed under the condition that the resist and the lower electrode layer 111A have substantially the same selectivity. This retracts the lower electrode layer 111A from the opening surface of the opening section 110. This makes it possible to form a recess by retracting the shoulders of the lower electrode 111 while leaving the lower electrode 111 on the bottom and the side surfaces of the opening section 110. This forms the lower electrode 111 to have the upper end lower than the opening surface of the opening section 110 to prevent a short circuit with the second wiring layer 320 that is formed in a subsequent step.

Next, as illustrated in FIG. 9G, a ferroelectric film layer 113A and an upper electrode layer 115A are deposited on the lower electrode 111.

Subsequently, as illustrated in FIG. 9H, the ferroelectric film layer 113A and the upper electrode layer 115A outside the opening section 110 are removed by dry etching, polishing, or the like. This forms the ferroelectric film 113 and the upper electrode 115.

After that, as illustrated in FIG. 9I, the first insulating layer 300 is deposited on the interlayer insulating film 201 and the first wiring layer 310 and the second wiring layer 320 are then formed by using a damascene structure or the like in which copper (Cu) is used as a wiring material.

The steps described above make it possible to form the semiconductor storage device 10B according to the present embodiment.

3.3. Modification Examples

First Modification Example

Next, a first modification example of the semiconductor storage device 10B according to the present embodiment is described with reference to FIGS. 10, 11A, 11B, 11C, 11D, 11E, and 11F. FIG. 10 is a schematic diagram illustrating a cross-sectional configuration of the semiconductor storage device 10B according to the first modification example.

As illustrated in FIG. 10, a structure of the semiconductor storage device 10B according to the first modification example is different from the structure illustrated in FIG. 7 in that the ferroelectric film 113 and the upper electrode 115 are patterned and deposited on the interlayer insulating film 201. The upper electrode 115 is provided on the interlayer insulating film 201 by being patterned into a wiring shape. This allows the upper electrode 115 to function as the second wiring layer 320. The semiconductor storage device 10B according to the first modification example does not thus have to be provided with the second wiring layer 320. The semiconductor storage device 10B according to the first modification example is not provided with the second wiring layer 320. This makes it possible to prevent a short circuit between the lower electrode 111 and the second wiring layer 320.

Here, a method of manufacturing the semiconductor storage device 10B according to the present modification example is described with reference to FIGS. 11A, 11B, 11C, 11D, 11E, and 11F. Each of FIGS. 11A, 11B, 11C, 11D, 11E, and 11F is a cross-sectional view describing a step of the method of manufacturing the semiconductor storage device 10B according to the present modification example.

First, as illustrated in FIG. 11A, the transistor 21 and the contact 210 are formed on the semiconductor substrate 100 in steps similar to the steps illustrated in FIGS. 9A, 9B, 9C, and 9D. The opening section 110 is formed in the planarization film 200 and the interlayer insulating film 201.

Subsequently, as illustrated in FIG. 11B, an electrically conductive material is deposited in the opening section 110 and on the interlayer insulating film 201, thereby forming the lower electrode layer 111A.

Next, as illustrated in FIG. 11C, a resist is applied onto the deposited lower electrode layer 111A and etch-back is then performed under the condition that the resist and the lower electrode layer 111A have substantially the same selectivity. This retracts the lower electrode layer 111A from the opening surface of the opening section 110. This makes it possible to form a recess by retracting the shoulders of the lower electrode 111 while leaving the lower electrode 111 on the bottom and the side surfaces of the opening section 110. In the present modification example, the lower electrode 111 may be formed to have the upper end higher than the opening surface of the opening section 110.

Subsequently, as illustrated in FIG. 11D, a ferroelectric film layer 113A and an upper electrode layer 115A are deposited on the lower electrode 111.

Subsequently, as illustrated in FIG. 11E, the ferroelectric film layer 113A and the upper electrode layer 115A on the interlayer insulating film 201 are patterned into a wiring shape, thereby forming the ferroelectric film 113 and the upper electrode 115.

After that, as illustrated in FIG. 11F, the first insulating layer 300 is deposited on the interlayer insulating film 201 and the first wiring layer 310 is then formed by using a damascene structure or the like in which copper (Cu) is used as a wiring material.

The steps described above make it possible to form the semiconductor storage device 10B according to the present modification example.

Second Modification Example

In addition, a second modification example of the semiconductor storage device 10B according to the present embodiment is described with reference to FIG. 12. FIG. 12 is a schematic diagram illustrating a cross-sectional configuration of the semiconductor storage device 10B according to the second modification example.

As illustrated in FIG. 12, a structure of the semiconductor storage device 10B according to the second modification example is different from the structure illustrated in FIG. 7 in that the lower electrode 111, the ferroelectric film 113, and the upper electrode 115 are deposited on the interlayer insulating film 201. The lower electrode 111, the ferroelectric film 113, and the upper electrode 115 on the interlayer insulating film 201 are patterned and the second wiring layer 320 is provided on the upper electrode 115. It is possible to form the semiconductor storage device 10B according to the second modification example by concurrently etching the lower electrode 111, the ferroelectric film 113, and the upper electrode 115 deposited on the interlayer insulating film 201.

Third Modification Example

In addition, a third modification example of the semiconductor storage device 10B according to the present embodiment is described with reference to FIG. 13. FIG. 13 is a schematic diagram illustrating a cross-sectional configuration of the semiconductor storage device 10B according to the third modification example.

As illustrated in FIG. 13, a structure of the semiconductor storage device 10B according to third modification example is different from the structure illustrated in FIG. 7 in that the contact region 152 is not provided in the source or drain region 151 which is electrically coupled to the capacitor 11. It is possible to form the semiconductor storage device 10B according to the third modification example by performing selective silicification with the patterned silicon nitride ($SiN_x$) film or the like in a step of forming the transistor 21.

4. Fourth Embodiment

(4.1. Configuration Example)

Subsequently, a semiconductor storage device according to a fourth embodiment of the present disclosure is described with reference to FIG. 14. FIG. 14 is a schematic diagram illustrating a planar configuration and a cross-sectional configuration of a semiconductor storage device 10C according to the present embodiment.

It is to be noted that the upper left plan view of FIG. 14 omits the planarization film 200 and the first to third insulating layers 300, 400, and 600 to clarify the disposition of the respective components. The planarization film 200 and the first to third insulating layers 300, 400, and 600 are formed to extend over the whole surface of the semiconductor substrate 100. Each of the cross-sectional views of FIG. 14 illustrates a cross section taken along the B-B line, the C-C line, or the D-D line illustrated in the upper left plan view. It is to be noted that the B-B line and the C-C line illustrate cross-sectional configurations of a memory cell 10CC of the semiconductor storage device 10C and the D-D line illustrates a cross-sectional configuration of the semiconductor storage device 10C in the peripheral region. The memory cell 10CC herein refers to a region in which a capacitor 51 described below is provided. In addition, the peripheral region refers to a peripheral region of the memory cell region in which the plurality of memory cells 10CC is provided. The peripheral region of the semiconductor storage device 10C is provided, for example, with a logic circuit.

As illustrated in FIG. 14, the semiconductor storage device 10C according to the fourth embodiment is different from the semiconductor storage device 10 according to the first embodiment in that the semiconductor storage device 10C according to the fourth embodiment includes the capacitor 51 in place of the capacitor 11 (see FIG. 1) according to the first embodiment described above. The following uses the same signs for components that are substantially the same as those of the semiconductor storage device 10 according to the first embodiment described above and omits the description thereof as appropriate.

The semiconductor storage device 10C is FeRAM that includes the capacitor 51 and the transistor 21. The capacitor 51 stores information. The transistor 21 controls the selection and non-selection of the capacitor 51. The semiconductor storage device 10C includes the semiconductor substrate 100, the planarization film 200, the contact 210, the first wiring layer 310, the first insulating layer 300, the second insulating layer 400, and the third insulating layer 600 in addition to the capacitor 51 and the transistor 21. The semiconductor substrate 100 has a principal surface 100S.

The planarization film 200 serving as an interlayer insulating film is provided to cover the transistor 21 and the principal surface 100S of the semiconductor substrate 100.

The transistor 21 includes the source or drain region 151 provided on the semiconductor substrate 100 and the gate electrode 130 provided on the semiconductor substrate 100. The drain side of the source or drain region 151 is electrically coupled to the contact 210 and the source side of the source or drain region 151 is electrically coupled to the capacitor 51 having a three-dimensional structure through the contact 210 and the first wiring layer 310.

The contact 210 includes an electrically conductive material and is provided to penetrate the planarization film 200.

Specifically, the contact 210 is provided on the other of the source or drain region 151. The contact 210 electrically couples the drain side of the source or drain region 151 and the first wiring layer 310 serving as the bit line BL.

The first wiring layer 310 is provided on the opposite side to the transistor 21 as viewed from the contact 210. The first wiring layer 310 is electrically coupled to the contact 210. The first wiring layer 310 includes an electrically conductive material and is provided on the planarization film 200. Specifically, the first wiring layer 310 is provided on the contact 210 as a wiring line extending in the first direction orthogonal to the second direction in which the gate electrode 130 (word line WL) extends. The first wiring layer 310 is electrically coupled to the drain side of the source or drain region 151 through the contact 210. This causes the first wiring layer 310 to function as the bit line BL. In addition, the capacitor 51 is provided on the first wiring layer 310. In other words, the capacitor 51 is provided on the opposite side to the contact 210 as viewed from the first wiring layer 310.

The first insulating layer 300 has the capacitor 51 and the first wiring layer 310 buried therein. The first insulating layer 300 is provided on the planarization film 200 to extend over the whole surface of the semiconductor substrate 100. The via contact 311 and the upper wiring layer 312 are stacked on the first wiring layer 310. The via contact 311 and the upper wiring layer 312 are also buried in the first insulating layer 300. The upper wiring layer 312 is, however, exposed from the upper surface of the first insulating layer 300.

The via contact 311 includes an electrically conductive material and is in contact with the first wiring layer 310. The via contact 311 electrically couples the first wiring layer 310 and the upper wiring layer 312. The via contact 311 may include a metal material such as aluminum (Al) and may have a damascene structure of copper (Cu).

The upper wiring layer 312 includes an electrically conductive material and is provided on the via contact 311. The upper wiring layer 312 may include, for example, a metal material such as aluminum (Al) and may have a damascene structure of copper (Cu). The upper wiring layer 312 may be formed at the same time as a wiring line of another circuit provided in a logic region or the like. Alternatively, the upper wiring layer 312 may be formed to be shared with a wiring line of another circuit provided in a logic region or the like.

The first wiring layer 310, the via contact 311, and the upper wiring layer 312 are provided to penetrate the first insulating layer 300.

The second insulating layer 400 extends along the principal surface 100S to cover the whole surface of the first insulating layer 300. The second insulating layer 400 may be formed by using, for example, an insulating oxynitride such as silicon oxide (SiOx), silicon nitride (SiNx), or silicon oxynitride (SiON). The second insulating layer 400 has a via contact 411 and an upper wiring layer 412 buried therein. The via contact 411 and the upper wiring layer 412 are stacked on the upper wiring layer 312 in order. The upper wiring layer 412 is exposed from the upper surface of the second insulating layer 400.

The via contact 411 includes an electrically conductive material and is in contact with the upper wiring layer 312. For example, the same material as a material included the via contact 311 is usable as a material included in the via contact 411. The upper wiring layer 412 includes an electrically conductive material and is provided on the via contact 411. For example, the same material as a material included the upper wiring layer 312 is usable as a material included in the upper wiring layer 412. The upper wiring layer 412 may be formed at the same time as a wiring line of another circuit provided in a logic region or the like. Alternatively, the upper wiring layer 412 may be formed to be shared with a wiring line of another circuit provided in a logic region or the like.

There is provided an opening section 410 at the position corresponding to the first wiring layer 310 in the stack direction of the first insulating layer 300 and the second insulating layer 400 orthogonal to the principal surface 100S. The opening section 410 is a recessed section that reaches the first wiring layer 310 in the stack direction. The opening section 410 has a structure in which a lower section 410L and an upper section 410U communicate with each other. The lower section 410L is positioned in an upper layer of the first wiring layer 310. The upper section 410U is positioned in an upper layer of the lower section 410L. For example, the occupied area of the lower section 410L along the principal surface 100S is smaller than the occupied area of the upper section 410U along the principal surface 100S. The first insulating layer 300 and the second insulating layer 400 extend to the peripheral region of the semiconductor storage device 10C. The first insulating layer 300 and the second insulating layer 400 also extend to a circuit region including a logic circuit provided in the peripheral region of the semiconductor storage device 10C. The capacitor 51 is buried in the first insulating layer 300 and the second insulating layer 400 that extend into even the circuit region.

The capacitor 51 is provided to fill the opening section 410. The capacitor 51 is positioned above the contact 210 and the first wiring layer 310. The capacitor 51 includes a lower electrode 511, a ferroelectric film 513, and an upper electrode 515. The lower electrode 511 is provided along the inner surface of the opening section 410. The ferroelectric film 513 is provided on the lower electrode 511 along the opening section 410. The upper electrode 515 is provided on the ferroelectric film 513. The lower electrode 511 is electrically coupled to the source or drain region 151 (e.g., source) of the transistor 21 through the first wiring layer 310 or the like. The upper electrode 515 is electrically coupled to a second wiring layer 612 serving as the source line SL. The second wiring layer 612 is described below. Here, the area of the upper electrode 515 along the principal surface 100S is larger than the area of the coupling portion between the lower electrode 511 and the first wiring layer 310 along the principal surface 100S.

The third insulating layer 600 extends along the principal surface 100S to cover the whole surface of the second insulating layer 400. The third insulating layer 600 may be formed by using, for example, an insulating oxynitride such as silicon oxide (SiOx), silicon nitride (SiNx), or silicon oxynitride (SiON). The third insulating layer 600 has a via contact 611 and the second wiring layer 612 buried therein. The via contact 611 and the second wiring layer 612 are stacked on the upper electrode 515 and the upper wiring layer 412 in order. The second wiring layer 612 is exposed from the upper surface of the third insulating layer 600.

The via contact 611 includes an electrically conductive material and is in contact with the upper wiring layer 412. For example, the same material as a material included the via contact 311 is usable as a material included in the via contact 611. The second wiring layer 612 includes an electrically conductive material and is provided on the via contact 611.

The second wiring layer 612 is electrically coupled to the upper electrode 515 of the capacitor 51 through the via contact 611. The second wiring layer 612 is provided on the upper electrode 515 of the capacitor 51 as a wiring line extending in the first direction as with the first wiring layer 310. The second wiring layer 612 is electrically coupled to the upper electrode 515. This causes the second wiring layer 612 to function as the source line SL. The second wiring layer 612 may include, for example, a metal material such as aluminum (Al) and may have a damascene structure or a dual damascene structure of copper (Cu).

The semiconductor storage device 10C having the structure described above is provided with the capacitor 51 above the first wiring layer 310. In other words, the semiconductor storage device 10C having the structure described above is provided with the capacitor 51 on the opposite side to the transistor 21 as viewed from the first wiring layer 310. This makes it possible to increase the area and the thickness of the capacitor 51 as compared with a case where there is provided a capacitor, for example, in a gap between the first wiring layers 310. In other words, it is possible to increase the capacitance of the capacitor 51. This allows the semiconductor storage device 10C to secure a signal having a sufficient margin for the operation. In addition, the degree of freedom to design the planar shape of the capacitor 51 is increased.

4.2. Manufacturing Method

Subsequently, a method of manufacturing the semiconductor storage device 10C according to the present embodiment is described with reference to FIGS. 15A, 15B, 15C, 15D, 15E, 15F, 15G, 15H, and 15I. FIGS. 15A, 15B, 15C. 15D, 15E, 15F, 15G, 15H, and 15I are schematic diagrams each describing a step of the method of manufacturing the semiconductor storage device 10C.

It is to be noted that FIGS. 15A, 15B, 15C, 15D, 15E, 15F, 15G, 15H, and 15I also omit the description of the layers provided to extend over the whole surface of the semiconductor substrate 100 as with FIG. 14. In addition, the respective cross-sectional views of FIGS. 15A, 15B, 15C, 15D, 15E, 15F, 15G, 15H, and 15I illustrate cross sections taken along the A-A lines, the B-B lines, the C-C lines, or the D-D lines illustrated in the upper left plan views.

First, as illustrated in FIG. 15A, the element isolation layer 105 is formed in the semiconductor substrate 100 and the active region 150 is formed in which the transistor 21 is formed in a subsequent step as in the first embodiment described above.

Next, as illustrated in FIG. 15B, the gate insulating film 140 is deposited. After that, the gate electrode 130 is formed on the gate insulating film 140 as in the first embodiment described above.

Next, as illustrated in FIG. 15C, the side wall insulating films 132 are formed on both side surfaces of the gate electrode 130 and the source or drain region 151 is formed in the active region 150 of the semiconductor substrate 100 as in the first embodiment described above.

Subsequently, as illustrated in FIG. 15D, to bury the transistor 21, the planarization film 200 is formed that extends over the whole surface of the semiconductor substrate 100 as in the first embodiment described above.

Next, as illustrate in FIG. 15E, the other of the source or drain region 151 and the contact 210 that is electrically coupled to each of the gate electrodes 130 are formed. After that, the first wiring layer 310 is formed on the contact 210. The first wiring layer 310 is extended on the contact 210 in the first direction. This may cause the first wiring layer 310 to serve as the bit line BL. The first wiring layer 310 may also be applied to a wiring line included in the logic circuit in the peripheral region. Further, the first wiring layer 310 that is provided in the memory cell region electrically couples the contact 210 and the lower electrode 511 of the capacitor 51 on the B-B line.

Next, as illustrated in FIG. 15F, the first insulating layer 300 is formed to cover the planarization film 200 and the first wiring layer 310.

Specifically, a $SiO_2$ film is deposited on the planarization film 200 to have a film thickness of 100 nm to 500 nm and bury the first wiring layer 310 by using CVD or the like. This forms the first insulating layer 300. In a case where the first insulating layer 300 is formed, for example, the $SiO_2$ film deposited in a CMP method may be planarized. The first insulating layer 300 may be formed by using a low dielectric constant material (e.g., SiOC including carbon) having a lower dielectric constant than that of $SiO_2$. It is to be noted that a linear layer including SiNx may be formed on the planarization film 200 before the formation of the first insulating layer 300. For example, the liner layer may be formed by depositing SiNx to have a film thickness of 10 nm to 50 nm with plasma CVD.

After the formation of the first insulating layer 300, the via contact 311 and the upper wiring layer 312 are formed on the first wiring layer 310. Specifically, the use of a damascene structure in which Cu or the like is used as a wiring material makes it possible to form the via contact 311 and the upper wiring layer 312. It is to be noted that the via contact 311 and the upper wiring layer 312 may be each formed by using Al or the like.

Next, as illustrated in FIG. 15G, the second insulating layer 400 is formed to cover the first insulating layer 300.

Specifically, a $SiO_2$ film is deposited on the first insulating layer 300 by using CVD or the like to have a film thickness of 100 nm to 500 nm and the second insulating layer 400 is formed. In a case where the second insulating layer 400 is formed, for example, the $SiO_2$ film deposited in a CMP method may be planarized. The second insulating layer 400 may be formed by using a low dielectric constant material (e.g., SiOC including carbon) having a lower dielectric constant than that of $SiO_2$. It is to be noted that a linear layer including SiNx may be formed on the first insulating layer 300 before the formation of the second insulating layer 400. For example, the liner layer may be formed by depositing SiNx to have a film thickness of 10 nm to 50 nm with plasma CVD.

After the formation of the second insulating layer 400, the via contact 411 and the upper wiring layer 412 are formed on the upper wiring layer 312. Specifically, the use of a damascene structure in which Cu or the like is used as a wiring material makes it possible to form the via contact 411 and the upper wiring layer 412. It is to be noted that the via contact 411 and the upper wiring layer 412 may be each formed by using Al or the like.

Next, as illustrated in FIG. 15H, the opening section 410 is formed for exposing the first wiring layer 310 in the memory cell region.

Specifically, the first insulating layer 300 and the second insulating layer 400 are selectively dug by anisotropic etching to form the opening section 410. In the anisotropic etching, a resist patterned by lithography is used as a mask. First, the lower section 410L of the opening section 410 is formed to be narrower than the upper section 410U of the opening section 410. For example, the lower section 410L of the opening section 410 is formed to have a width of 60 nm. After the formation of the lower section 410L, the upper section 410U is formed as with the formation of the lower section 410L. The upper section 410U is formed to have greater width than the width of the lower section 410L. For example, the upper section 410U is formed to have a width of 100 nm to 150 nm. As long as the lower section 410L and the upper section 410U each have an aspect ratio of about 20 or less, it is possible to perform etching to form the lower section 410L and the upper section 410U and fill the opening section 410 by deposition in a subsequent step without raising any issue. It is possible to perform anisotropic etching by using, for example, a fluorocarbon-based gas. In addition, it is possible to stop etching with favorable controllability by using the linear layer described above.

Next, as illustrated in FIG. 15I, the capacitor 51 is formed in the opening section 410.

Specifically, first, ALD, CVD, or sputtering in which IMP is used is used to deposit TiN having a film thickness of 5 nm to 10 nm on the exposed first wiring layer 310 along the inner shape of the opening section 410, thereby forming the lower electrode 511.

Next, hafnium oxide (HfOx), which is a high dielectric material, is deposited on the lower electrode 511 along the inner shape of the opening section 410 by CVD or ALD to have a film thickness of 3 nm to 10 nm, thereby forming the ferroelectric film 513. It is to be noted that hafnium oxide (HfOx), which is a high dielectric material, is converted to a ferroelectric material by being subjected to annealing treatment in a subsequent step.

It is to be noted that it is also possible to use a high dielectric material such as zirconium oxide (ZrOx) or hafnium zirconium oxide (HfZrOx) in place of hafnium oxide. In addition, it is also possible to convert these high dielectric materials into ferroelectric materials by doping the high dielectric materials with lanthanum (La), silicon (Si), gadolinium (Gd), or the like.

After that, TiN is deposited on the ferroelectric film 513 by using CVD, ALD, sputtering, or the like to have a film thickness of 5 nm to 20 nm and fill the opening section 410, thereby forming the upper electrode 515. It is to be noted that it is also possible to use TaN or the like as a material for forming the upper electrode 515. Subsequently, crystallization annealing is performed to convert the HfOx included in the ferroelectric film 513 into a ferroelectric material. It is to be noted that the crystallization annealing for converting HfOx into a ferroelectric material may be performed in this step or another step. It is possible to optionally change the temperature of the crystallization annealing, for example, within a range of 500° C. or less and the heat resistance range of another component such as the transistor 21, NiSi, or a wiring line. After that, the ferroelectric film 513 and the upper electrode 515 excessively deposited on the second insulating layer 400 are removed by performing CMP or the like. This forms the capacitor 51.

Subsequently, as illustrated in FIG. 14, the third insulating layer 600 is formed to cover the second insulating layer 400.

Specifically, a $SiO_2$ film is deposited on the second insulating layer 400 by using CVD or the like to have a film thickness of 100 nm to 500 nm and the third insulating layer 600 is formed. In a case where the third insulating layer 600 is formed, for example, the $SiO_2$ film deposited in a CMP method may be planarized. The third insulating layer 600 may be formed by using a low dielectric constant material (e.g., SiOC including carbon) having a lower dielectric constant than that of $SiO_2$. It is to be noted that a linear layer including SiNx may be formed on the second insulating layer 400 before the formation of the third insulating layer 600. For example, the liner layer may be formed by depositing SiNx to have a film thickness of 10 nm to 50 nm with plasma CVD.

After the formation of the third insulating layer 600, the via contact 611 and the second wiring layer 612 are formed on the upper electrode 515 and the upper wiring layer 412. Specifically, the use of a damascene structure in which Cu or the like is used as a wiring material makes it possible to form the via contact 611 and the second wiring layer 612. It is to be noted that the via contact 611 and the second wiring layer 612 may be each formed by using Al or the like. In addition, the second wiring layer 612 extends, for example, in the first direction. This may cause the second wiring layer 612 to serve as the source line SL. The second wiring layer 612 may also be applied to a wiring line included in the logic circuit in the peripheral region.

The steps described above make it possible to form the semiconductor storage device 10C according to the present embodiment.

4.3. Operation Example

Next, a write operation and a readout operation of the semiconductor storage device 10C according to the present embodiment are described. FIG. 16 is a schematic cross-sectional view of a cross section of the semiconductor storage device 10C according to the present embodiment taken along the active region 150.

As illustrated in FIG. 16, the semiconductor storage device 10C includes the transistor 21 and the capacitor 51 that is coupled to the source side of the source or drain region 151 of the transistor 21. The semiconductor storage device 10C is driven by the word line WL, the bit line BL, and the source line SL. The word line WL is coupled to the gate electrode 130 of the transistor 21. The bit line BL is coupled to the drain side of the source or drain region 151 of the transistor 21 through the contact 210. The source line SL is coupled to the capacitor 51.

A write operation and a readout operation of the semiconductor storage device 10C are performed as with the write operation and the readout operation of the semiconductor storage device 10 according to the first embodiment described above. The respective voltages described in Table 1 above are thus applied to SWL, SBL, SSL, Well, UWL, UBL, and USL illustrated in FIG. 16.

It is to be noted that Vth described in Table 1 represents a threshold voltage for bringing the channel of the transistor 21 into the on state. Similarly, Vw in Table 1 represents a voltage that allows the polarization state of the capacitor 51 to be inverted. In addition, SWL, SBL, and SSL in Table 1 respectively represent the word line WL, the bit line BL, and the source line SL of a selected memory cell. Further, UWL, UBL, and USL in Table 1 respectively represent the word line WL, the bit line BL, and the source line SL of a non-selected memory cell. Well in Table 1 represents the active region 150 of the semiconducting substrate 100.

For example, in a case where information of "1" is written in the selected memory cell 10CC of the semiconductor storage device 10C, Vw+Vth is applied the word line WL coupled to the selected memory cell 10CC, Vw is applied to the bit line BL, 0 V is applied to the source line SL, and 0 V is applied to the active region 150 of the semiconductor substrate 100. In addition, 0 V is applied to the word line WL, the bit line BL, and the source line SL coupled to the non-selected memory cell 10CC of the semiconductor storage device 10C.

In addition, in a case where information of "0" is written in the selected memory cell 10CC of the semiconductor storage device 10C, Vw+Vth is applied the word line WL coupled to the selected memory cell 10CC and Vw is applied to the source line SL. The bit line BL has 0 V applied thereto and the active region 150 of the semiconductor substrate 100 has 0 V applied thereto. In addition, 0 V is applied to the word line WL, the bit line BL, and the source line SL coupled to the non-selected memory cell 10CC of the semiconductor storage device 10C.

Information is read out from the memory cell 10CC of the semiconductor storage device 10C by using a changing displacement current, for example, on the basis of information ("0" or "1") stored before writing the information. The displacement current occurs in a case where predetermined information (e.g., "1") is written in the memory cell 10CC. Details are similar to those of the readout of information from a memory cell of the semiconductor storage device 10.

5. Fifth Embodiment

5.1. Configuration Example

Subsequently, a semiconductor storage device according to a fifth embodiment of the present disclosure is described with reference to FIG. 17. FIG. 17 is a schematic diagram illustrating a planar configuration and a cross-sectional configuration of a semiconductor storage device 10D according to the present embodiment.

It is to be noted that the upper left plan view of FIG. 17 omits the planarization film 200 and the first to third insulating layers 300, 400, and 600 to clarify the disposition of the respective components. The planarization film 200 and the first to third insulating layers 300, 400, and 600 are formed to extend over the whole surface of the semiconductor substrate 100. The respective cross-sectional views of FIG. 17 illustrate cross sections taken along the B-B line, the C-C line, or the D-D line illustrated in the upper left plan view. It is to be noted that the B-B line and the C-C line illustrate cross-sectional configurations of a memory cell 10DD of the semiconductor storage device 10D and the D-D line illustrates a cross-sectional configuration of the semiconductor storage device 10D in the peripheral region. The memory cell 10DD herein refers to a region in which a capacitor 71 described below is provided. In addition, the peripheral region refers to a peripheral region of the memory cell region in which the plurality of memory cells 10DD is provided. The peripheral region of the semiconductor storage device 10D is provided, for example, with a logic circuit.

As illustrated in FIG. 17, the semiconductor storage device 10D according to the fifth embodiment is different from the semiconductor storage device 10C according to the fourth embodiment in that the semiconductor storage device 10D according to the fifth embodiment includes the capacitor 71 in place of the capacitor 51. The following uses the same signs for components that are substantially the same as those of the semiconductor storage device 10C according to the fourth embodiment described above and omits the description thereof as appropriate.

The semiconductor storage device 10D is FeRAM that includes the capacitor 71 and the transistor 21. The capacitor 71 stores information. The transistor 21 controls the selection and non-selection of the capacitor 71.

The capacitor 71 is provided to fill the opening section 410 as with the capacitor 51. The capacitor 71 includes a lower electrode 711, a ferroelectric film 713, and an upper electrode 715. The lower electrode 711 is provided along the inner surface of the opening section 410. The ferroelectric film 713 is provided on the lower electrode 711 along the opening section 410. The upper electrode 715 is provided on the ferroelectric film 713. The lower electrode 711 is electrically coupled to the source or drain region 151 (e.g., source) of the transistor 21 through the first wiring layer 310 or the like. The upper electrode 715 is electrically coupled to the second wiring layer 612 serving as the source line SL.

In the semiconductor storage device 10C according to the third embodiment described above, the upper end of the lower electrode 511 reaches the upper surface of the second insulating layer 400. In other words, the upper end of the lower electrode 511 reaches the opposite surface to the semiconductor substrate 100. In contrast, in the semiconductor storage device 10D according to the present embodiment, the upper end of the lower electrode 711 is at a position backwardly retracted from the upper surface of the second insulating layer 400. In addition, in the semiconductor storage device 10C according to the third embodiment described above, the outer edge of the upper electrode 515 along the principal surface 100S is at a position inwardly retracted from the inner edge of the opening section 410. Accordingly, the area of the upper electrode 515 along the principal surface 100S is smaller than the area of the opening section 410 along the principal surface 100S. In contrast, in the semiconductor storage device 10D according to the present embodiment, the outer edge of the upper electrode 715 extends in the in-plane direction along the principal surface 100S of the semiconductor substrate 100 to come into contact with the inner edge of the opening section 410. In other words, the shape and the area of the upper electrode 715 are substantially the same as the shape and the area of the opening section 410 in the in-plane direction along the principal surface 100S of the semiconductor substrate 100. The area of the upper electrode 715 along the principal surface 100S is thus substantially equal to the area of the lower electrode 711 along the principal surface 100S.

The semiconductor storage device 10D having the structure described above is provided with the capacitor 71 on the opposite side to the transistor 21 as viewed from the first wiring layer 310 as with the semiconductor storage device 10C. This makes it possible to increase the area and the thickness of the capacitor 71 as compared with a case where there is provided a capacitor, for example, in a gap between the first wiring layers 310. In other words, it is possible to increase the capacitance of the capacitor 71. This allows the semiconductor storage device 10D to secure a signal having a sufficient margin for the operation. In addition, the degree of freedom to design the planar shape of the capacitor 71 is increased.

Further, in the semiconductor storage device 10D, the area of the upper electrode 715 along the principal surface 100S is substantially equal to the area of the lower electrode 711 along the principal surface 100S. As compared with the semiconductor storage device 10C, it is therefore easier to align the upper electrode 715 and the via contact 611 in a case where the via contact 611 to be coupled to the upper electrode 715 is formed, for example, in the manufacturing process. This makes it possible to increase the manufacturing yield.

5.2. Manufacturing Method

Subsequently, a method of manufacturing the semiconductor storage device 10D according to the present embodiment is described with reference to FIGS. 18A, 18B, and 18C. FIGS. 18A, 18B, and 18C are schematic diagrams each describing a step of the method of manufacturing the semiconductor storage device 10D.

It is to be noted that FIGS. 18A, 18B, and 18C also omit the description of the layers provided to extend over the whole surface of the semiconductor substrate 100 as with FIG. 17. In addition, the respective cross-sectional views of FIGS. 18A, 18B, and 18C illustrate cross sections taken along the B-B lines, the C-C lines, or the D-D lines illustrated in the upper left plan views.

First, the opening section 410 is formed as in the steps according to the fourth embodiment described above illustrated in FIGS. 15A, 15B, 15C, 15D, 15E, 15F, 15G, and 15H. Next, as illustrated in FIG. 18A, a lower electrode film 711Z is formed in the opening section 410. Specifically, ALD, CVD, or sputtering in which IMP is used is used to deposit TiN having a film thickness of 5 nm to 10 nm on the exposed first wiring layer 310 along the inner shape of the opening section 410, thereby forming the lower electrode film 711Z.

After that, as illustrated in FIG. 18B, the lower electrode 711 is formed. Specifically, a resist is applied onto the deposited lower electrode film 711Z. Etch-back is performed under a condition that the resist and the lower electrode film 711Z have substantially the same selectivity. Thus, the upper end of the lower electrode film 711Z is retracted from the upper surface of the second insulating layer 400. This offers the lower electrode 711 that has the upper end retracted from the upper surface of the second insulating layer 400 while covering the bottom and the side surfaces of the opening section 410.

Next, as illustrated in FIG. 18C, hafnium oxide (HfOx), which is a high dielectric material, is deposited on the lower electrode 711 along the inner shape of the opening section 410 by CVD or ALD to have a film thickness of 3 nm to 10 nm, thereby forming the ferroelectric film 713. It is to be noted that hafnium oxide (HfOx), which is a high dielectric material, is converted to a ferroelectric material by being subjected to annealing treatment in a subsequent step.

It is to be noted that it is also possible to use a high dielectric material such as zirconium oxide (ZrOx) or hafnium zirconium oxide (HfZrOx) in place of hafnium oxide. In addition, it is also possible to convert these high dielectric materials into ferroelectric materials by doping the high dielectric materials with lanthanum (La), silicon (Si), gadolinium (Gd), or the like.

After that, TiN is deposited on the ferroelectric film 713 by using CVD, ALD, sputtering, or the like to have a film thickness of 5 nm to 20 nm and fill the opening section 410, thereby forming the upper electrode 715. It is to be noted that it is also possible to use TaN or the like as a material for forming the upper electrode 715. Subsequently, crystallization annealing is performed to convert the HfOx included in the ferroelectric film 713 into a ferroelectric material. It is to be noted that the crystallization annealing for converting HfOx into a ferroelectric material may be performed in this step or another step. It is possible to optionally change the temperature of the crystallization annealing, for example, within a range of 500° C. or less and the heat resistance range of another component such as the transistor 21, NiSi, or a wiring line. After that, the ferroelectric film 713 and the upper electrode 715 excessively deposited on the second insulating layer 400 are removed by performing CMP or the like. This forms the capacitor 71.

Subsequently, as illustrated in FIG. 17, the third insulating layer 600 is formed to cover the second insulating layer 400. After the formation of the third insulating layer 600, the via contact 611 and the second wiring layer 612 are formed on the upper electrode 715 and the upper wiring layer 412. Specifically, the use of a damascene structure in which Cu or the like is used as a wiring material makes it possible to form the via contact 611 and the second wiring layer 612. It is to be noted that the via contact 611 and the second wiring layer 612 may be each formed by using Al or the like. In addition, the second wiring layer 612 extends, for example, in the first direction. This may cause the second wiring layer 612 to serve as the source line SL. The second wiring layer 612 may also be applied to a wiring line included in the logic circuit in the peripheral region.

The steps described above make it possible to form the semiconductor storage device 10D according to the present embodiment.

6. Sixth Embodiment

6.1. Configuration Example

Subsequently, a semiconductor storage device according to a sixth embodiment of the present disclosure is described with reference to FIG. 19. FIG. 19 is a schematic diagram illustrating a planar configuration and a cross-sectional configuration of a semiconductor storage device 10E according to the present embodiment.

It is to be noted that the upper left plan view of FIG. 19 omits the planarization film 200 and the first to third insulating layers 300, 400, and 600 to clarify the disposition of the respective components. The planarization film 200 and the first to third insulating layers 300, 400, and 600 are formed to extend over the whole surface of the semiconductor substrate 100. Each of the cross-sectional views of FIG. 19 illustrates a cross section taken along the B-B line, the C-C line, or the D-D line illustrated in the upper left plan view. It is to be noted that the B-B line and the C-C line illustrate cross-sectional configurations of a memory cell 10EE of the semiconductor storage device 10E and the D-D line illustrates a cross-sectional configuration of the semiconductor storage device 10E in the peripheral region. The memory cell 10EE herein refers to a region in which a capacitor 81 described below is provided. In addition, the peripheral region refers to a peripheral region of the memory cell region in which the plurality of memory cells 10EE is provided. The peripheral region of the semiconductor storage device 10E is provided, for example, with a logic circuit.

As illustrated in FIG. 19, the semiconductor storage device 10E according to the sixth embodiment is different from the semiconductor storage device 10D according to the fourth embodiment in that the semiconductor storage device 10E according to the sixth embodiment includes the capacitor 81 in place of the capacitor 71. The following uses the same signs for components that are substantially the same as those of the semiconductor storage device 10D according to the fourth embodiment described above and omits the description thereof as appropriate.

The semiconductor storage device 10E is FeRAM that includes the capacitor 81 and the transistor 21. The capacitor 81 stores information. The transistor 21 controls the selection and non-selection of the capacitor 81.

The capacitor 81 is provided to fill the opening section 410 as with the capacitor 71. The capacitor 81 includes a lower electrode 811, a ferroelectric film 813, and an upper electrode 815. The lower electrode 811 is provided along the inner surface of the opening section 410. The ferroelectric film 813 is provided on the lower electrode 811 along the opening section 410. The upper electrode 815 is provided on the ferroelectric film 813. The lower electrode 811 is electrically coupled to the source or drain region 151 (e.g., source) of the transistor 21 through the first wiring layer 310 or the like. The upper electrode 815 is electrically coupled to the second wiring layer 612 serving as the source line SL.

In the semiconductor storage device 10D according to the fourth embodiment described above, the upper surface of the upper electrode 715 substantially coincides with the upper surface of the second insulating layer 400. In contrast, in the semiconductor storage device 10E according to the present embodiment, the upper electrode 815 is positioned above the upper surface of the second insulating layer 400. In other words, the upper electrode 815 protrudes to the opposite side to the semiconductor substrate 100. This increases the choices of a formation method of forming the capacitor 81. It is therefore possible to increase the manufacturing yield by selecting an appropriate formation method.

It is possible to increase the capacitance of the capacitor 81 in the semiconductor storage device 10E having the structure described above as compared with the capacitance of the capacitor 71 of the semiconductor storage device 10D. This allows the semiconductor storage device 10E to secure a signal having a sufficient margin for the operation. It is to be noted that the example has been described in which the area of the upper electrode 815 along the principal surface 100S is substantially equal to the area of the lower electrode 811 along the principal surface 100S in the semiconductor storage device 10E in FIG. 19, but it is also possible to cause the upper electrode 815 to have larger area along the principal surface 100S than the area of the lower electrode 811 along the principal surface 100S.

6.2. Manufacturing Method

Subsequently, a method of manufacturing the semiconductor storage device 10E according to the present embodiment is described with reference to FIGS. 20A and 20B. FIGS. 20A and 20B are schematic diagrams each describing a step of the method of manufacturing the semiconductor storage device 10E.

It is to be noted that FIGS. 20A and 20B also omit the description of the layers provided to extend over the whole surface of the semiconductor substrate 100 as with FIG. 19. In addition, the respective cross-sectional views of FIGS. 20A and 20B illustrate cross sections taken along the B-B lines, the C-C lines, or the D-D lines illustrated in the upper left plan views.

First, the opening section 410 is formed as in the steps according to the fourth embodiment described above illustrated in FIGS. 15A, 15B, 15C, 15D, 15E, 15F, 15G, and 15H.

Next, as illustrated in FIG. 20A, a lower electrode film 811Z is formed to completely cover the inside of the opening section 410 and the upper surface of the second insulating layer 400. Specifically, ALD, CVD, or sputtering in which IMP is used is used to deposit TiN having a film thickness of 5 nm to 10 nm on the exposed first wiring layer 310 along the inner shape of the opening section 410, thereby forming the lower electrode film 811Z. The lower electrode film 811Z is uniformly formed to cover even the upper surface of the second insulating layer 400.

Subsequently, hafnium oxide (HfOx), which is a high dielectric material, is deposited on the lower electrode film 811Z along the inner shape of the opening section 410 by CVD or ALD to have a film thickness of 3 nm to 10 nm, thereby forming a ferroelectric film 813Z. It is to be noted that hafnium oxide (HfOx), which is a high dielectric material, is converted to a ferroelectric material by being subjected to annealing treatment in a subsequent step. The ferroelectric film 813Z is uniformly formed to cover even the lower electrode film 811Z that covers the upper surface of the second insulating layer 400.

After that, TiN is deposited on the ferroelectric film 813Z by using CVD, ALD, sputtering, or the like to have a film thickness of 5 nm to 20 nm and fill the opening section 410, thereby forming an upper electrode film 815Z. It is to be noted that it is also possible to use TaN or the like as a material for forming the upper electrode film 815Z. Subsequently, crystallization annealing is performed to convert the HfOx included in the ferroelectric film 813Z into a ferroelectric material. It is to be noted that the crystallization annealing for converting HfOx into a ferroelectric material may be performed in this step or another step. It is possible to optionally change the temperature of the crystallization annealing, for example, within a range of 500° C. or less and the heat resistance range of another component such as the transistor 21, NiSi, or a wiring line.

After that, for example, a resist patterned by lithography is used as a mask to perform anisotropic etching on the upper electrode film 815Z, the ferroelectric film 813Z, and the lower electrode film 811Z in this order. For example, as illustrated in FIG. 20B, this forms the plurality of capacitors 81 each including the upper electrode 815, the ferroelectric film 813, and the lower electrode 811. It is possible to use any of dry etching or wet etching for the anisotropic etching.

7. Seventh Embodiment

7.1. Configuration Example

Subsequently, a semiconductor storage device according to a seventh embodiment of the present disclosure is described with reference to FIG. 21. FIG. 21 is a schematic diagram illustrating a planar configuration and a cross-sectional configuration of a semiconductor storage device 10F according to the present embodiment.

It is to be noted that the upper left plan view of FIG. 21 omits the planarization film 200 and the first to third insulating layers 300, 400, and 600 to clarify the disposition of the respective components. The planarization film 200 and the first to third insulating layers 300, 400, and 600 are formed to extend over the whole surface of the semiconductor substrate 100. Each of the cross-sectional views of FIG. 21 illustrates a cross section taken along the B-B line, the C-C line, or the D-D line illustrated in the upper left plan view. It is to be noted that the B-B line and the C-C line illustrate cross-sectional configurations of a memory cell 10FF of the semiconductor storage device 10F and the D-D line illustrates a cross-sectional configuration of the semiconductor storage device 10F in the peripheral region. The memory cell 10FF herein refers to a region in which a capacitor 91 described below is provided. In addition, the peripheral region refers to a peripheral region of the memory cell region in which the plurality of memory cells 10FF is provided. The peripheral region of the semiconductor storage device 10F is provided, for example, with a logic circuit.

As illustrated in FIG. 21, the semiconductor storage device 10F according to the seventh embodiment is different from the semiconductor storage device 10C according to the fourth embodiment in that the semiconductor storage device 10F according to the seventh embodiment includes the capacitor 91 in place of the capacitor 51. The following uses the same signs for components that are substantially the same as those of the semiconductor storage device 10C according to the fourth embodiment described above and omits the description thereof as appropriate.

The semiconductor storage device 10F is FeRAM that includes the capacitor 91 and the transistor 21. The capacitor 91 stores information. The transistor 21 controls the selection and non-selection of the capacitor 91.

The capacitor 91 is provided to fill an opening section 420. The opening section 420 is, however, provided to extend through only the second insulating layer 400 unlike the opening section 410. The capacitor 91 includes a lower electrode 911, a ferroelectric film 913, and an upper electrode 915. The lower electrode 911 is provided along the inner surface of the opening section 420. The ferroelectric film 913 is provided on the lower electrode 911 along the opening section 420. The upper electrode 915 is provided on the ferroelectric film 913. There is provided an upper wiring layer 313 in a lower layer of the lower electrode 911. The upper wiring layer 313 is exposed from the upper surface of the first insulating layer 300. The upper wiring layer 313 is electrically coupled to the lower surface of the lower electrode 911. The area of the upper wiring layer 313 along the principal surface 100S is, for example, larger than or equal to the area of the lower electrode 911 along the principal surface 100S. The lower layer of the upper wiring layer 313 is provided with the via contact 311. The via contact 311 electrically couples the upper wiring layer 313 and the first wiring layer 310. The lower electrode 911 is thus electrically coupled to the source or drain region 151 (e.g., source) of the transistor 21 through the first wiring layer 310 or the like. The upper electrode 915 is electrically coupled to the second wiring layer 612 serving as the source line SL.

In the semiconductor storage device 10F according to the present embodiment, the lower electrode 911 and the source or drain region 151 (e.g., source) of the transistor 21 are electrically coupled through the upper wiring layer 313 having larger area than the area of the first wiring layer 310. This makes it easier to align the lower electrode 911 and the first wiring layer 310. This makes it possible to increase the manufacturing yield. In addition, the capacitor 91 is provided to fill only the opening section 420 that extends through only the second insulating layer 400. This makes it possible to simplify the manufacturing steps as compared with a case where the opening section 410 is formed that includes the lower section 410L having relatively small area and the upper section 410U having relatively large area. Further, the lower electrode 911 of the capacitor 91 is not directly coupled to the first wiring layer 310 serving as a bit line, but comes into contact with the upper wiring layer 313 serving as an upper layer of the first wiring layer 310. In a case where the lower electrode 911 of the capacitor 91 is brought into direct contact with the first wiring layer 310, which has a large number of layout restrictions, it is necessary to perform photolithography, for example, twice to form the capacitor 91. However, in a case where the lower electrode 911 is formed to bring the lower electrode 911 into contact with the upper wiring layer 313, it is possible to form the capacitor 91 by performing photolithography once. This is because the upper wiring layer 313 has fewer layout restrictions than those of the first wiring layer 310. This makes it possible to simplify the manufacturing steps.

7.2. Manufacturing Method

Subsequently, a method of manufacturing the semiconductor storage device 10F according to the present embodiment is described with reference to FIGS. 22A, 22B, 22C, and 22D. FIGS. 22A, 22B, 22C, and 22D are schematic diagrams each describing a step of the method of manufacturing the semiconductor storage device 10F.

It is to be noted that FIGS. 22A, 22B, 22C, and 22D also omit the description of the layers provided to extend over the whole surface of the semiconductor substrate 100 as with FIG. 21. In addition, the respective cross-sectional views of FIGS. 22A, 22B, 22C, and 22D illustrate cross sections taken along the B-B lines, the C-C lines, or the D-D lines illustrated in the upper left plan views.

First, the first insulating layer 300 is formed as in the steps according to the fourth embodiment described above illustrated in FIGS. 15A, 15B, 15C, 15D. 15E, and 15F. After the formation of the first insulating layer 300, the via contact 311 and the upper wiring layer 312 are sequentially formed on the first wiring layer 310 in the peripheral region as illustrated in FIG. 22A. In addition, the via contact 311 and the upper wiring layer 313 are formed on the first wiring layer 310 in the memory cell region in order. Specifically, the use of a damascene structure in which Cu or the like is used as a wiring material makes it possible to form the via contact 311 and the upper wiring layers 312 and 313. It is to be noted that the via contact 311 and the upper wiring layers 312 and 313 may be each formed by using Al or the like.

Next, as illustrated in FIG. 22B, the second insulating layer 400 is formed to cover the first insulating layer 300 as in the fourth embodiment described above. After the formation of the second insulating layer 400, the via contact 411 and the upper wiring layer 412 are formed on the upper wiring layer 312 as in the fourth embodiment described above.

Next, as illustrated in FIG. 22C, the opening section 420 is formed for exposing the upper wiring layer 313 in the memory cell region. Specifically, the second insulating layer 400 is selectively dug by anisotropic etching to form the opening section 420. In the anisotropic etching, a resist patterned by lithography is used as a mask. The opening section 420 is formed to have, for example, a width of 60 nm to 150 nm. The opening section 420 having an aspect ratio of about 20 or less makes it is possible to perform etching to form the opening section 420 and perform deposition in a subsequent step to fill the opening section 420 without raising any issue. It is possible to perform anisotropic etching by using, for example, a fluorocarbon-based gas. In addition, it is possible to stop etching with favorable controllability by using the linear layer described above.

Next, as illustrated in FIG. 22D, the capacitor 91 is formed in the opening section 420.

Specifically, first, ALD, CVD, or sputtering in which IMP is used is used to deposit TiN having a film thickness of 5 nm to 10 nm on the exposed upper wiring layer 313 along the inner shape of the opening section 420, thereby forming the lower electrode 911.

Next, hafnium oxide (HfOx), which is a high dielectric material, is deposited on the lower electrode 911 along the inner shape of the opening section 420 by CVD or ALD to have a film thickness of 3 nm to 10 nm, thereby forming the ferroelectric film 513. It is to be noted that hafnium oxide (HfOx), which is a high dielectric material, is converted to a ferroelectric material by being subjected to annealing treatment in a subsequent step.

It is to be noted that it is also possible to use a high dielectric material such as zirconium oxide (ZrOx) or hafnium zirconium oxide (HfZrOx) in place of hafnium oxide. In addition, it is also possible to convert these high dielectric materials into ferroelectric materials by doping the high dielectric materials with lanthanum (La), silicon (Si), gadolinium (Gd), or the like.

After that, TiN is deposited on the ferroelectric film 913 by using CVD, ALD, sputtering, or the like to have a film thickness of 5 nm to 20 nm and fill the opening section 420, thereby forming the upper electrode 915. It is to be noted that it is also possible to use TaN or the like as a material for forming the upper electrode 915. Subsequently, crystallization annealing is performed to convert the HfOx included in the ferroelectric film 913 into a ferroelectric material. It is to be noted that the crystallization annealing for converting HfOx into a ferroelectric material may be performed in this step or another step. It is possible to optionally change the temperature of the crystallization annealing, for example, within a range of 500° C. or less and the heat resistance range of another component such as the transistor 21, NiSi, or a wiring line. After that, the ferroelectric film 913 and the upper electrode 915 excessively deposited on the second insulating layer 400 are removed by performing CMP or the like. This forms the capacitor 91.

Subsequently, the third insulating layer 600 is formed, the via contact 611 is formed, and the second wiring layer 612 is formed as in the fourth embodiment described above.

The steps described above make it possible to form the semiconductor storage device 10F according to the present embodiment.

The technology according to the present disclosure has been described above with reference to the first to seventh embodiments and the modification examples. The technology according to the present disclosure is not, however, limited to the embodiments or the like described above, but a variety of modifications are possible.

Further, not all of the components and operations described in the respective embodiments are necessary as the components and operations according to the present disclosure. For example, among components according to the respective embodiments, a component that is not described in an independent claim reciting the most generic concept of the present disclosure should be understood as an optional component.

Terms used throughout this specification and the appended claims should be construed as "non-limiting" terms. For example, the term "including" or "included" should be construed as "not limited to what is described as being included". The term "having" should be construed as "not limited to what is described as being had".

The terms used in this specification are used merely for the convenience of description and include terms that are not used to limit the configuration and the operation. For example, the terms such as "right", "left", "up", and "down" only indicate directions in the drawings being referred to. In addition, the terms "inside" and "outside" only indicate a direction toward the center of a component of interest and a direction away from the center of a component of interest, respectively. The same applies to terms similar to these and to terms with the similar purpose.

It is to be noted that the technology according to the present disclosure may have the following configurations. The technology according to the present disclosure having the following configurations allows the semiconductor storage device to increase the area of the capacitor without increasing the area of the memory cell. It is therefore possible to further increase the capacitance of the capacitor. This allows the semiconductor storage device to obtain a sufficient margin for operation. Effects attained by the technology according to the present disclosure are not necessarily limited to the effects described herein, but may include any of the effects described in the present disclosure.

(1)

A semiconductor storage device including:

a field-effect transistor that is provided in a semiconductor substrate;

an interlayer insulating film that is provided on the semiconductor substrate;

a contact that penetrates the interlayer insulating film and is electrically coupled to a drain of the field-effect transistor;

a first wiring layer that is provided on the contact;

a first insulating layer that is provided on the interlayer insulating film and has the first wiring layer buried therein;

an opening section that is provided in the first insulating layer and the interlayer insulating film from a layer upper than the first wiring layer; and a ferroelectric capacitor that is provided in the opening section and electrically coupled to a source of the field-effect transistor.

(2)

The semiconductor storage device according to (1), in which the ferroelectric capacitor includes a lower electrode, a ferroelectric film, and an upper electrode, the lower electrode being provided along an inner shape of the opening section, the ferroelectric film being provided on the lower electrode, the upper electrode being provided on the ferroelectric film to fill the opening section.

(3)

The semiconductor storage device according to (2), in which the lower electrode is electrically coupled to the source of the field-effect transistor, and the upper electrode is electrically coupled to a second wiring layer that is provided on the first insulating layer.

(4)

The semiconductor storage device according to (3), in which the second wiring layer is provided to extend in a direction that is same as a direction of the first wiring layer.

(5)

The semiconductor storage device according to (3) or (4), in which the first wiring layer includes a bit line and the second wiring layer includes a source line.

(6)

The semiconductor storage device according to any one of (1) to (5), in which the first wiring layer is provided to extend in a first direction serving as an in-plane direction of the semiconductor substrate, and a gate electrode of the field-effect transistor is provided to extend in a second direction orthogonal to the first direction.

(7)

The semiconductor storage device according to (6), in which the field-effect transistor is provided in an activation region of the semiconductor substrate, and the activation region is provided to extend in a third direction that obliquely crosses the first direction and the second direction.

(8)

A semiconductor storage device including:

a field-effect transistor that is provided in a semiconductor substrate;

an interlayer insulating film that is provided on the semiconductor substrate;

an opening section including a first opening and a second opening having a smaller opening diameter than an opening diameter of the first opening, the first opening being formed in the interlayer insulating film, the second opening being formed in the first opening; and a ferroelectric capacitor that is provided in the opening section and electrically coupled to a source of the field-effect transistor.

(9)

A semiconductor storage device including:

a field-effect transistor that is provided in a semiconductor substrate;

an interlayer insulating film that is provided on the semiconductor substrate;

a contact that penetrates the interlayer insulating film and is electrically coupled to a drain of the field-effect transistor; and a ferroelectric capacitor that is provided in an opening section at height different from height of the contact and electrically coupled to a source of the field-effect transistor, the opening section being provided to extend through at least the interlayer insulating film.

(10)

A method of manufacturing a semiconductor storage device, the method including:

forming a field-effect transistor in a semiconductor substrate;

forming an interlayer insulating film on the semiconductor substrate;

forming a contact that penetrates the interlayer insulating film and is electrically coupled to a drain of the field-effect transistor;

forming a first wiring layer on the contact;

forming a first insulating layer on the interlayer insulating film, the first insulating layer having the first wiring layer buried therein;

forming an opening section in the first insulating layer and the interlayer insulating film from a layer upper than the first wiring layer; and forming a ferroelectric capacitor in the opening section, the ferroelectric capacitor being electrically coupled to a source of the field-effect transistor.

(11)

A method of manufacturing a semiconductor storage device, the method including:

forming a field-effect transistor in a semiconductor substrate;

forming an interlayer insulating film on the semiconductor substrate;

forming a first opening in the interlayer insulating film;

forming a second opening in the first opening, the second opening having a smaller opening diameter than an opening diameter of the first opening; and forming a ferroelectric capacitor in an opening section including the first opening and the second opening, the ferroelectric capacitor being electrically coupled to a source of the field-effect transistor.

(12)

A semiconductor storage device including:

a semiconductor substrate having a principal surface;

a field-effect transistor that is provided in the semiconductor substrate and includes a drain and a source;

an interlayer insulating film that is provided on the semiconductor substrate;

a contact that penetrates the interlayer insulating film and is electrically coupled to the drain of the field-effect transistor;

a first wiring layer that is provided on an opposite side to the field-effect transistor as viewed from the contact, the first wiring layer being electrically coupled to the contact;

a first insulating layer that is provided on the interlayer insulating film and has the first wiring layer buried therein; and a ferroelectric capacitor that is provided on an opposite side to the field-effect transistor as viewed from the first wiring layer, the ferroelectric capacitor being electrically coupled to the source of the field-effect transistor.

(13)

The semiconductor storage device according to (12), further including a second insulating layer that is provided on an opposite side to the semiconductor substrate as viewed from the first wiring layer, the second insulating layer extending into even a circuit region including a logic circuit, in which the ferroelectric capacitor is provided in the first insulating layer and the second insulating layer.

(14)

The semiconductor storage device according to (12) or (13), further including a second wiring layer, in which the ferroelectric capacitor includes a lower electrode, an upper electrode, and a ferroelectric film that is sandwiched between the lower electrode and the upper electrode, the lower electrode is electrically coupled to the source, and the upper electrode is electrically coupled to the second wiring layer.

(15)

The semiconductor storage device according to (14), in which the second wiring layer is provided on an opposite side to the semiconductor substrate as viewed from the first wiring layer.

(16)

The semiconductor storage device according to (14) or (15), in which the first wiring layer and the second wiring layer are each provided to extend in a first direction along the principal surface.

(17)

The semiconductor storage device according to any one of (14) to (16), in which the first wiring layer includes a bit line, and the second wiring layer includes a source line.

(18)

The semiconductor storage device according to any one of (12) to (17), in which the first wiring layer extends in a first direction along the principal surface, and the field-effect transistor further includes a gate electrode that extends in a second direction substantially orthogonal to the first direction.

(19)

The semiconductor storage device according to (18), in which the semiconductor substrate includes an activation region that extends in a third direction along the principal surface, the third direction obliquely crossing both the first direction and the second direction, and the field-effect transistor is provided in the activation region.

(20)

The semiconductor storage device according to (14), in which first area of the upper electrode along the principal surface is larger than second area of a coupling section between the lower electrode and the source along the principal surface.

(21)

The semiconductor storage device according to (14), in which third area of the upper electrode along the principal surface is larger than or equal to fourth area of the lower electrode along the principal surface.

(22)

The semiconductor storage device according to (12), further including a third wiring layer that is provided in a level layer between the ferroelectric capacitor and the first wiring layer, in which the ferroelectric capacitor is electrically coupled to the first wiring layer through the third wiring layer.

REFERENCE SIGNS LIST

The present application claims the priority on the basis of Japanese Patent Application No. 2020-101915 filed on Jun. 11, 2020 with Japan Patent Office and Japanese Patent Application No. 2021-026747 filed on Feb. 22, 2021 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor storage device, comprising:

a field-effect transistor in a semiconductor substrate;

an interlayer insulating film on the semiconductor substrate;

a contact that penetrates the interlayer insulating film and is electrically coupled to a drain of the field-effect transistor;

a first wiring layer on the contact;

a second wiring layer;

a first insulating layer that is on the interlayer insulating film and has the first wiring layer buried therein;

an opening section in the first insulating layer and the interlayer insulating film, wherein the opening section extends from a layer upper than the first wiring layer;

a ferroelectric capacitor in the opening section and electrically coupled to a source of the field-effect transistor; and a via contact on the first wiring layer, wherein the via contact electrically couples the first wiring layer and the second wiring layer.

2. The semiconductor storage device according to claim 1, wherein the ferroelectric capacitor includes a lower electrode, a ferroelectric film, and an upper electrode, the lower electrode is along an inner shape of the opening section, the ferroelectric film is on the lower electrode, the upper electrode is on the ferroelectric film to fill the opening section.

3. The semiconductor storage device according to claim 2, wherein the lower electrode is electrically coupled to the source of the field-effect transistor, and the upper electrode is electrically coupled to a third wiring layer that is on the first insulating layer.

4. The semiconductor storage device according to claim 3, wherein the third wiring layer extends in a direction that is same as a direction of the first wiring layer.

5. The semiconductor storage device according to claim 3, wherein the first wiring layer includes a bit line, and the third wiring layer includes a source line.

6. The semiconductor storage device according to claim 1, wherein the first wiring layer extends in a first direction serving as an in-plane direction of the semiconductor substrate, and a gate electrode of the field-effect transistor extends in a second direction orthogonal to the first direction.

7. The semiconductor storage device according to claim 6, wherein the field-effect transistor is in an activation region of the semiconductor substrate, the activation region extends in a third direction, and the third direction is oblique to each of the first direction and the second direction.

* * * * *